US012660192B2

(12) United States Patent
Hasegawa et al.

(10) Patent No.: US 12,660,192 B2
(45) Date of Patent: Jun. 16, 2026

(54) MEMORY DEVICE INCLUDING A PLURALITY OF MEMBERS SEPARATING OR SURROUNDING A PLURALITY OF LAYER STACKS

(71) Applicant: Kioxia Corporation, Tokyo (JP)

(72) Inventors: Wataru Hasegawa, Yokkaichi (JP); Takuya Konno, Yokkaichi (JP); Sachiyo Ito, Kawasaki (JP); Ken Furubayashi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 560 days.

(21) Appl. No.: 18/176,525

(22) Filed: Mar. 1, 2023

(65) Prior Publication Data

US 2024/0057338 A1      Feb. 15, 2024

(30) Foreign Application Priority Data

Aug. 12, 2022    (JP) ................................. 2022-128932

(51) Int. Cl.
| | |
|---|---|
| *H10B 43/35* | (2023.01) |
| *H01L 23/522* | (2006.01) |
| *H01L 23/528* | (2006.01) |
| *H10B 43/10* | (2023.01) |
| *H10B 43/27* | (2023.01) |

(Continued)

(52) U.S. Cl.
CPC ............. *H10B 43/35* (2023.02); *H10B 43/10* (2023.02); *H10B 43/27* (2023.02); *H10W 20/42* (2026.01); *H10W 20/435* (2026.01)

(58) Field of Classification Search
CPC ........ H10B 43/35; H10B 43/10; H10B 43/27; H10B 43/50; H01L 23/5226; H01L 23/5283; G11C 16/08
See application file for complete search history.

(56) References Cited

U.S. PATENT DOCUMENTS

| | | |
|---|---|---|
| 2010/0109071 A1 | 5/2010 | Tanaka et al. |
| 2017/0018566 A1 | 1/2017 | Sonehara |

(Continued)

FOREIGN PATENT DOCUMENTS

| | | |
|---|---|---|
| JP | 2010-114113 A | 5/2010 |
| JP | 2021-150295 A | 9/2021 |

(Continued)

*Primary Examiner* — William B Partridge
*Assistant Examiner* — David Paul Sedorook
(74) *Attorney, Agent, or Firm* — Oblon, McClelland, Maier & Neustadt, L.L.P.

(57) ABSTRACT

According to one embodiment, a memory device includes: a first layer stack including first insulating layers arranged in a first direction and spaced apart from one another; second and third layer stacks, each including conductive layers spaced apart from one another and provided at levels of layers identical to the first insulating layers, respectively, and being spaced apart from each other; a memory pillar extending in the first direction in the third layer stack, a portion of the memory pillar intersecting each of the conductive layers functioning as a memory cell; a first member in contact with the first and second layer stacks between the first and second layer stacks and extending in a second direction; and a second member in contact with the second and third layer stacks between the second and third layer stacks and extending in the second direction.

21 Claims, 50 Drawing Sheets

(51) Int. Cl.
  *H10W 20/41*      (2026.01)
  *H10W 20/42*      (2026.01)

(56)         References Cited

U.S. PATENT DOCUMENTS

| | | | |
|---|---|---|---|
| 2018/0096955 A1* | 4/2018 | Zhu | H01L 23/53271 |
| 2018/0277556 A1* | 9/2018 | Kang | H10B 43/10 |
| 2019/0067314 A1* | 2/2019 | Lu | H01L 21/76895 |
| 2019/0273089 A1* | 9/2019 | Yamamoto | H01L 21/76829 |
| 2020/0312765 A1* | 10/2020 | Kawasaki | H10B 41/35 |
| 2021/0020501 A1* | 1/2021 | Ono | H01L 21/268 |
| 2021/0050366 A1* | 2/2021 | Huang | H10B 43/27 |
| 2021/0288064 A1 | 9/2021 | Nishimura et al. | |
| 2021/0313246 A1* | 10/2021 | Matsumura | H10B 43/40 |
| 2022/0045078 A1 | 2/2022 | Furumoto | |
| 2022/0045096 A1* | 2/2022 | Ryu | H10B 43/10 |
| 2022/0208782 A1 | 6/2022 | Tsunoda et al. | |
| 2023/0217659 A1* | 7/2023 | Lee | H10B 43/27 |
| | | | 257/324 |

FOREIGN PATENT DOCUMENTS

| | | | |
|---|---|---|---|
| JP | 2022-104020 A | 7/2022 | |
| TW | 202207433 A | 2/2022 | |

* cited by examiner

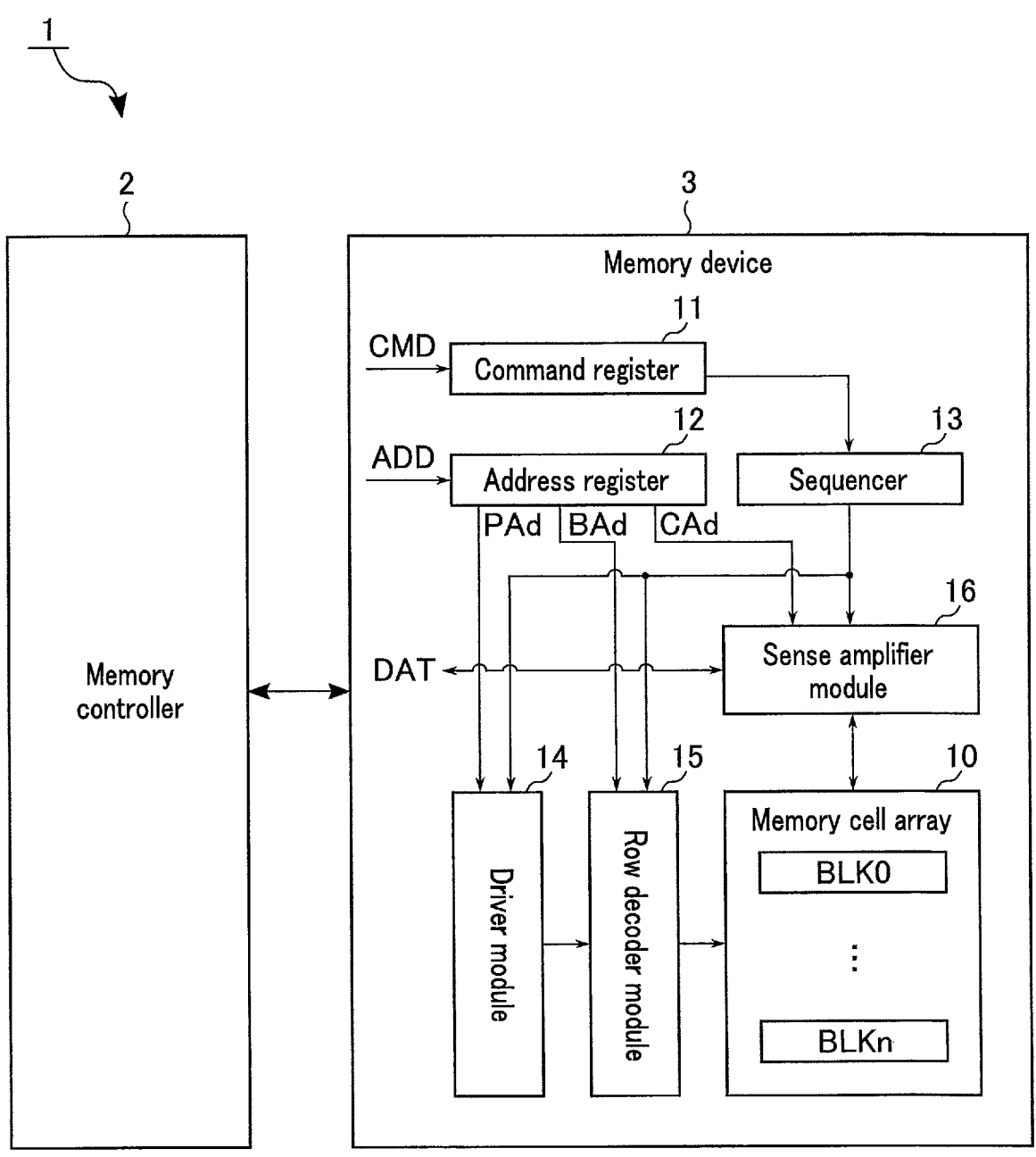
F I G. 1

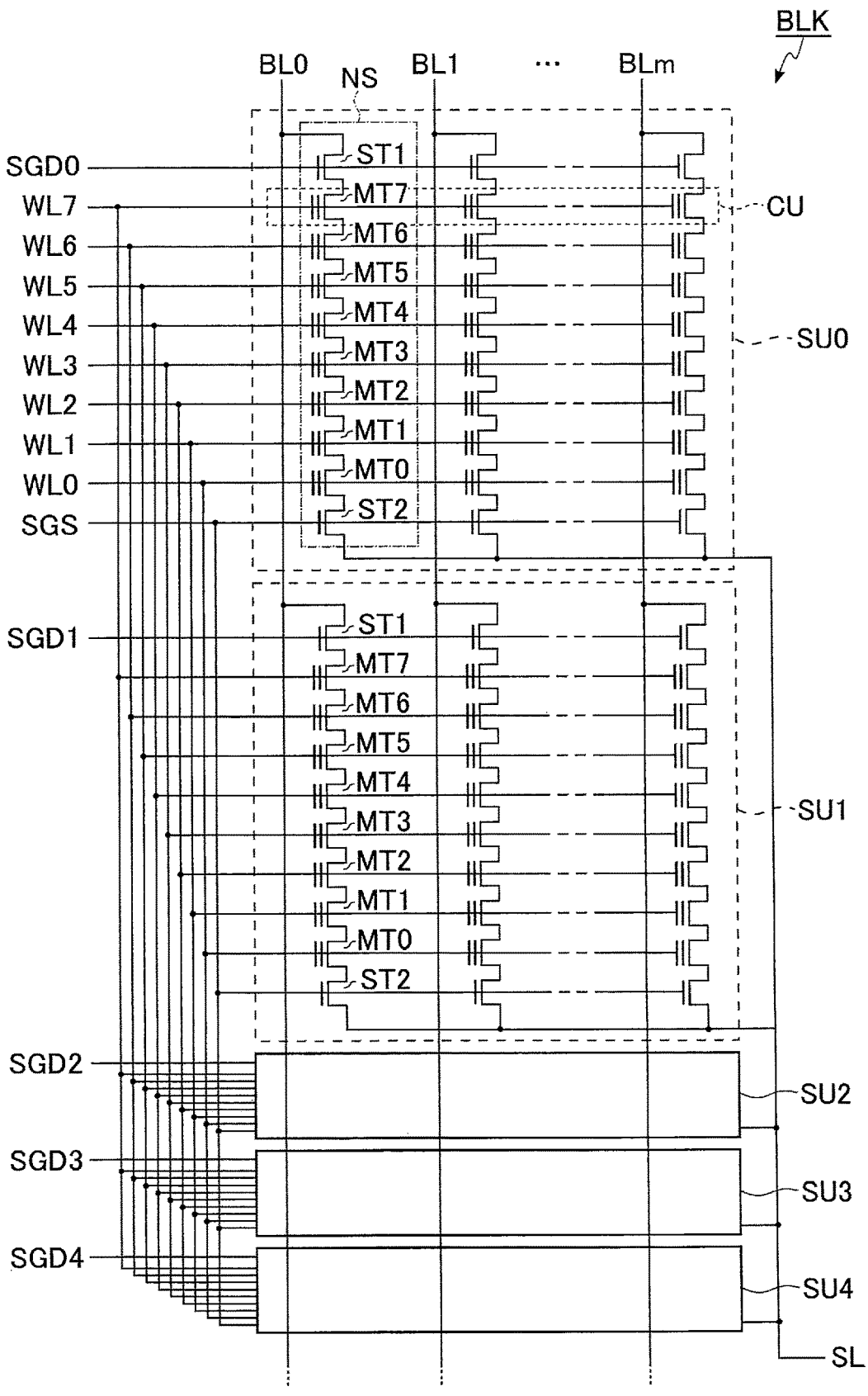
F I G. 2

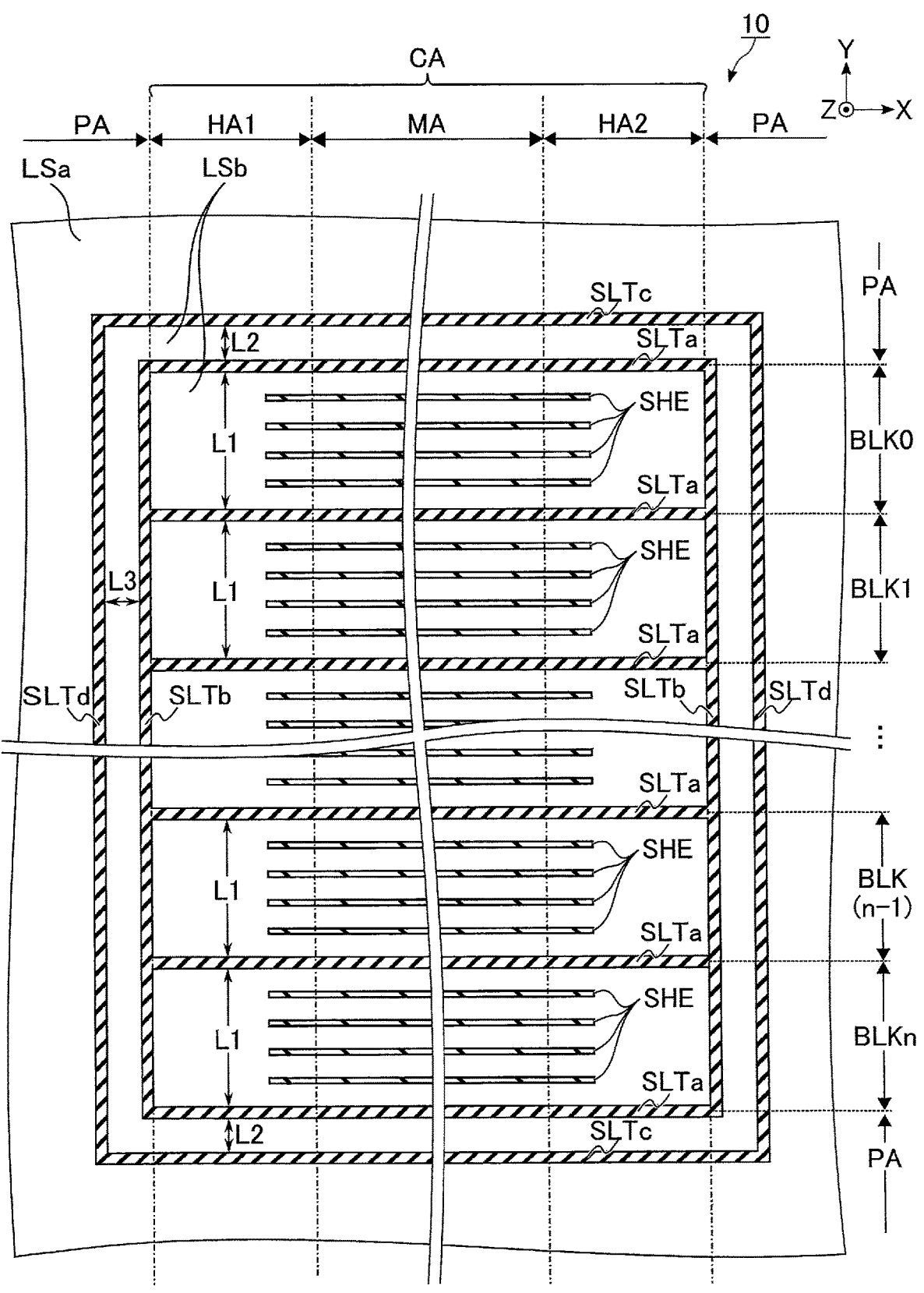
F I G. 3

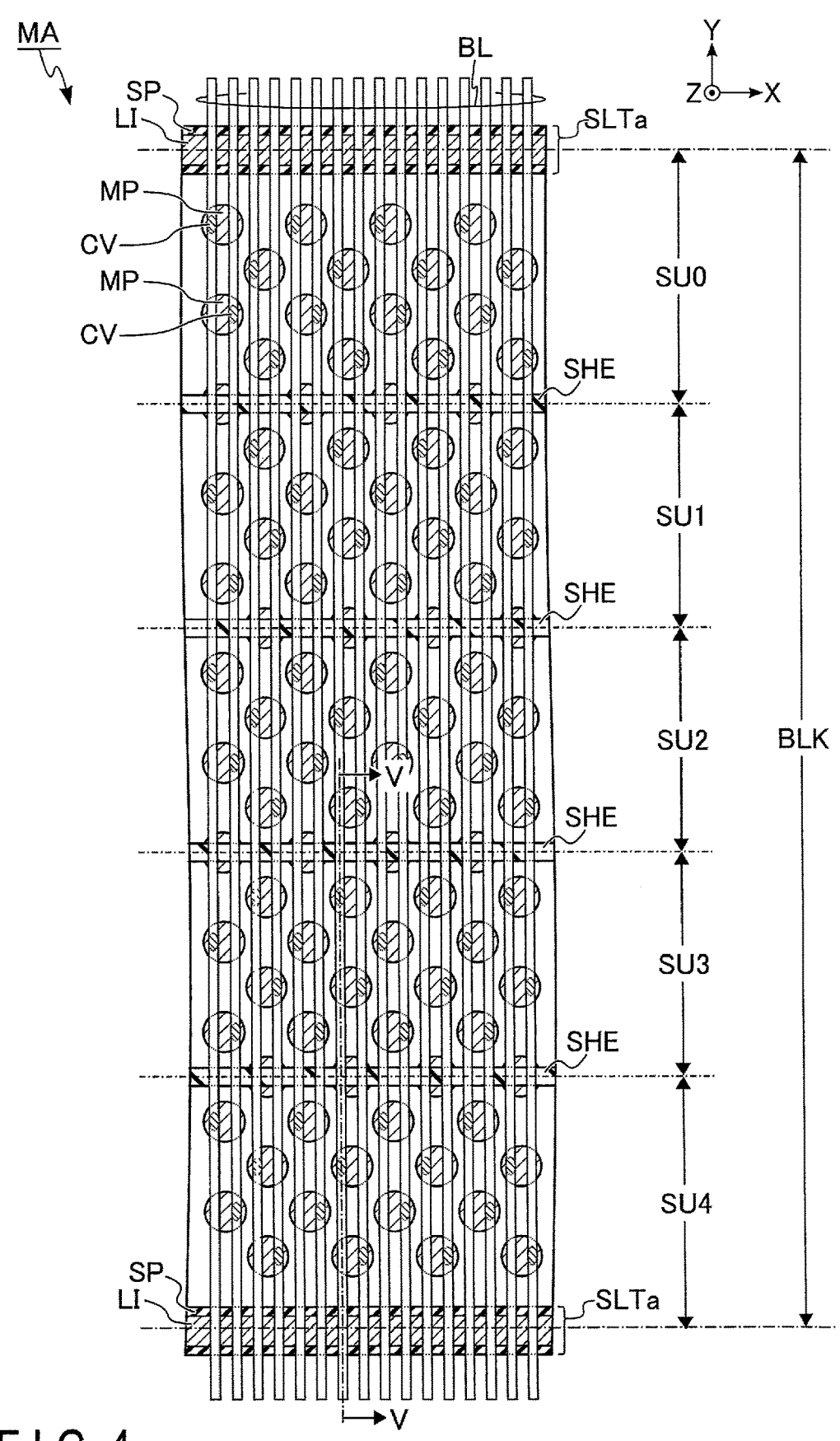
F I G. 4

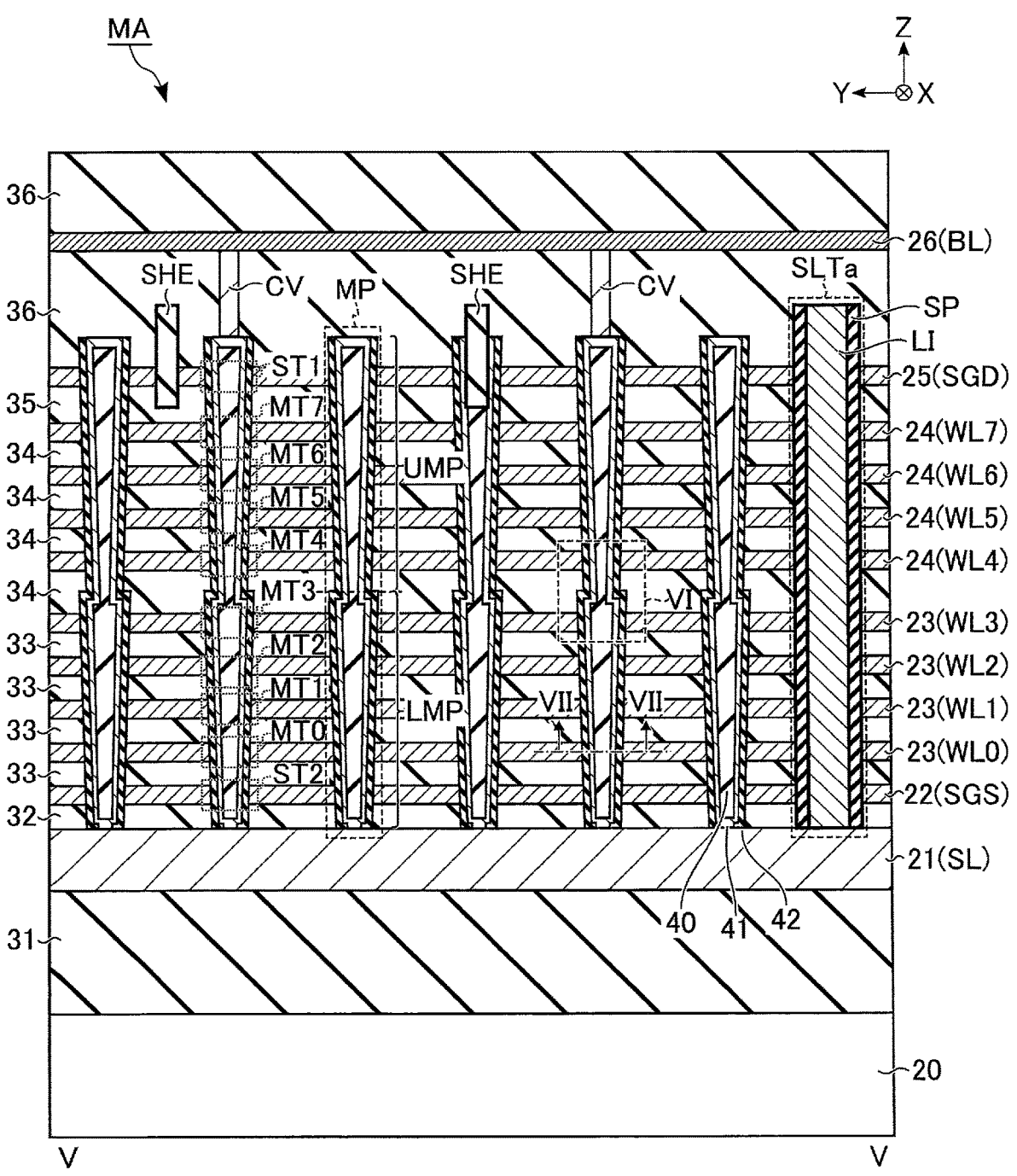
F I G. 5

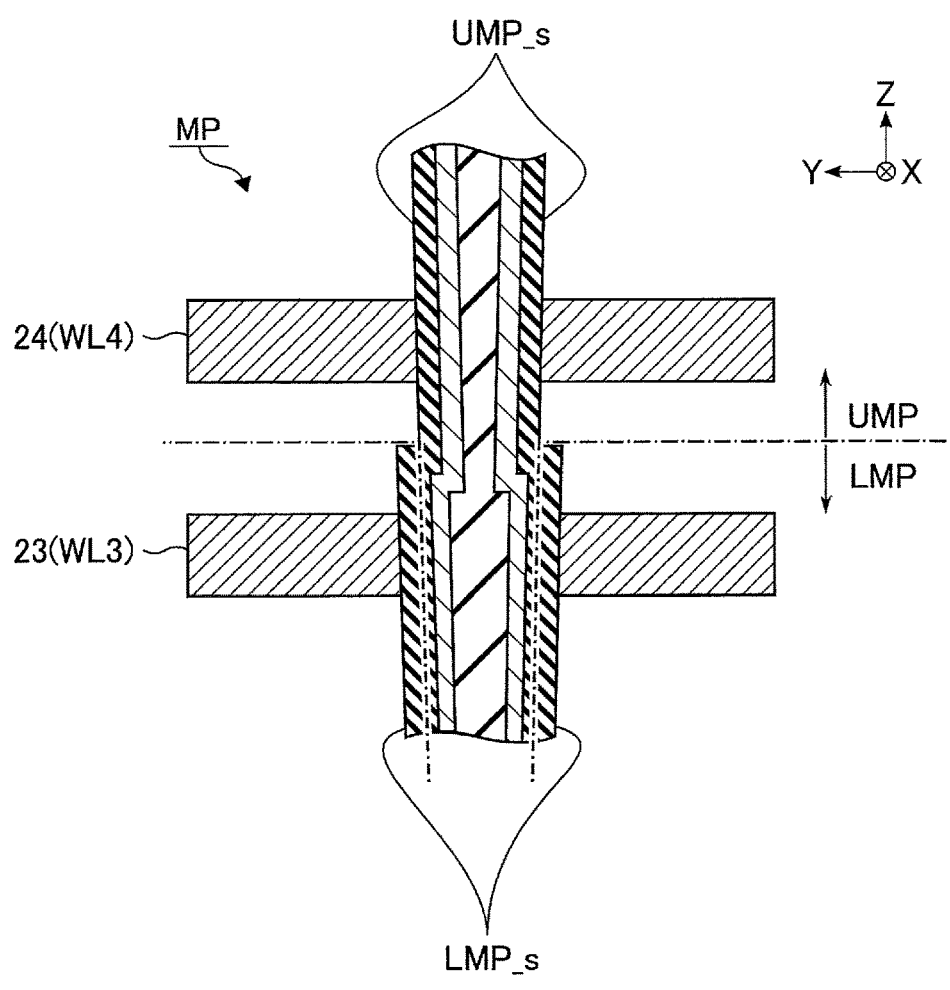
F I G. 6
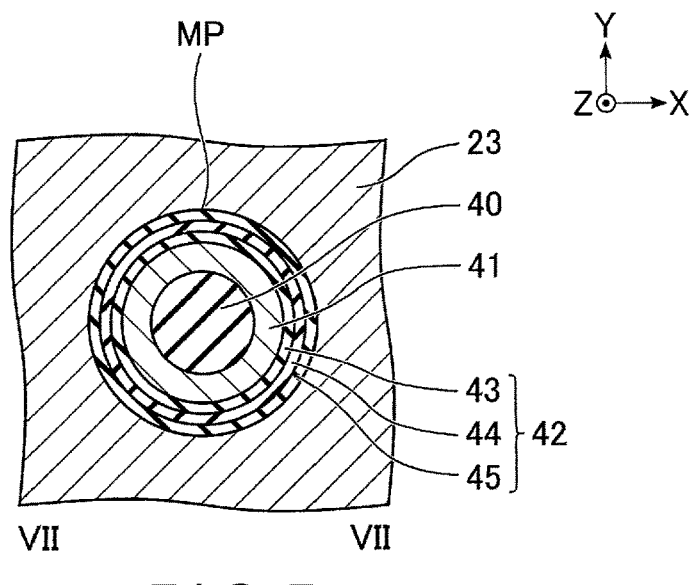
F I G. 7

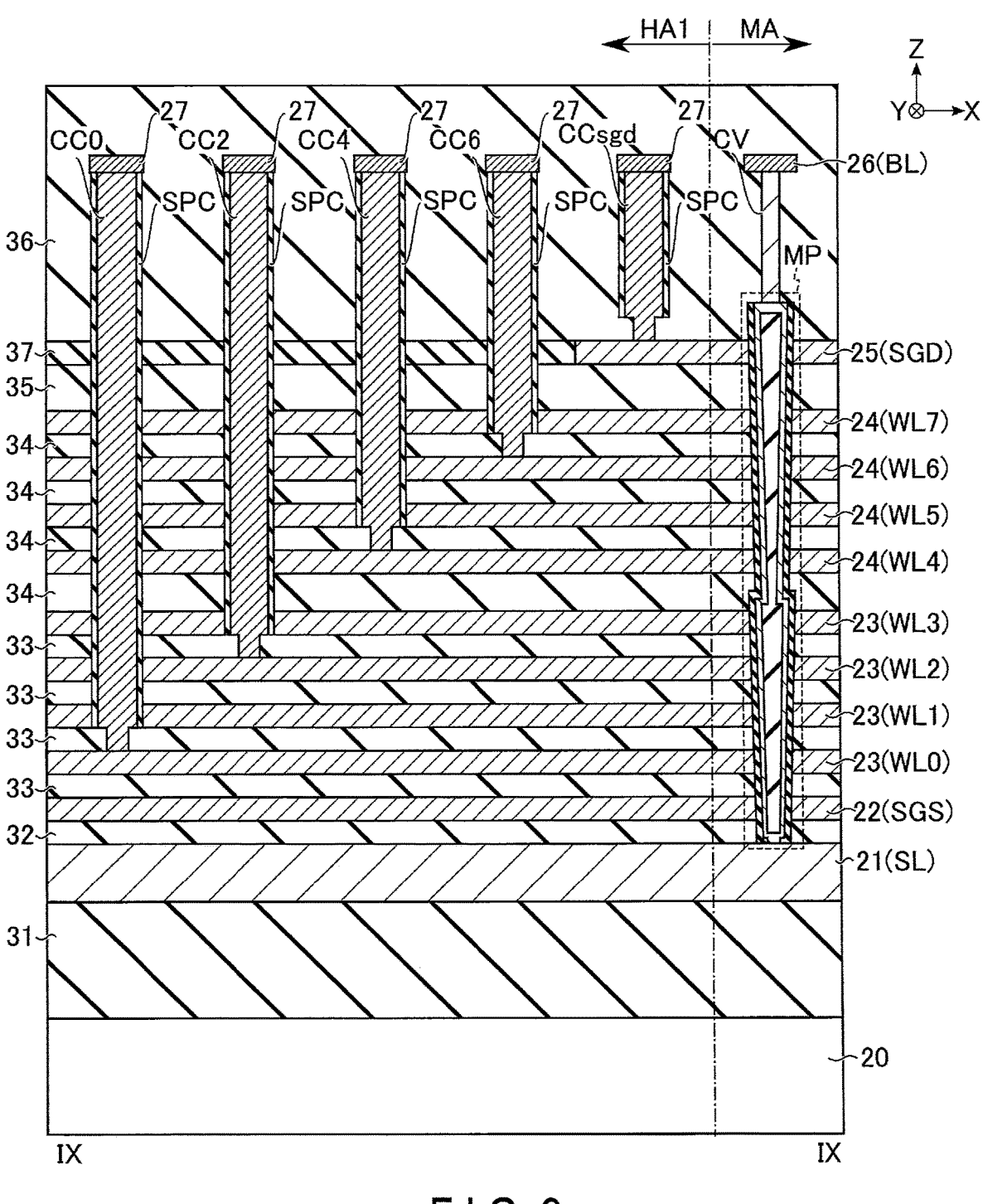
F I G. 9

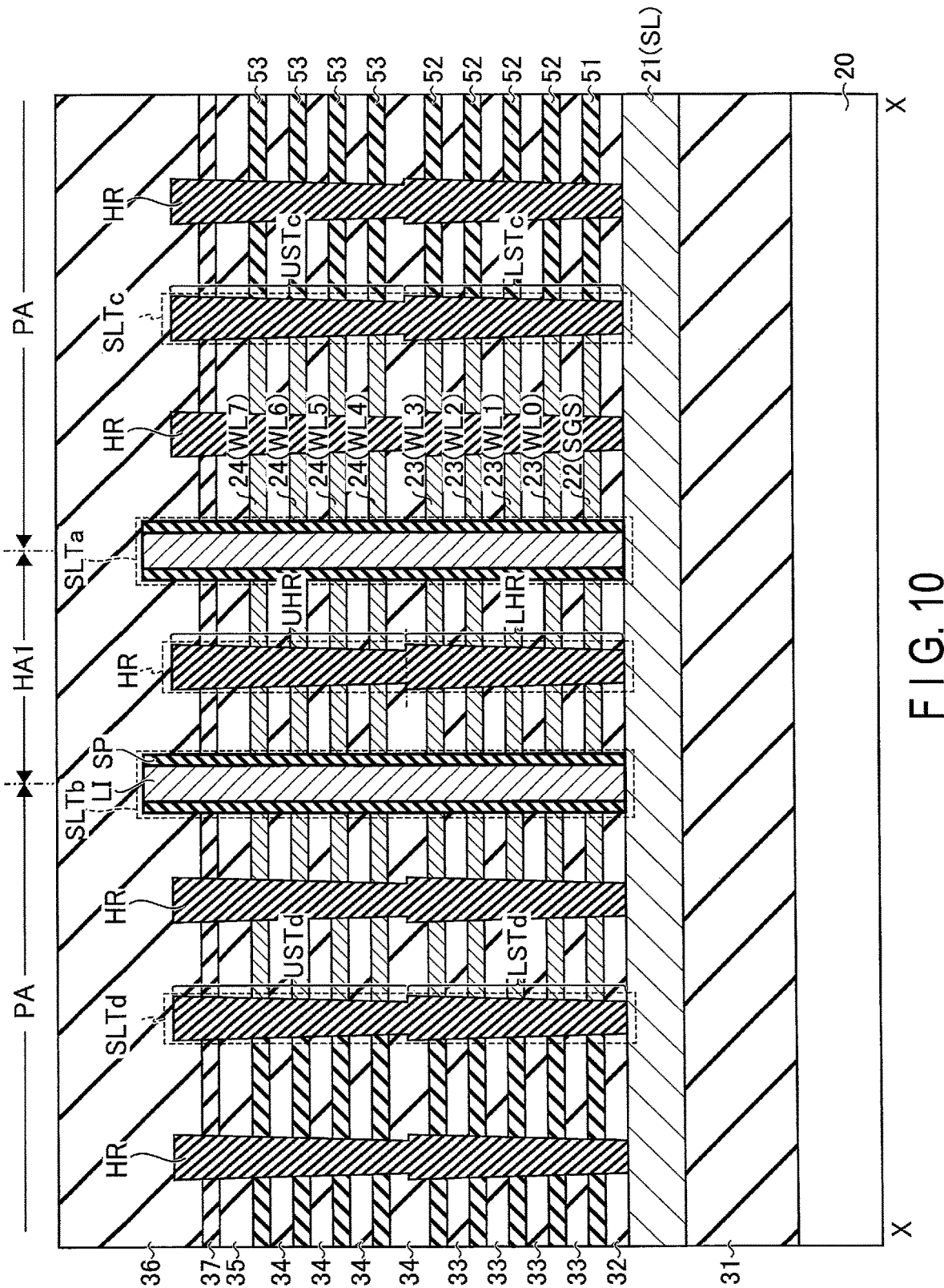
F I G. 10

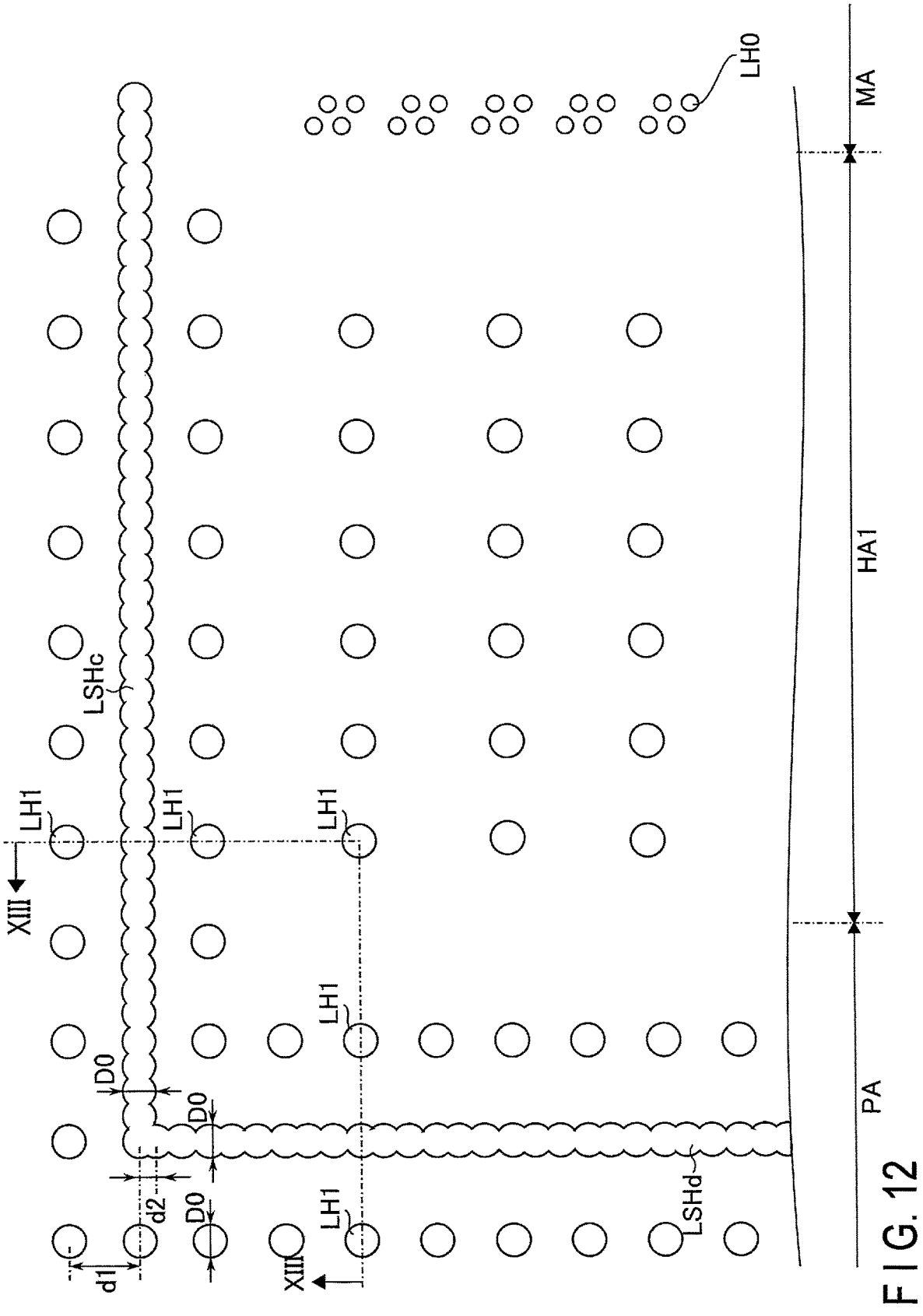
F I G. 12

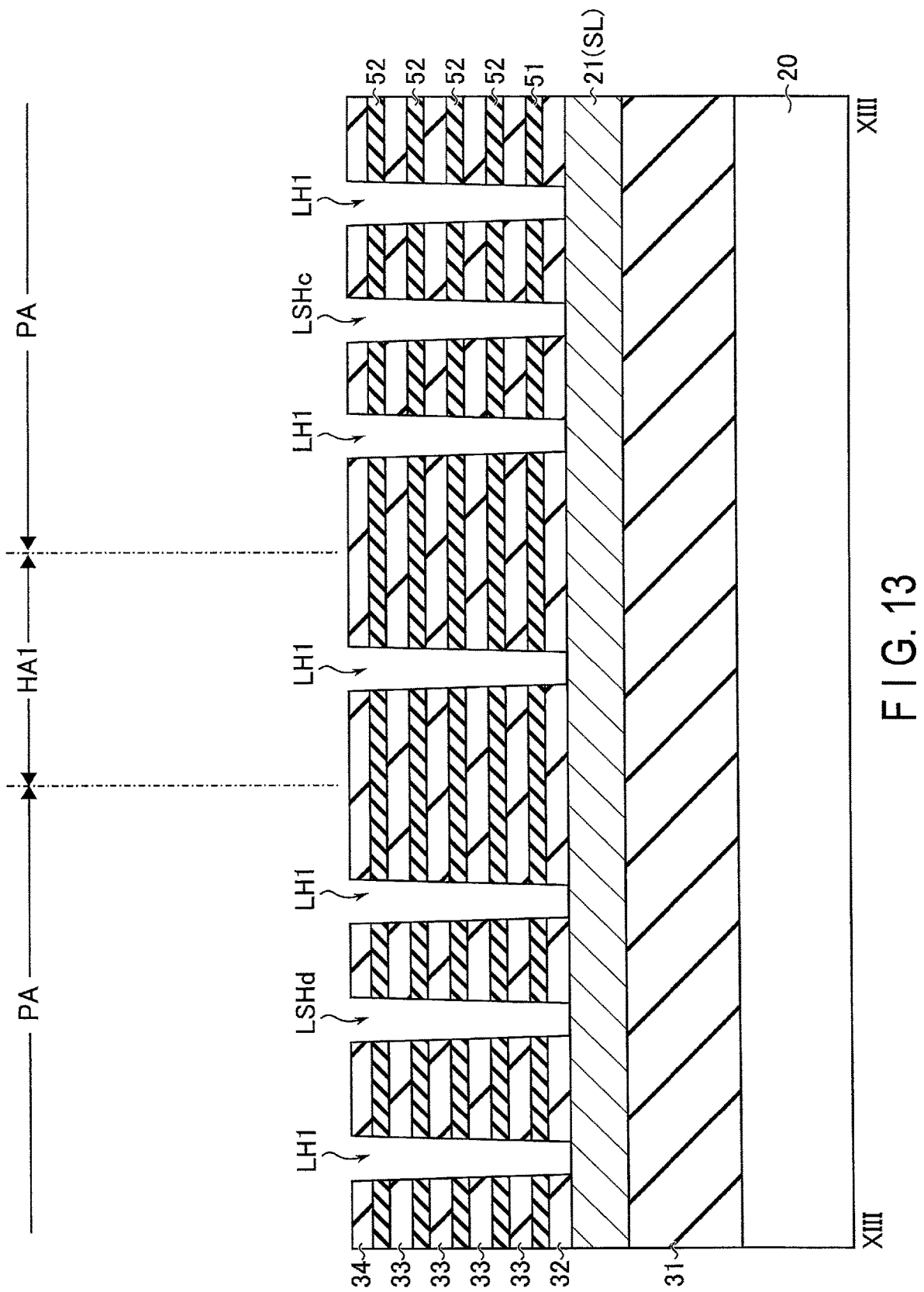
F I G. 13

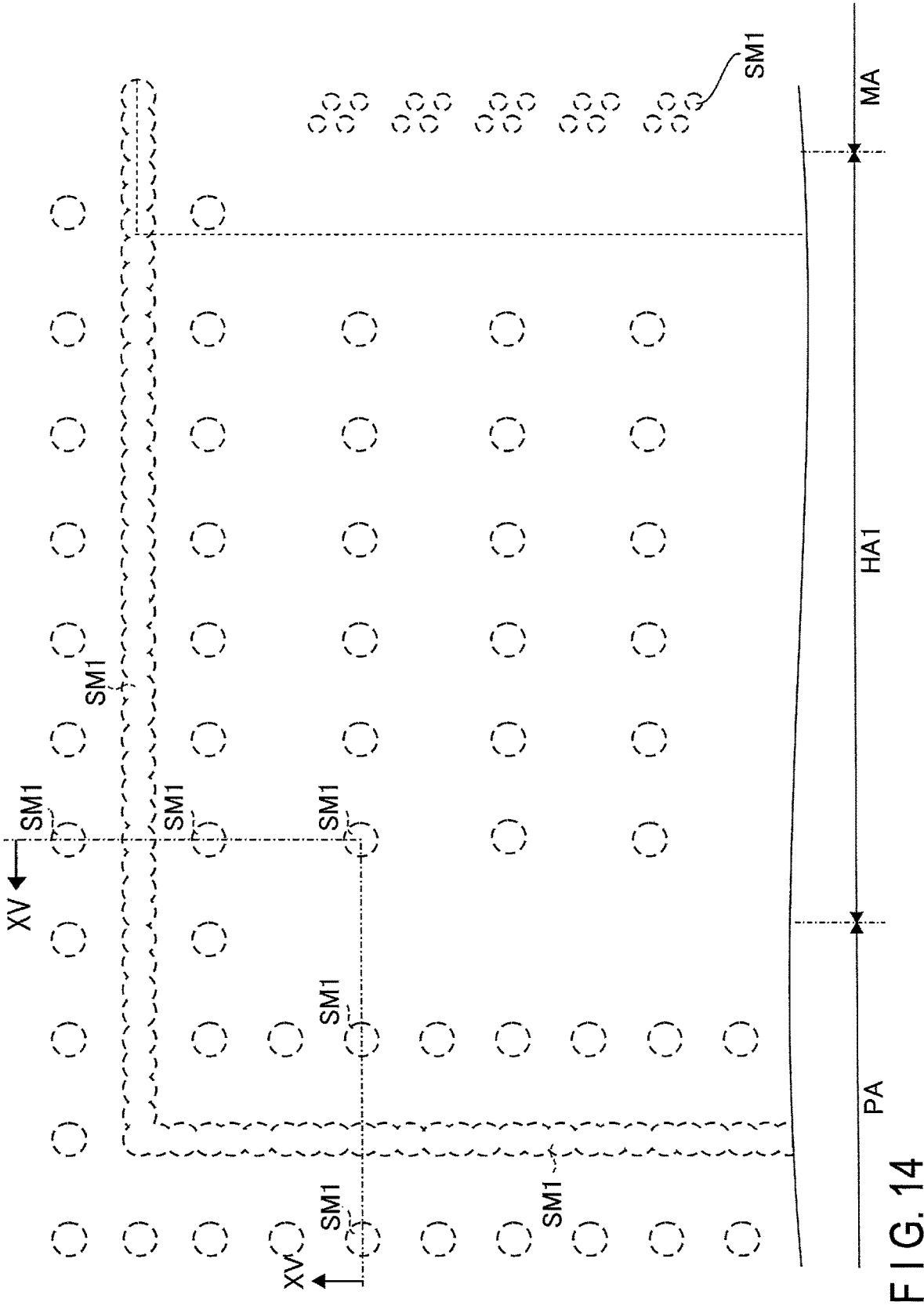
F I G. 14

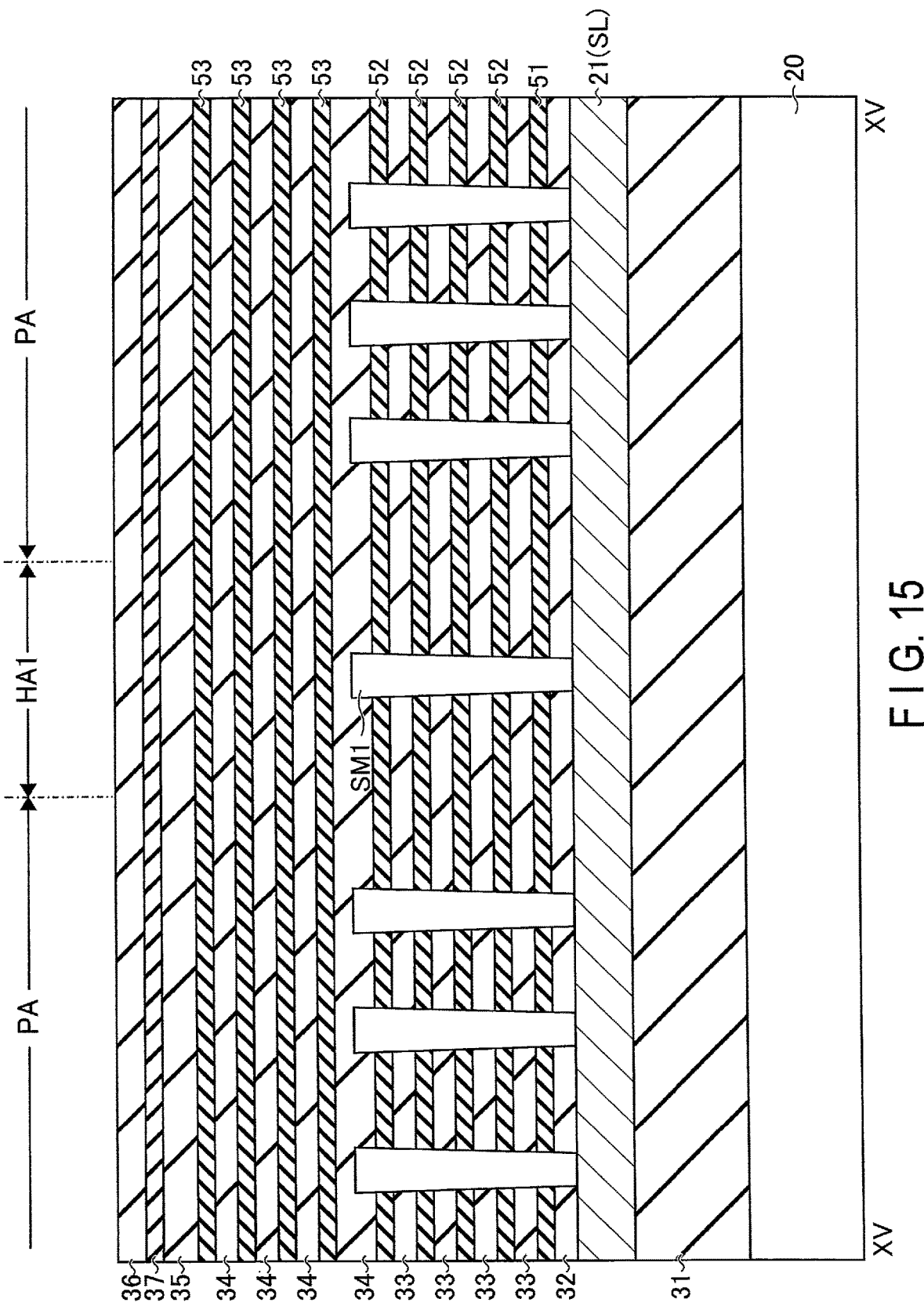
F I G. 15

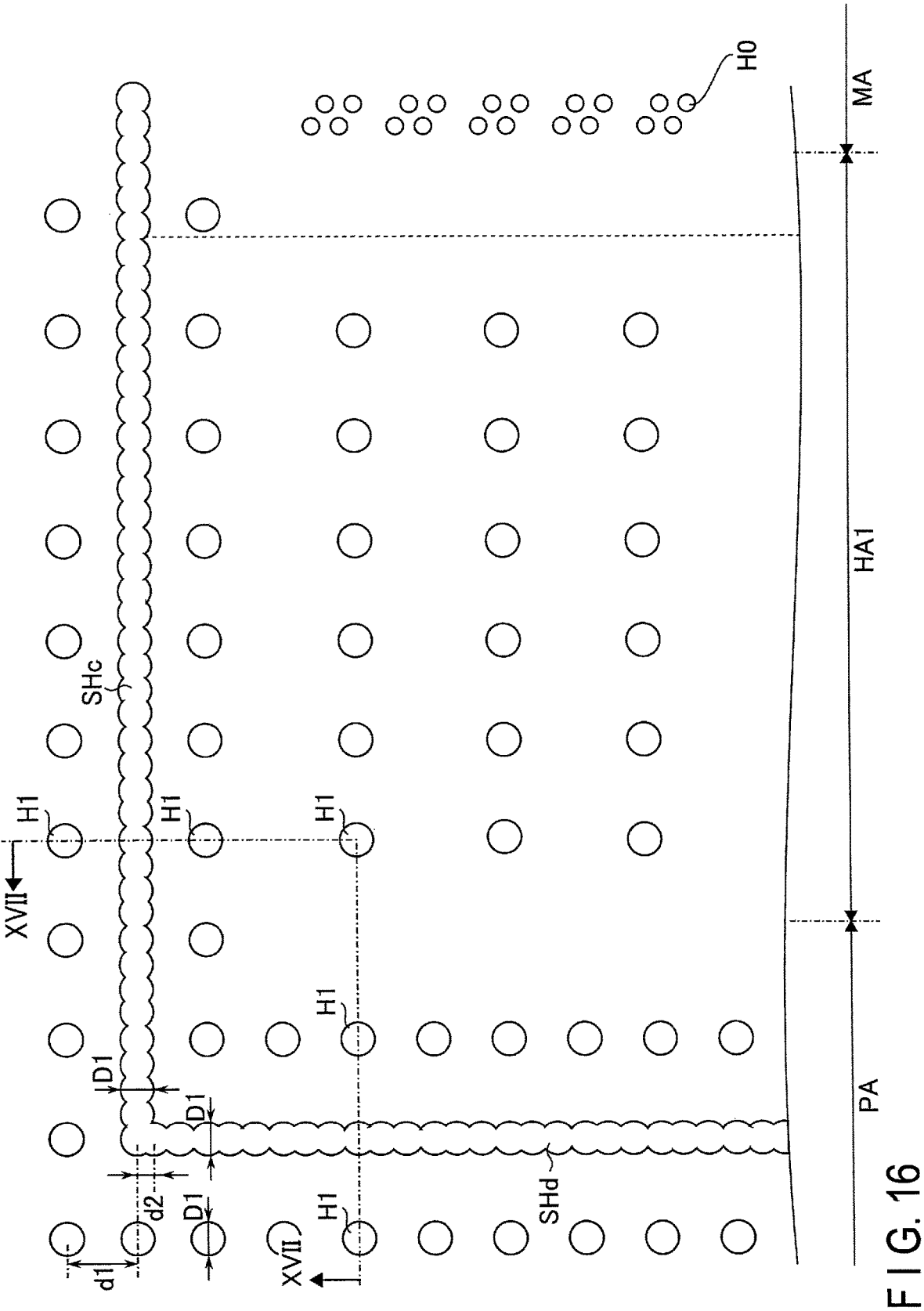
F I G. 16

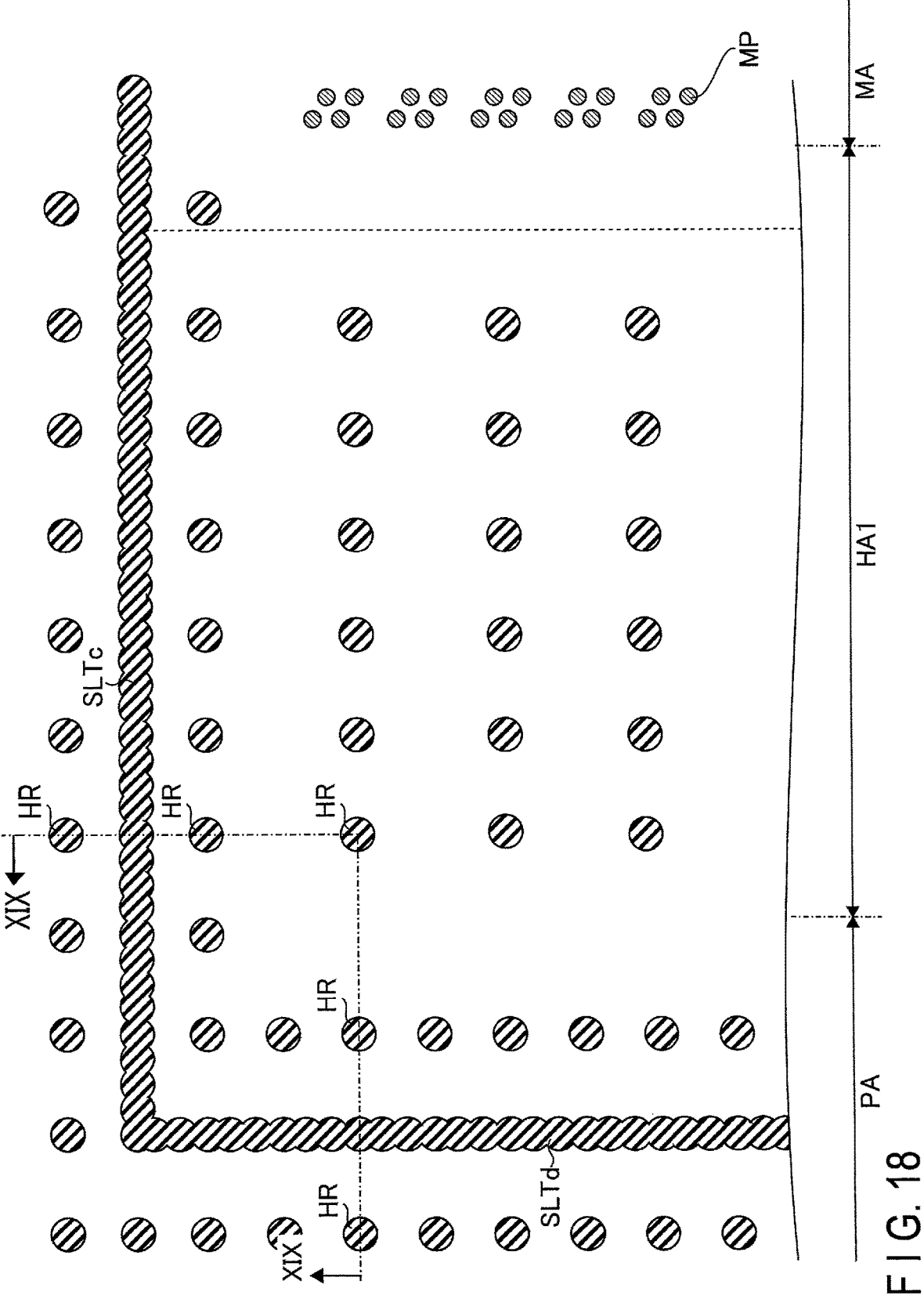
F I G. 18

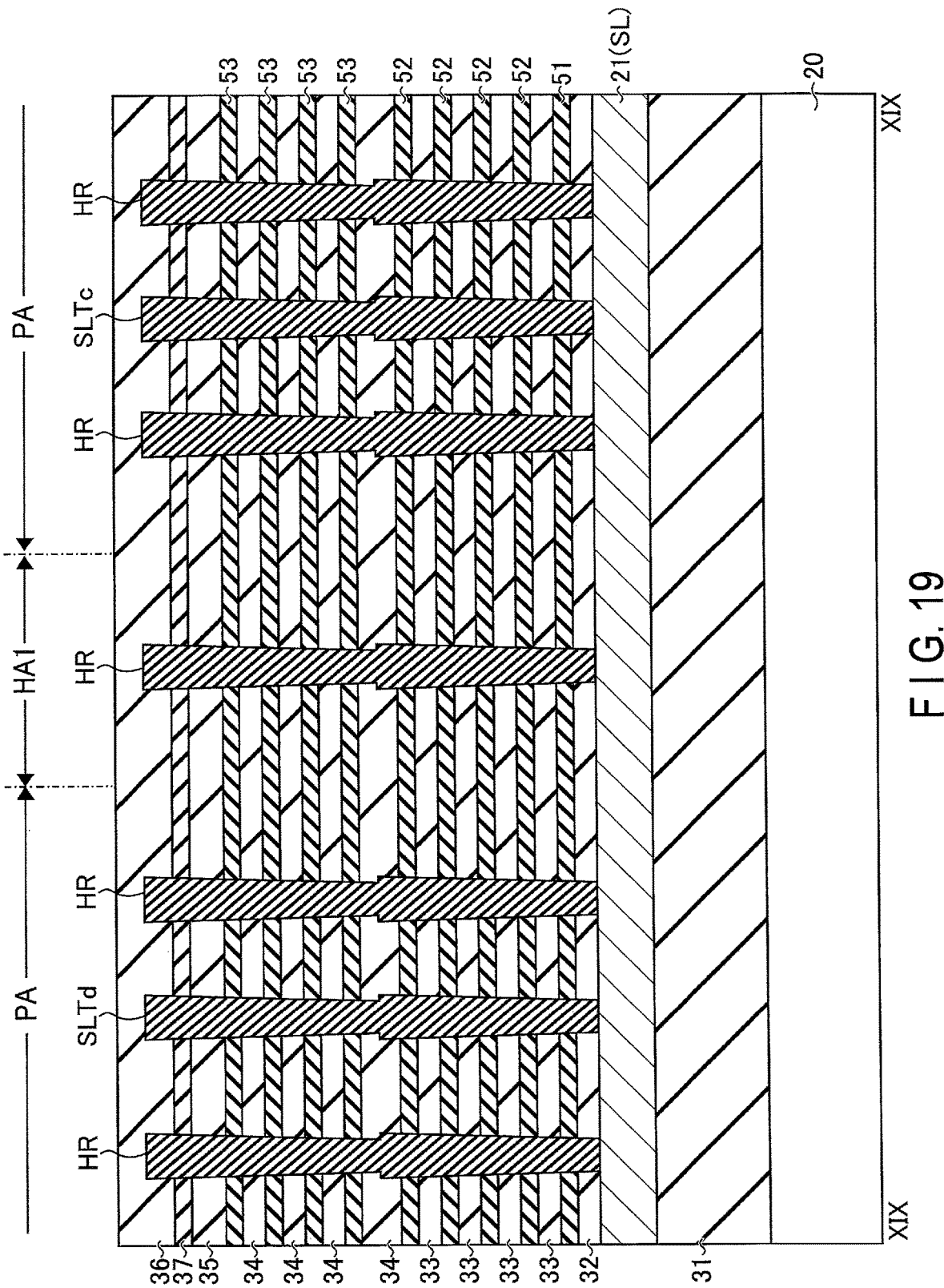
F I G. 19

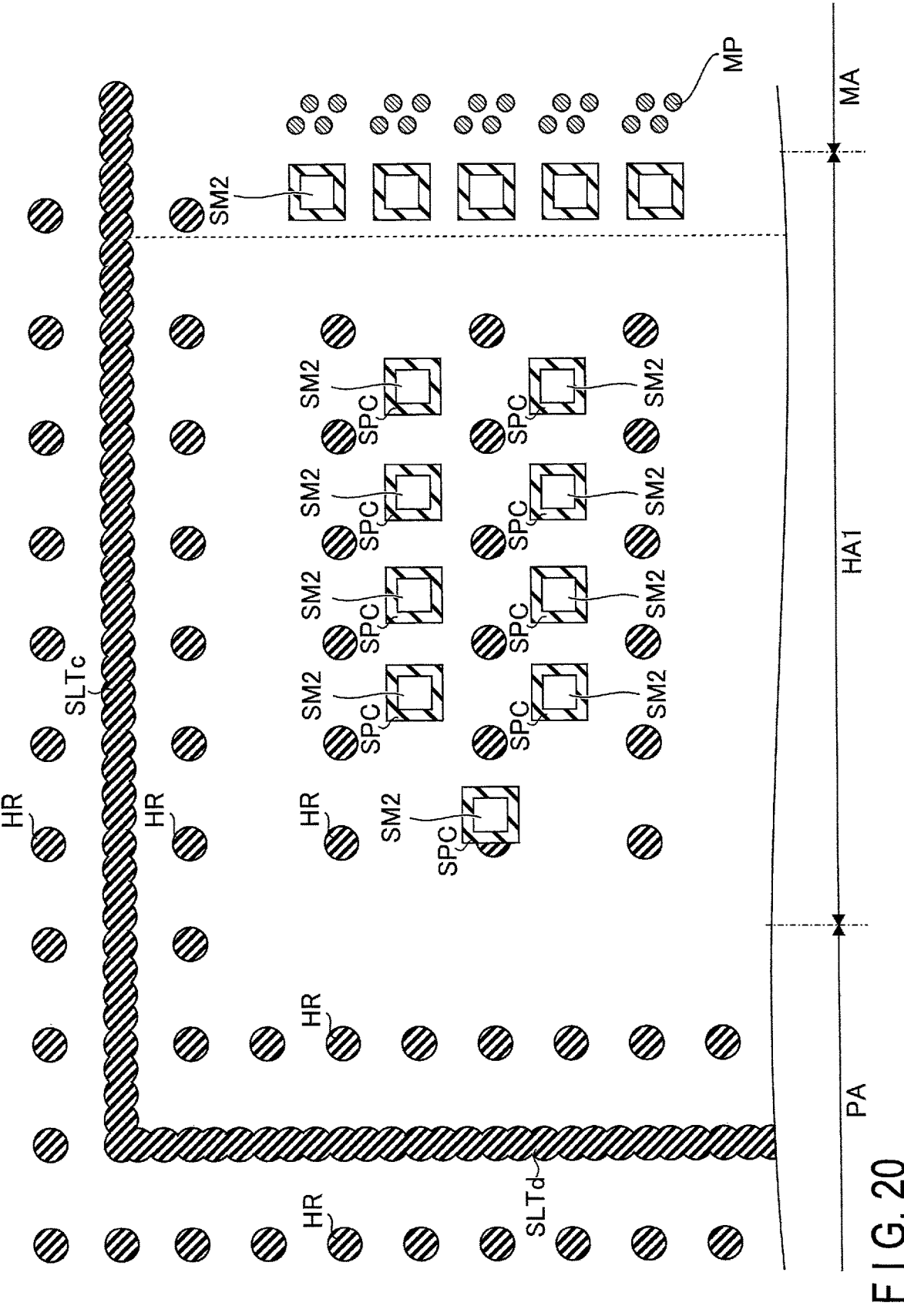
F I G. 20

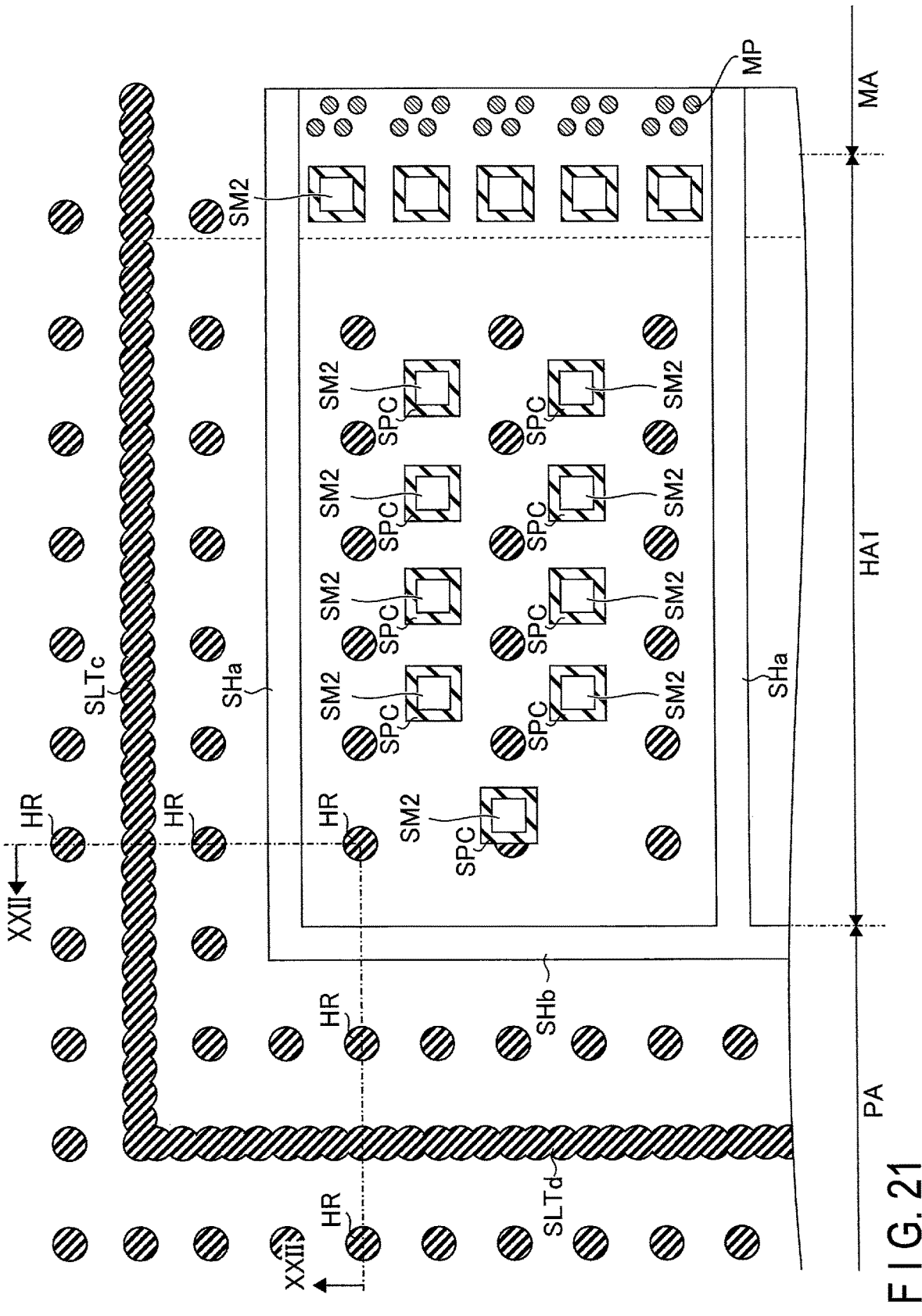
F I G. 21

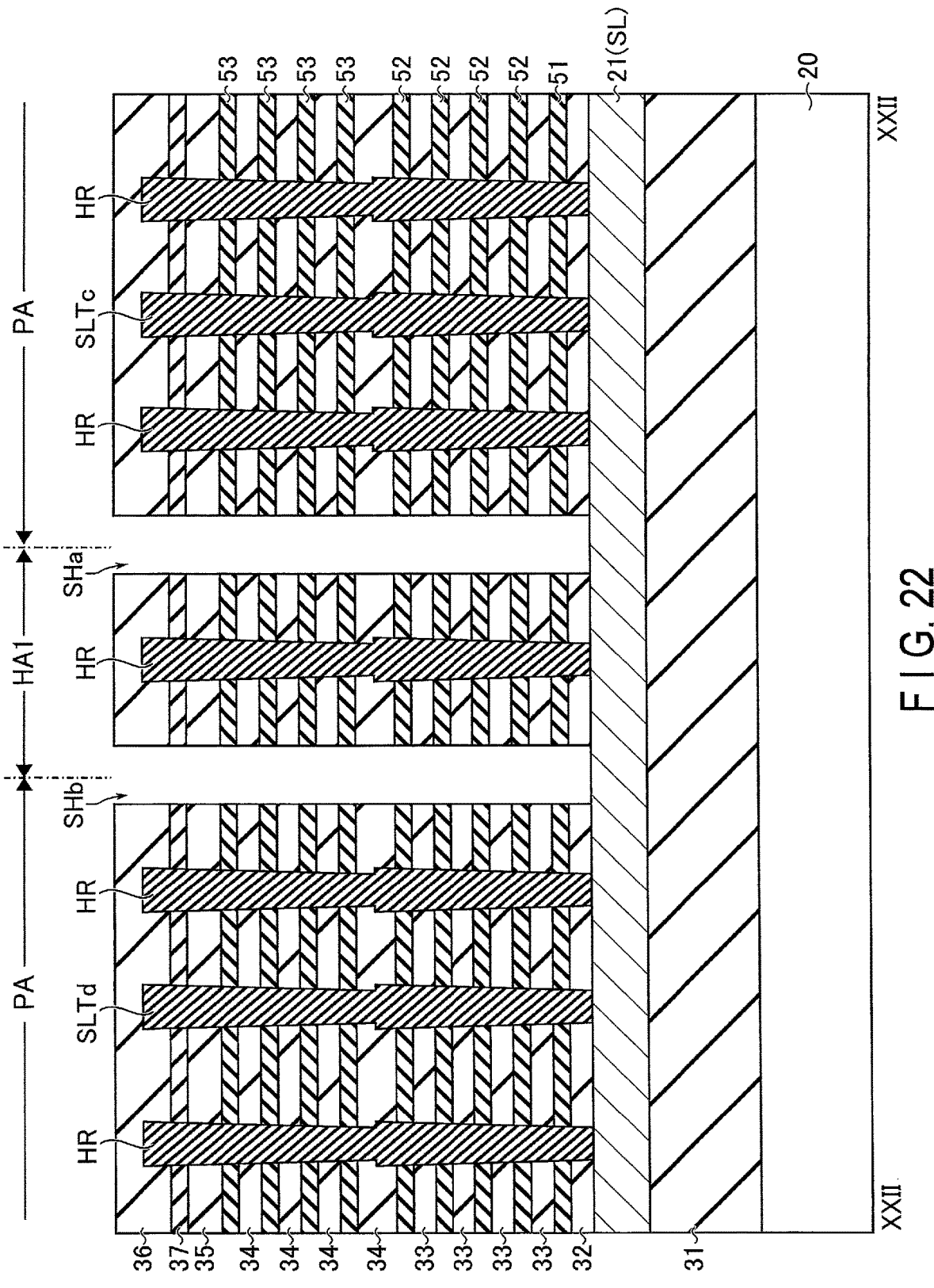
F I G. 22

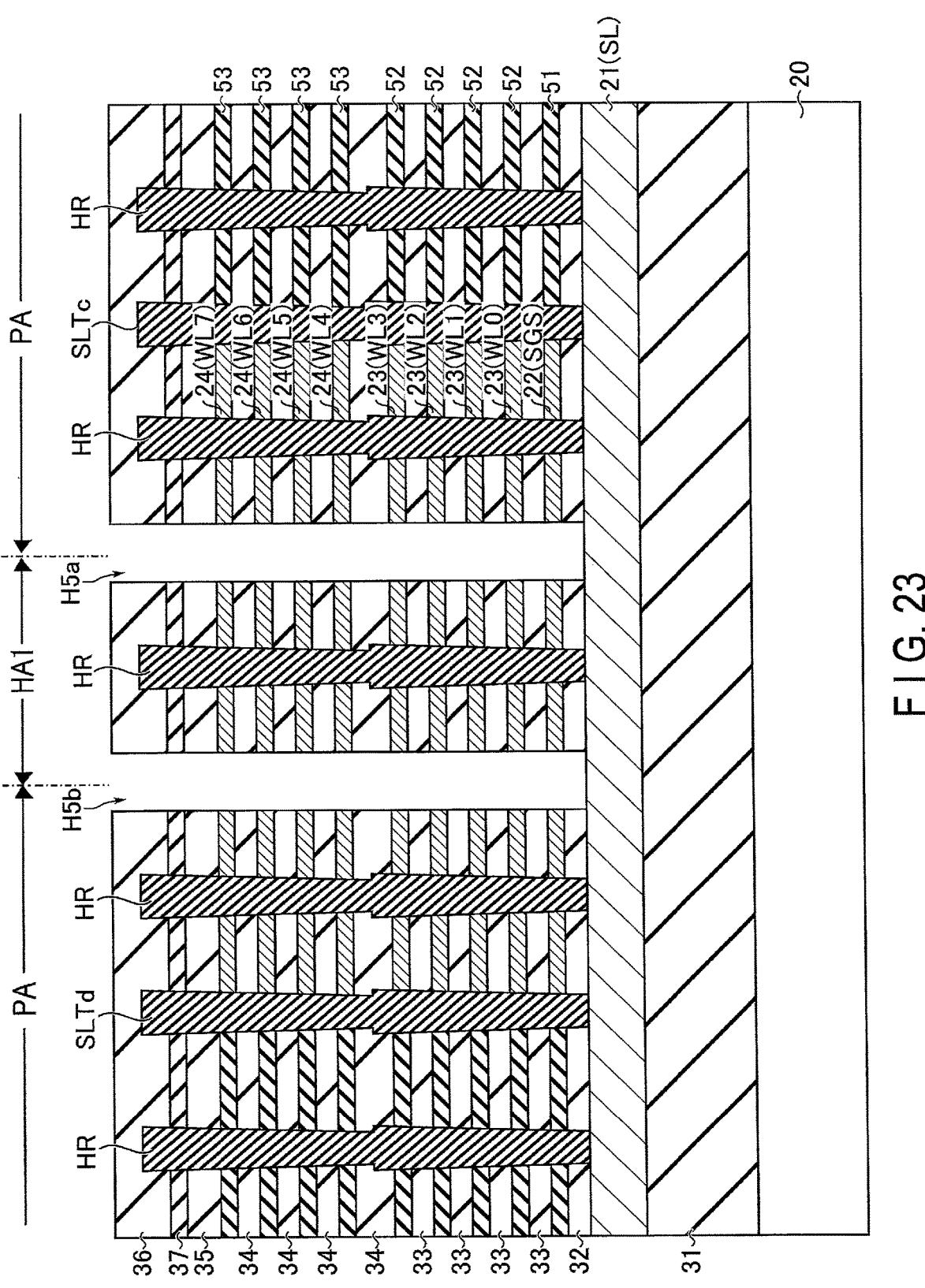
F I G. 23

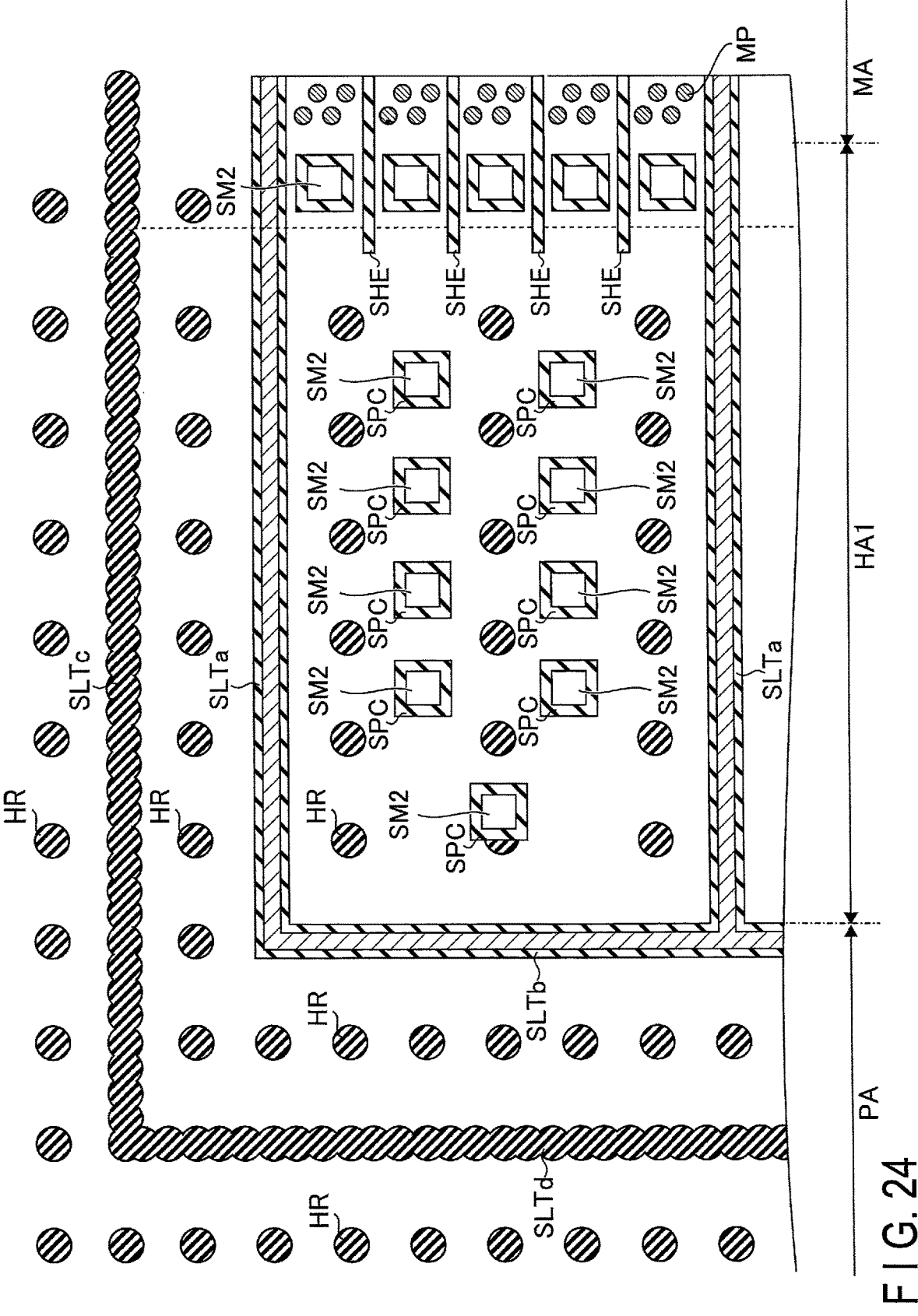
F I G. 24

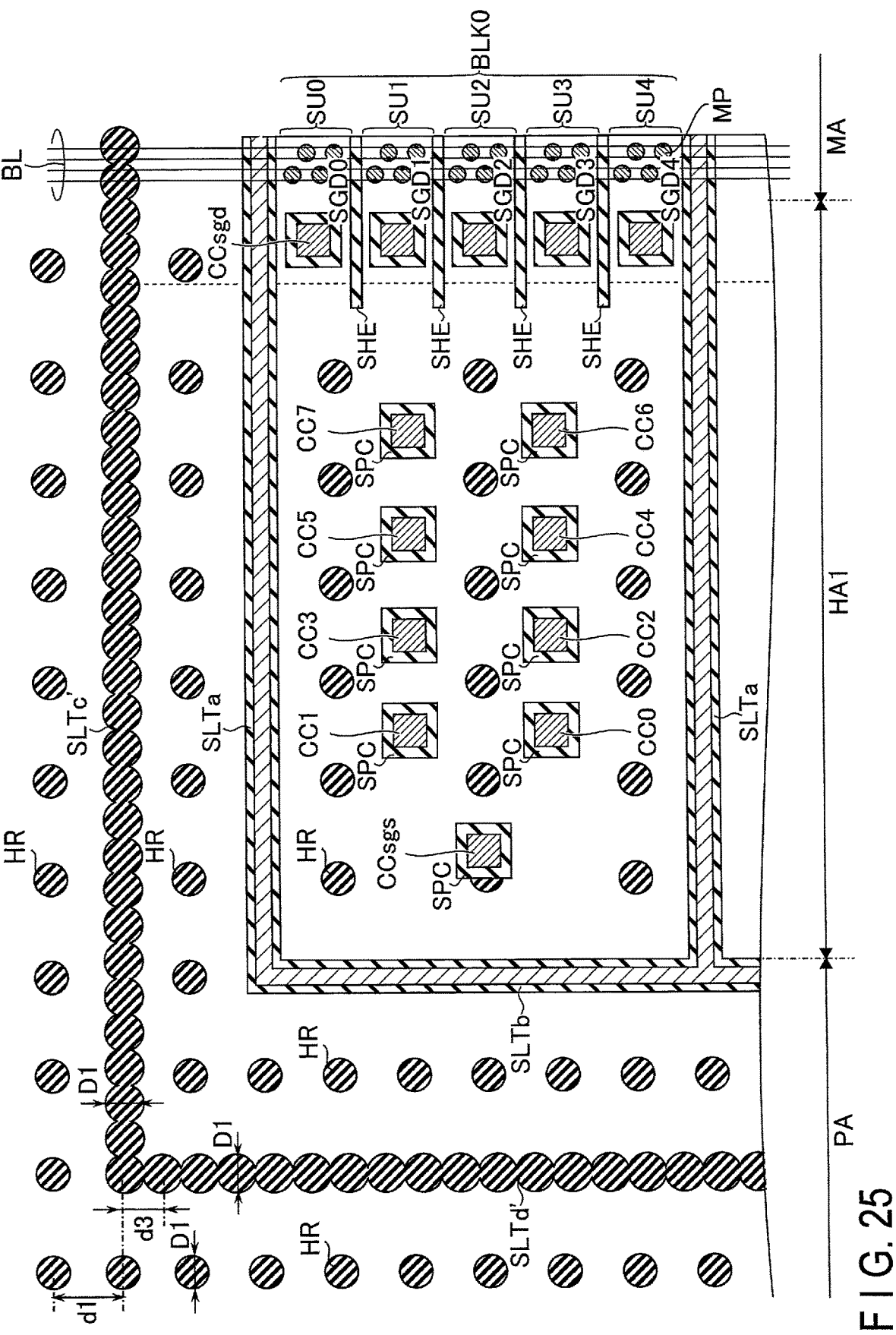
F I G. 25

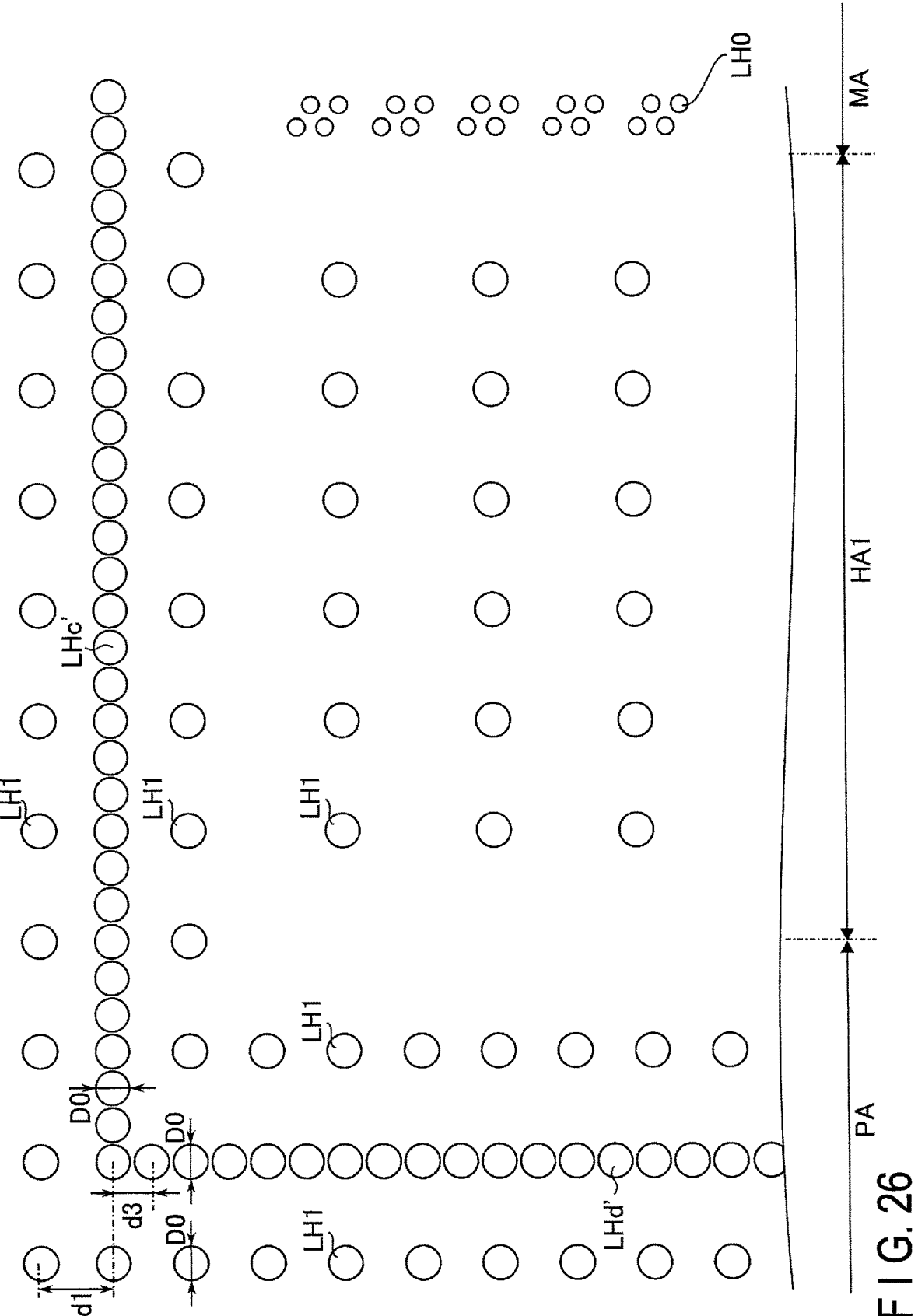
F I G. 26

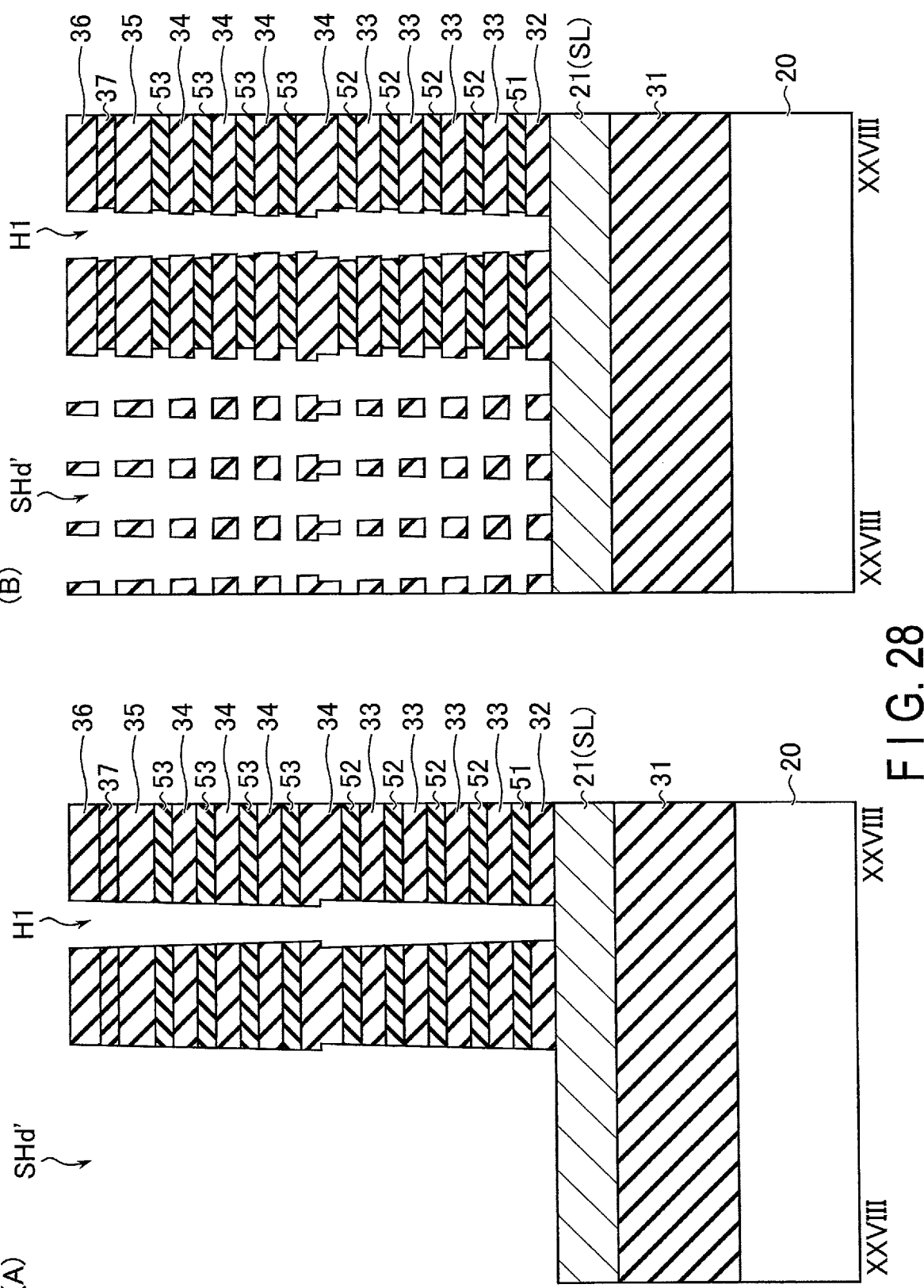
F I G. 28

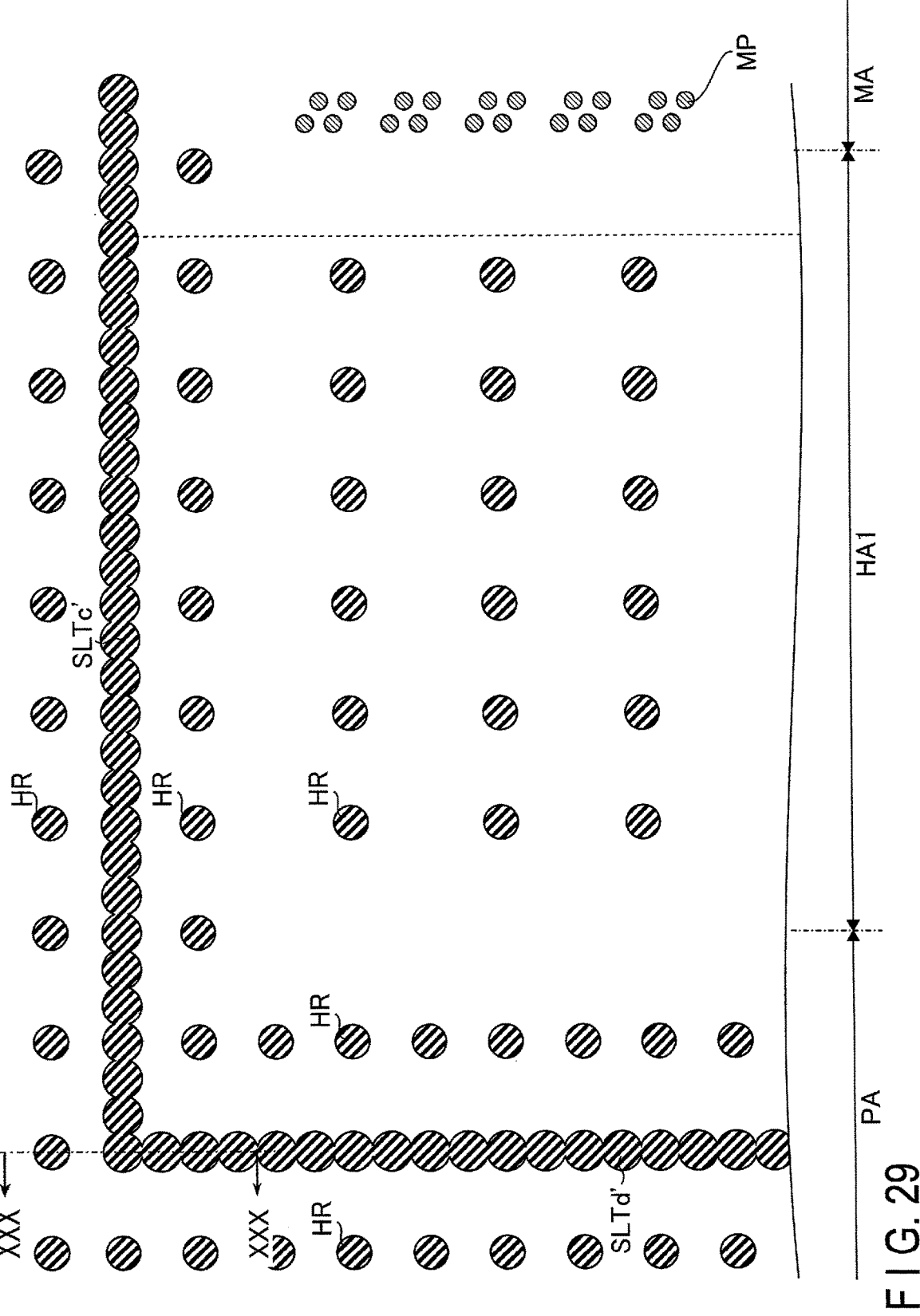
F I G. 29

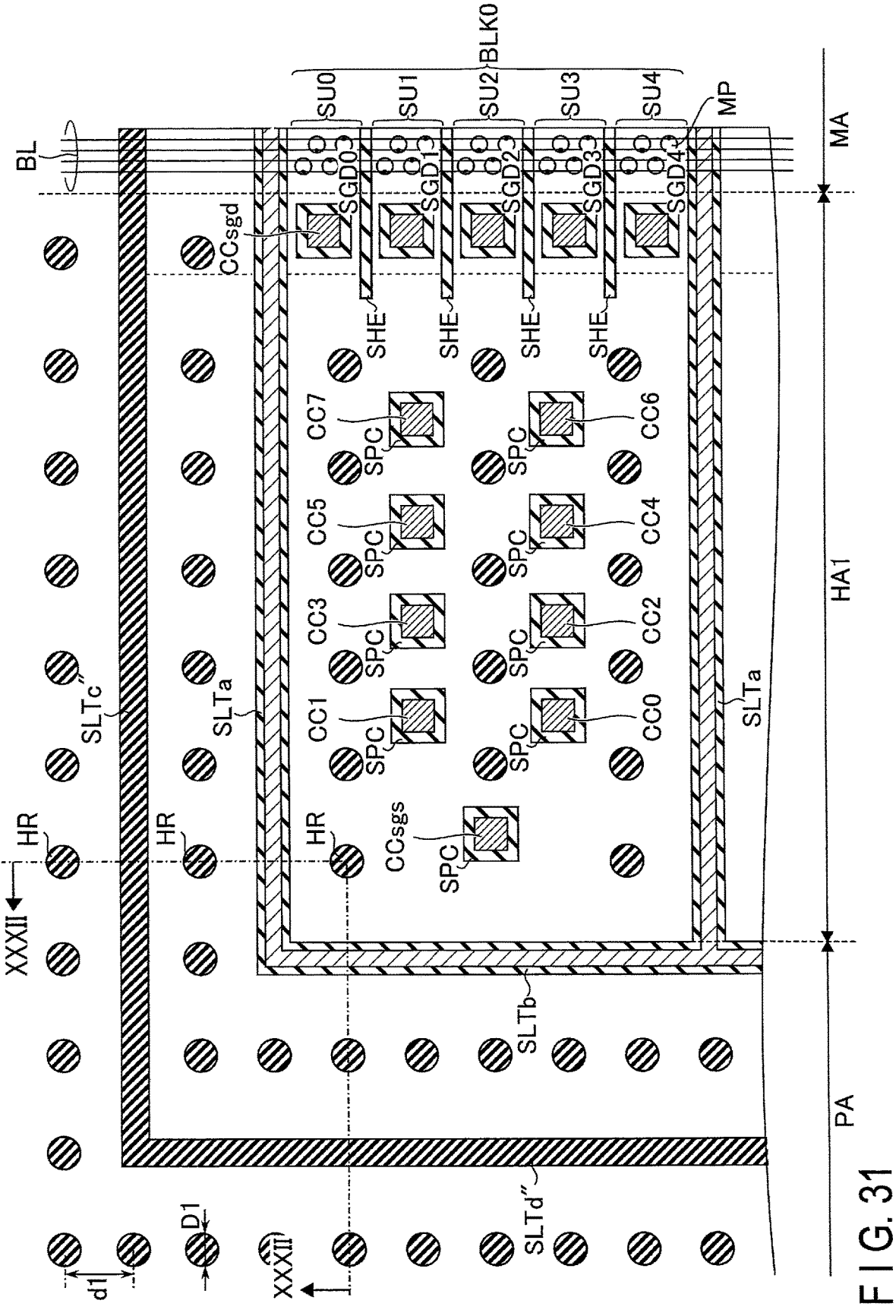
F I G. 31

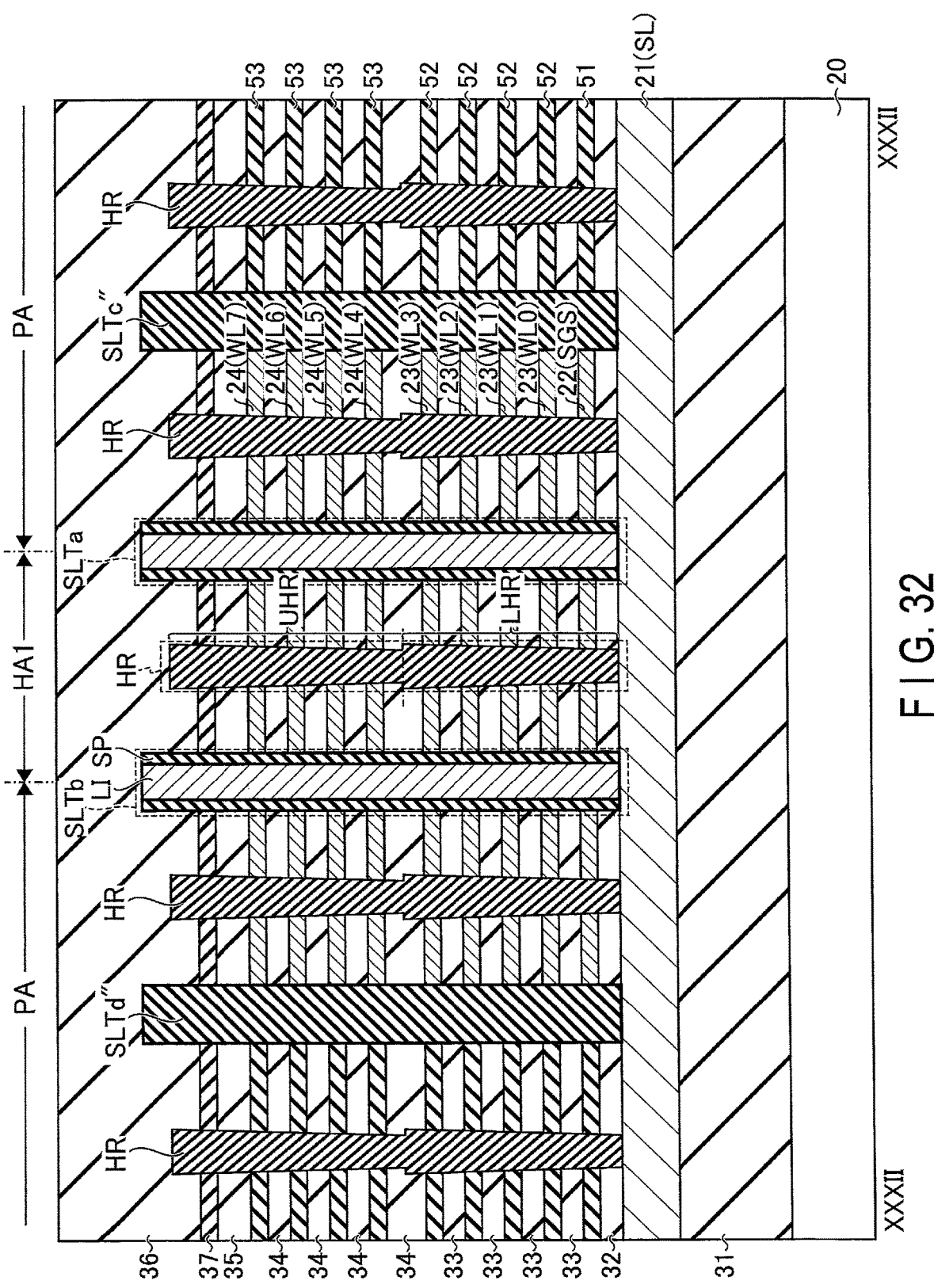
F I G. 32

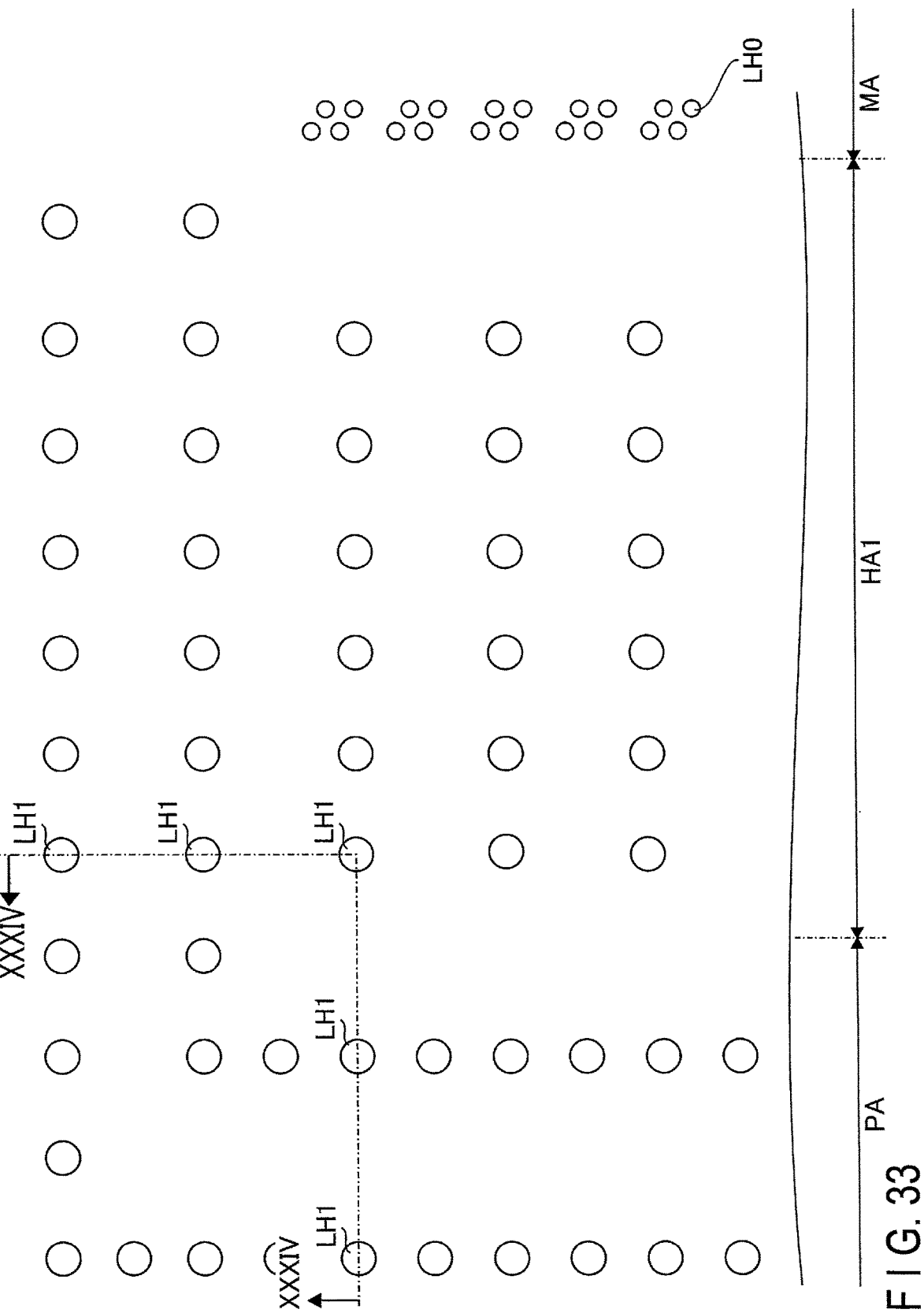
F I G. 33

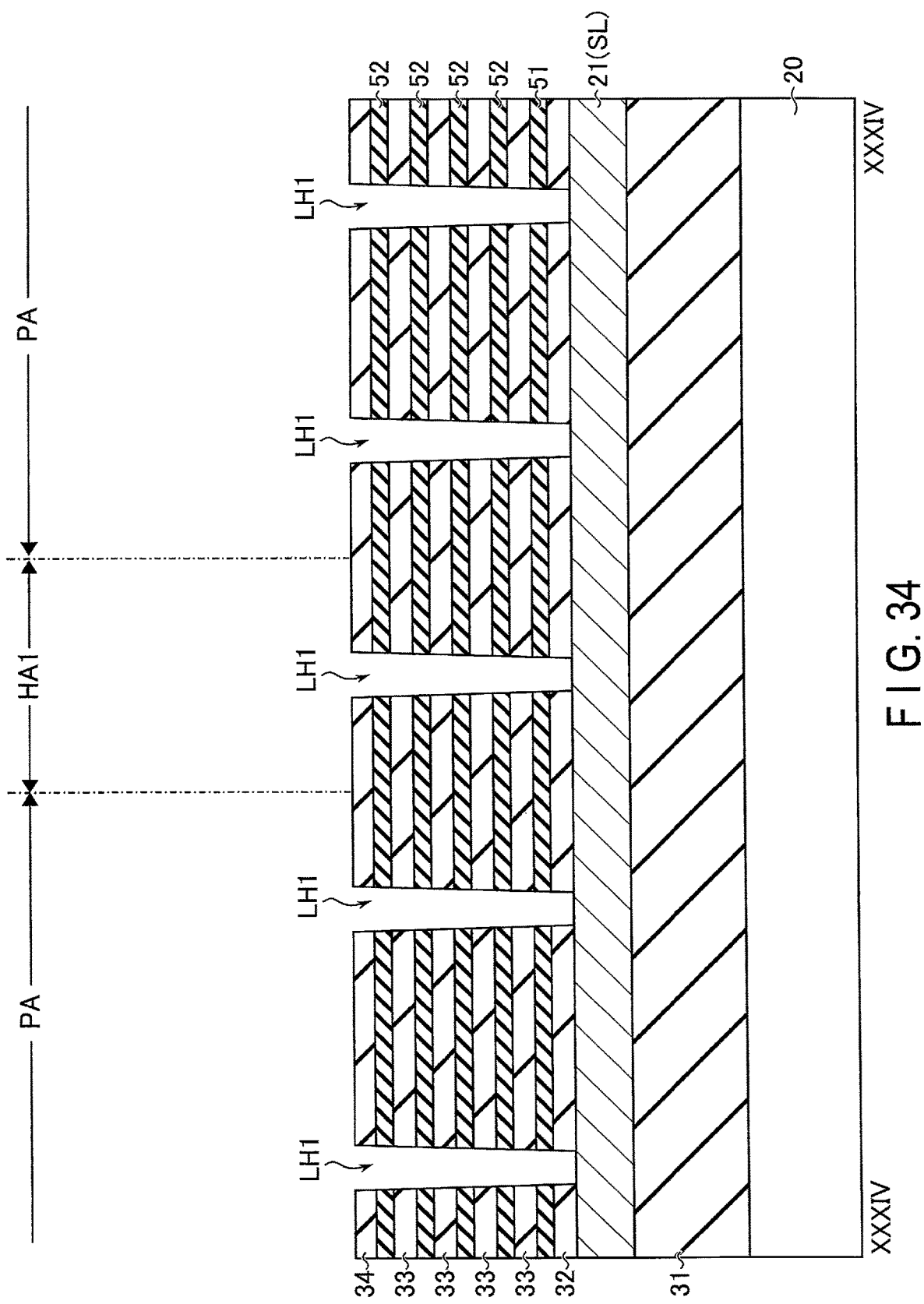
F I G. 34

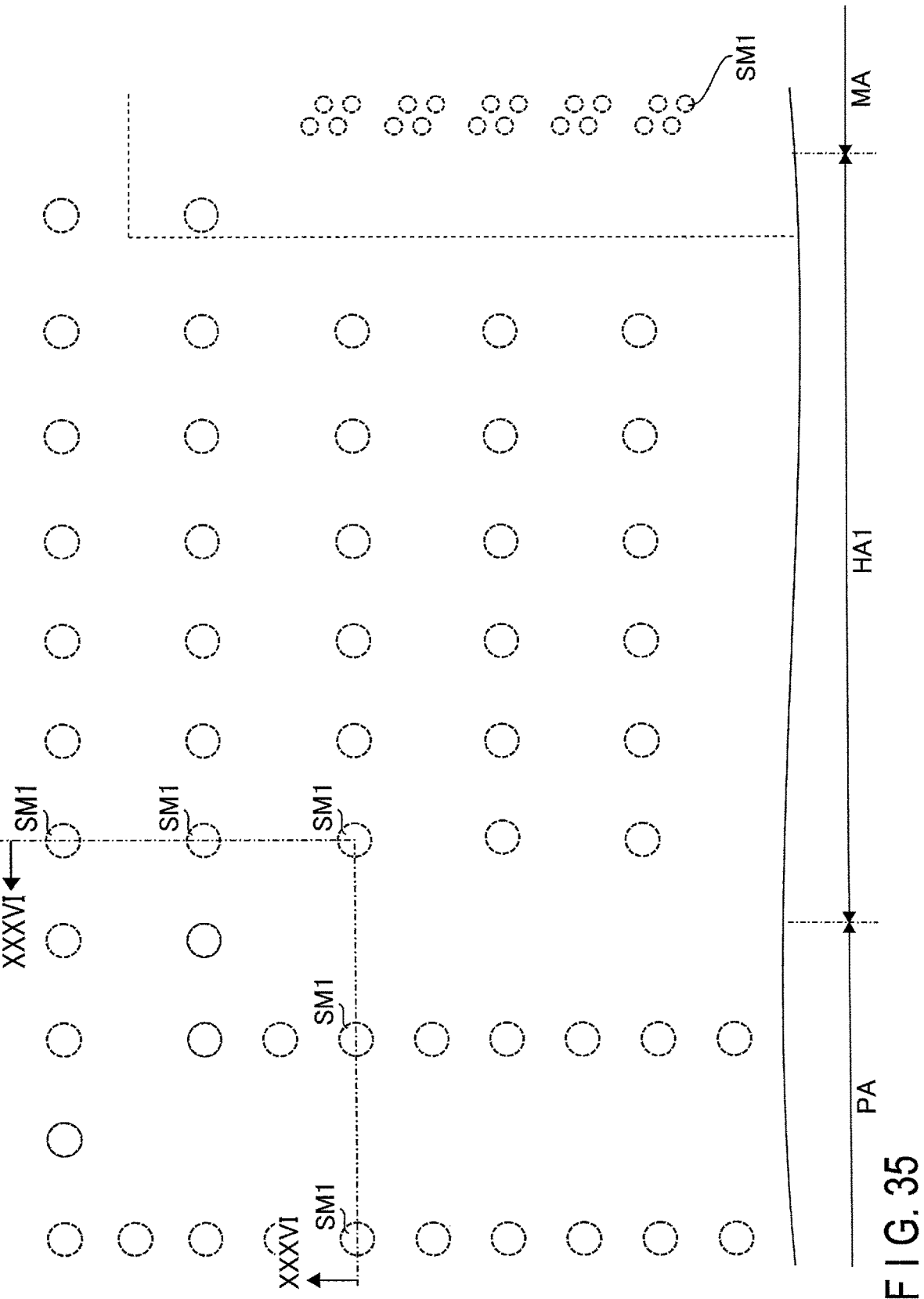
F I G. 35

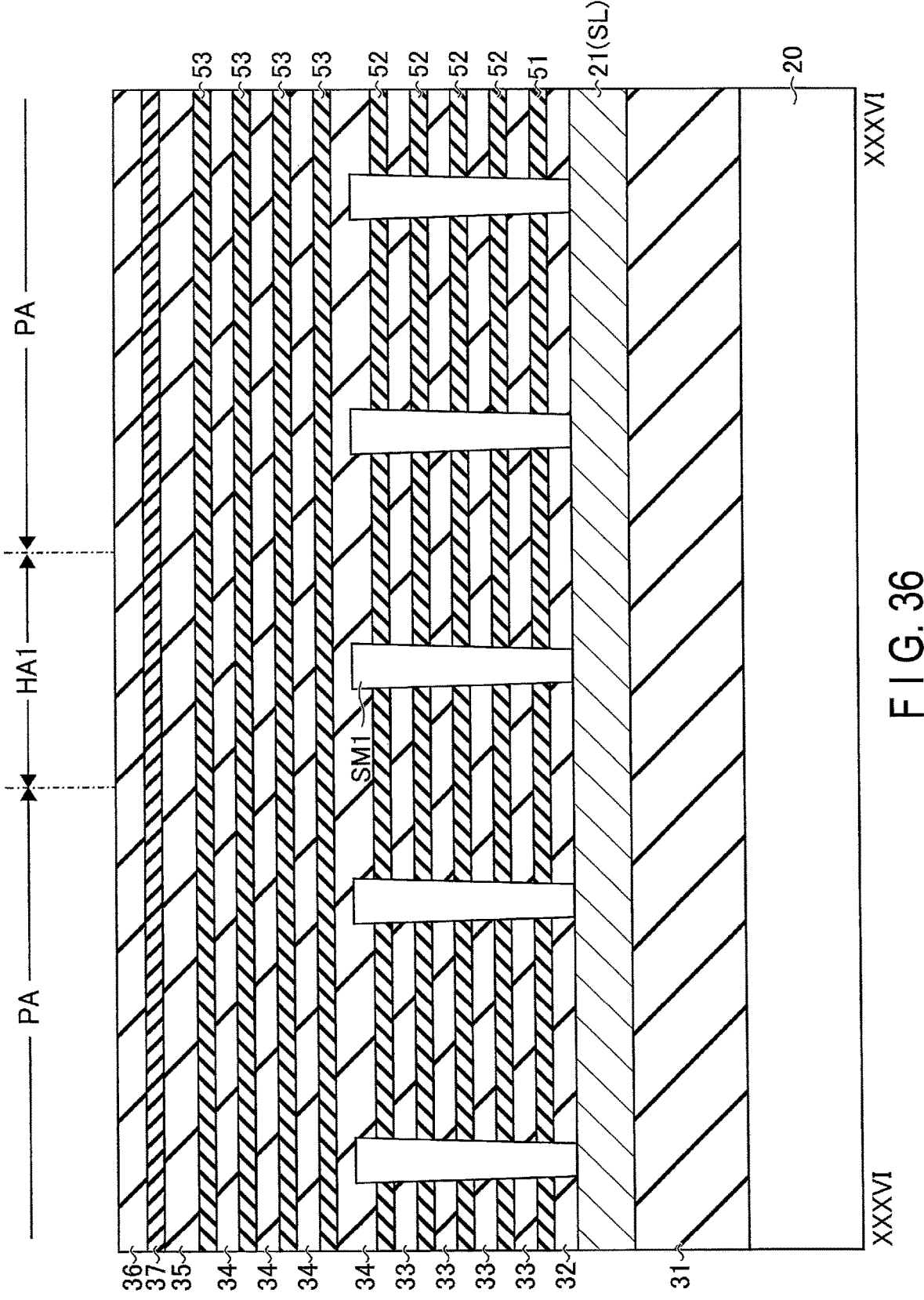
F I G. 36

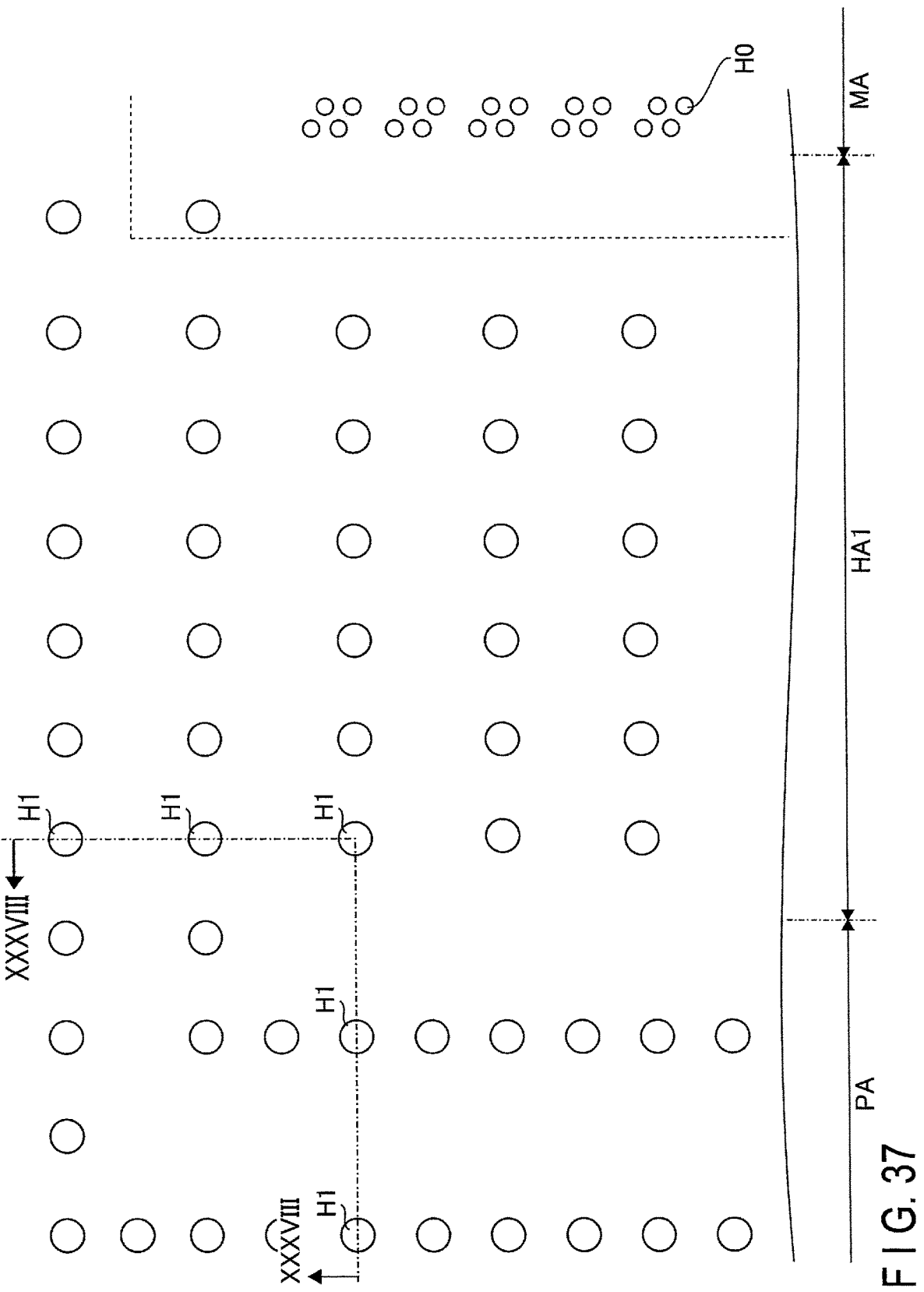
F I G. 37

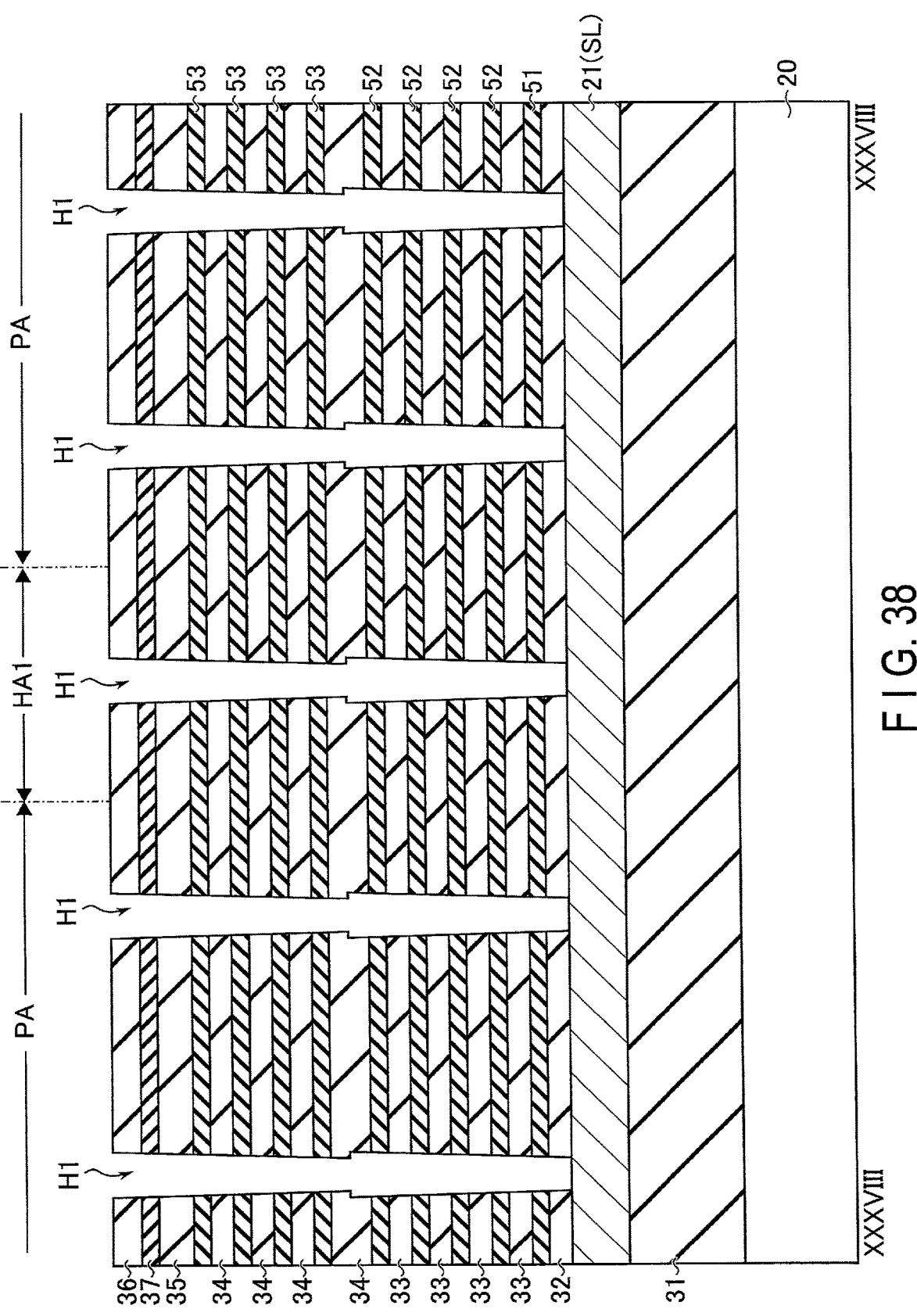
F I G. 38

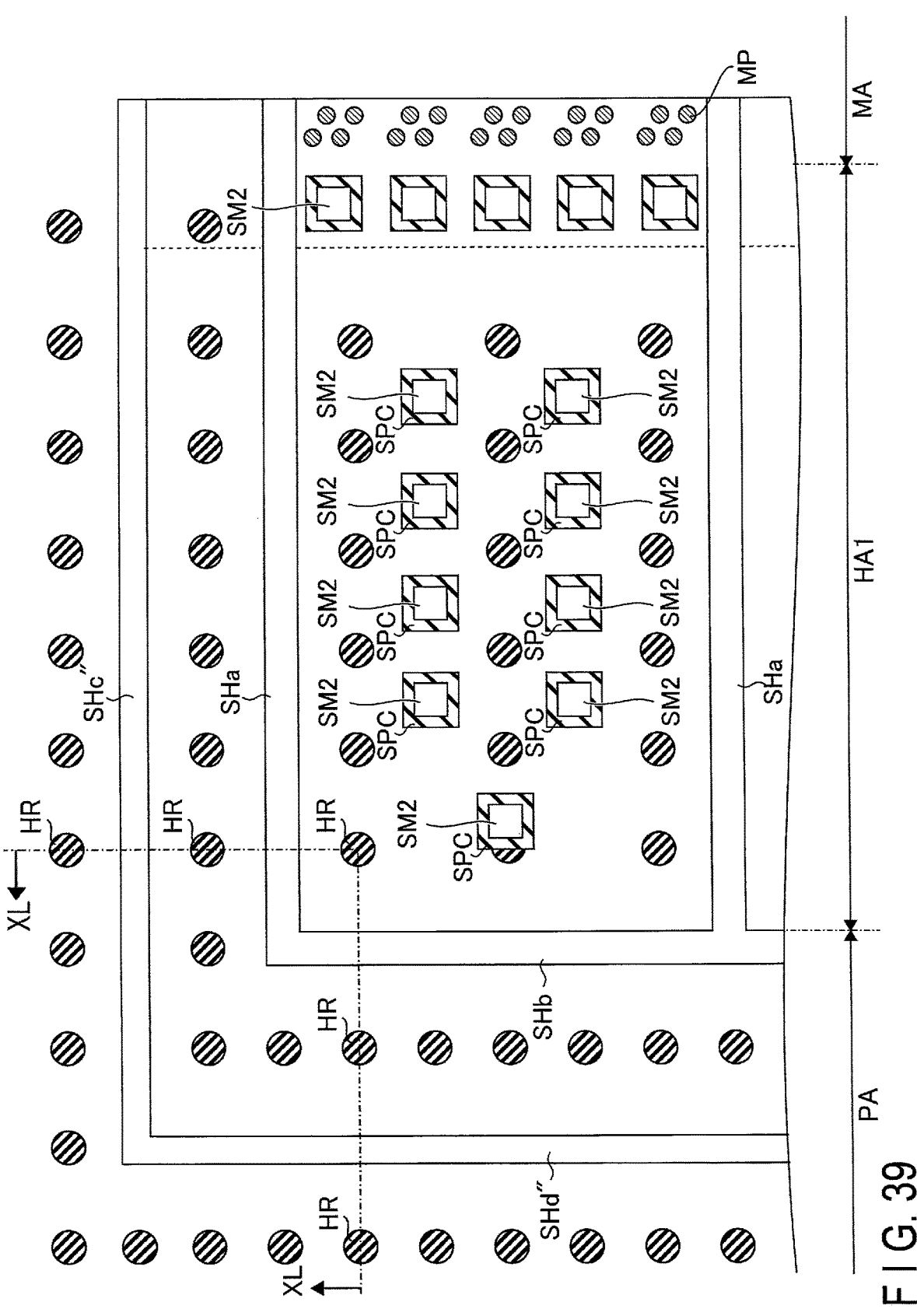
F I G. 39

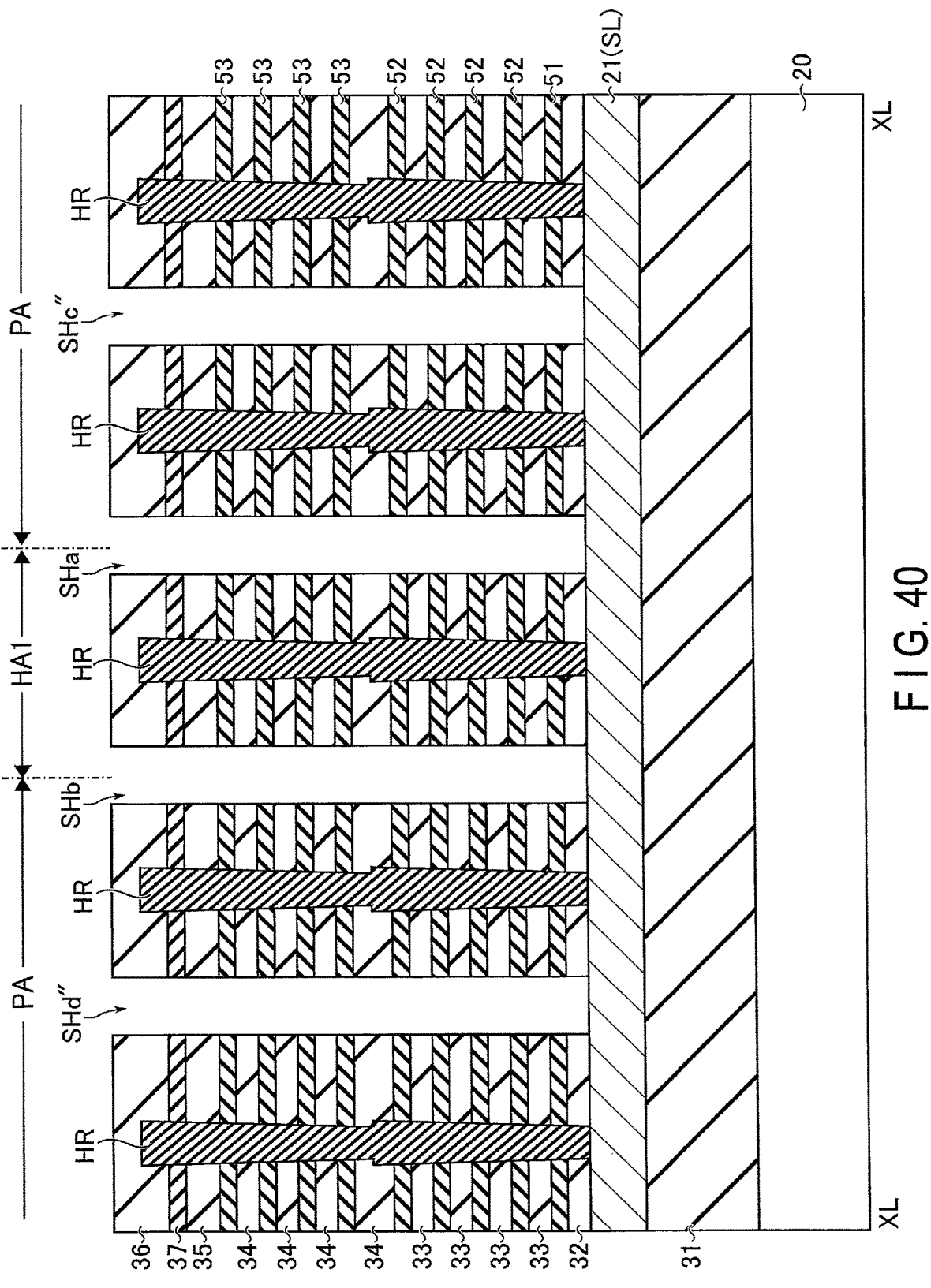
F I G. 40

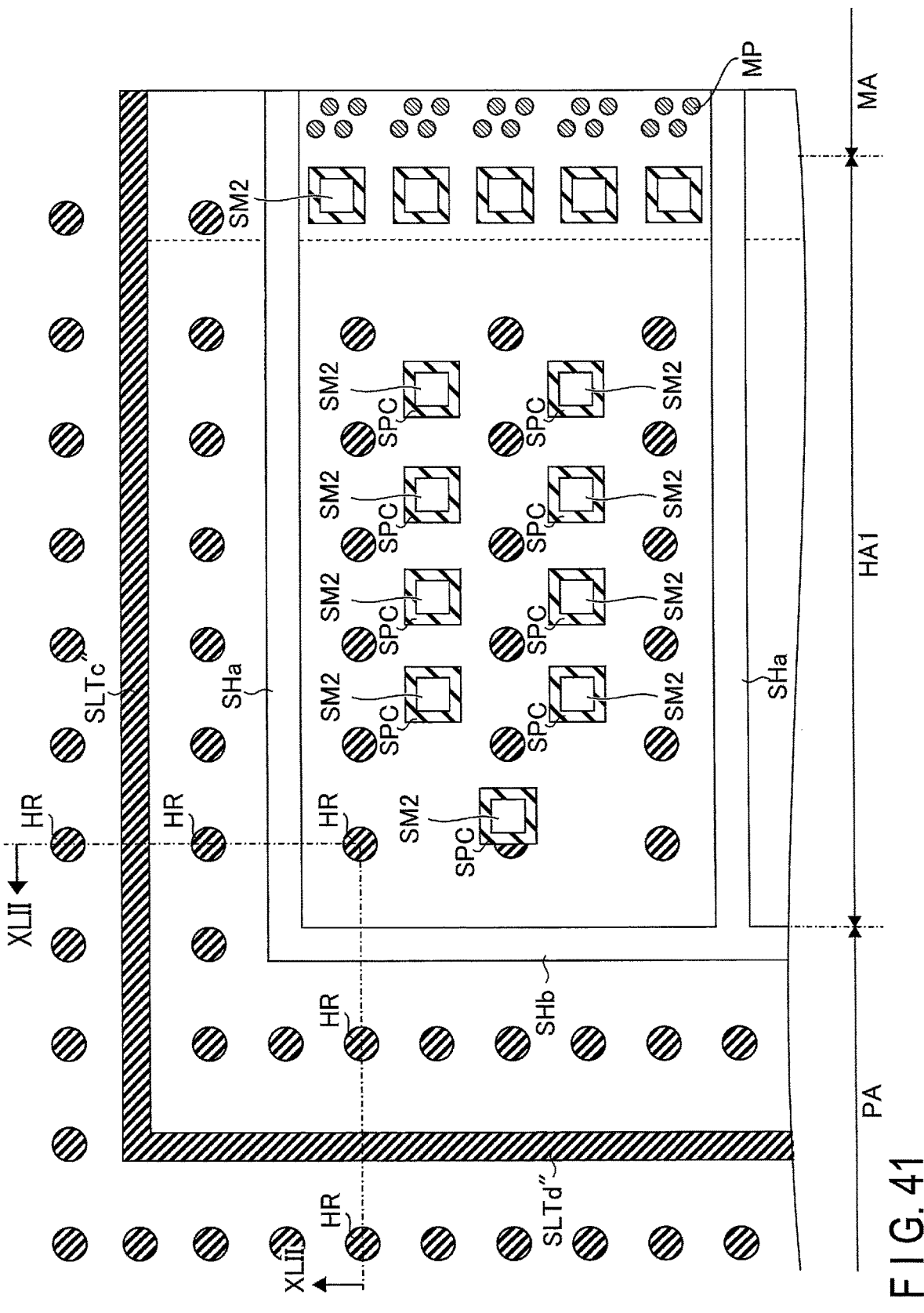
F I G. 41

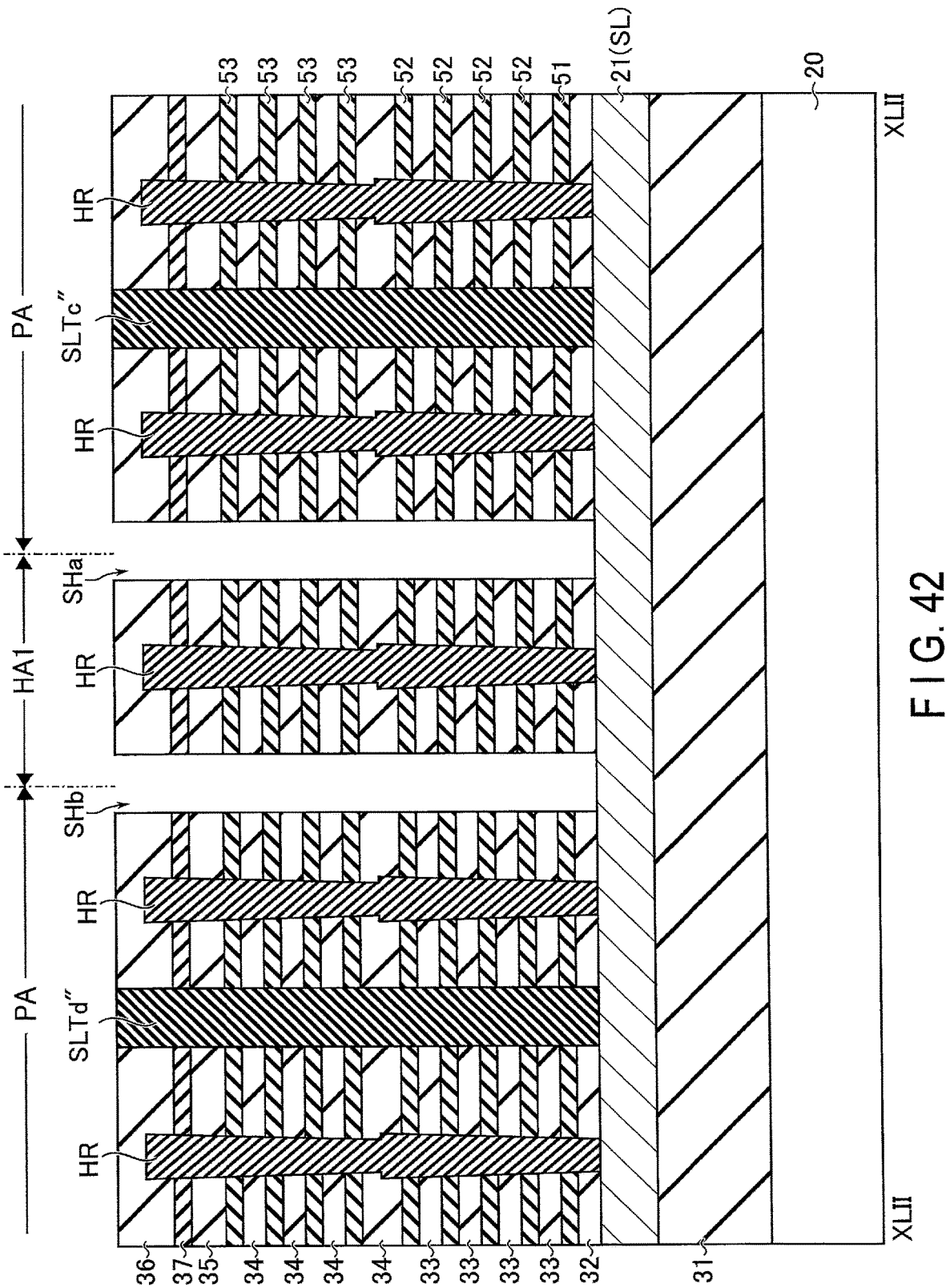
F I G. 42

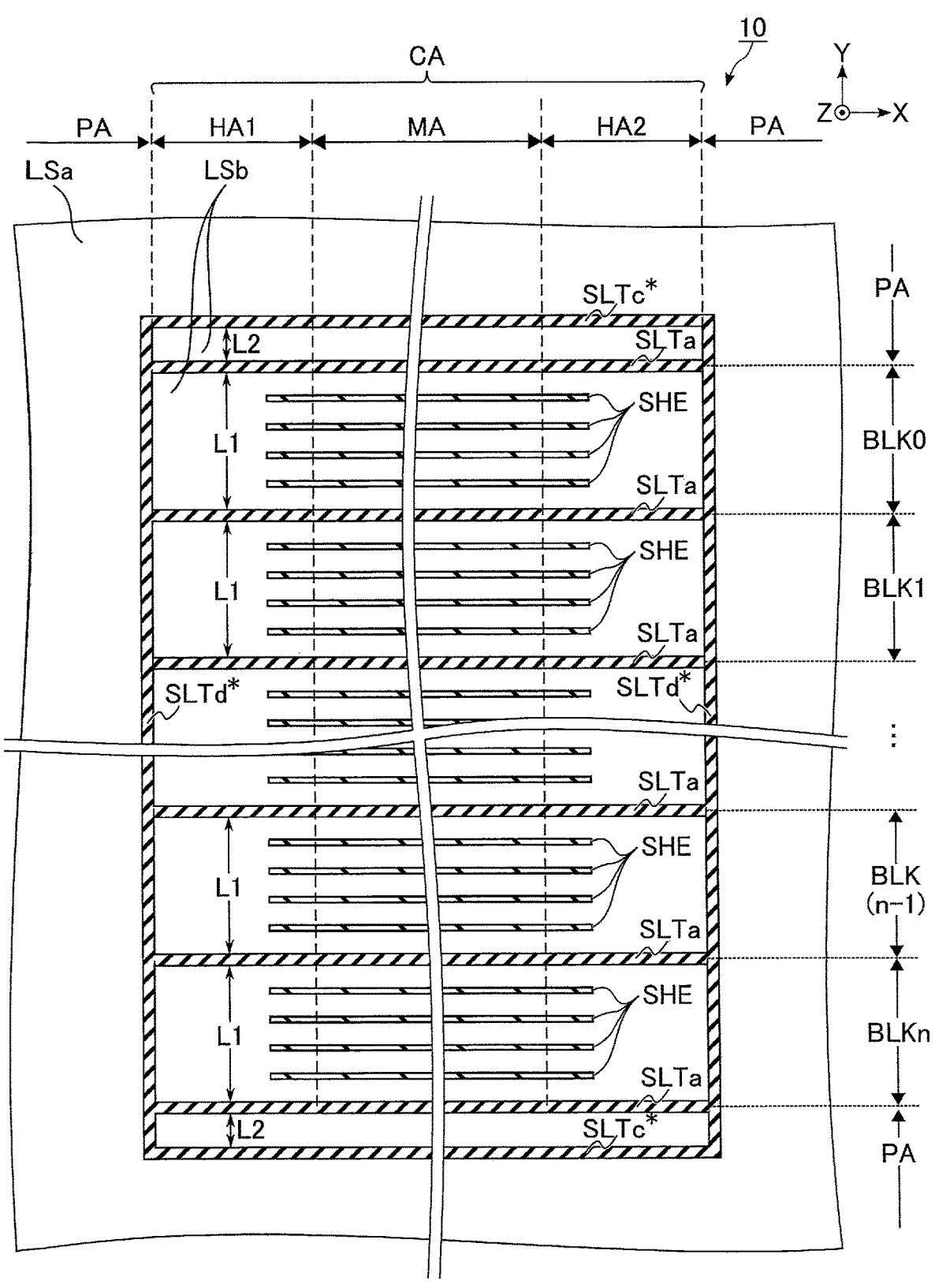
F I G. 43

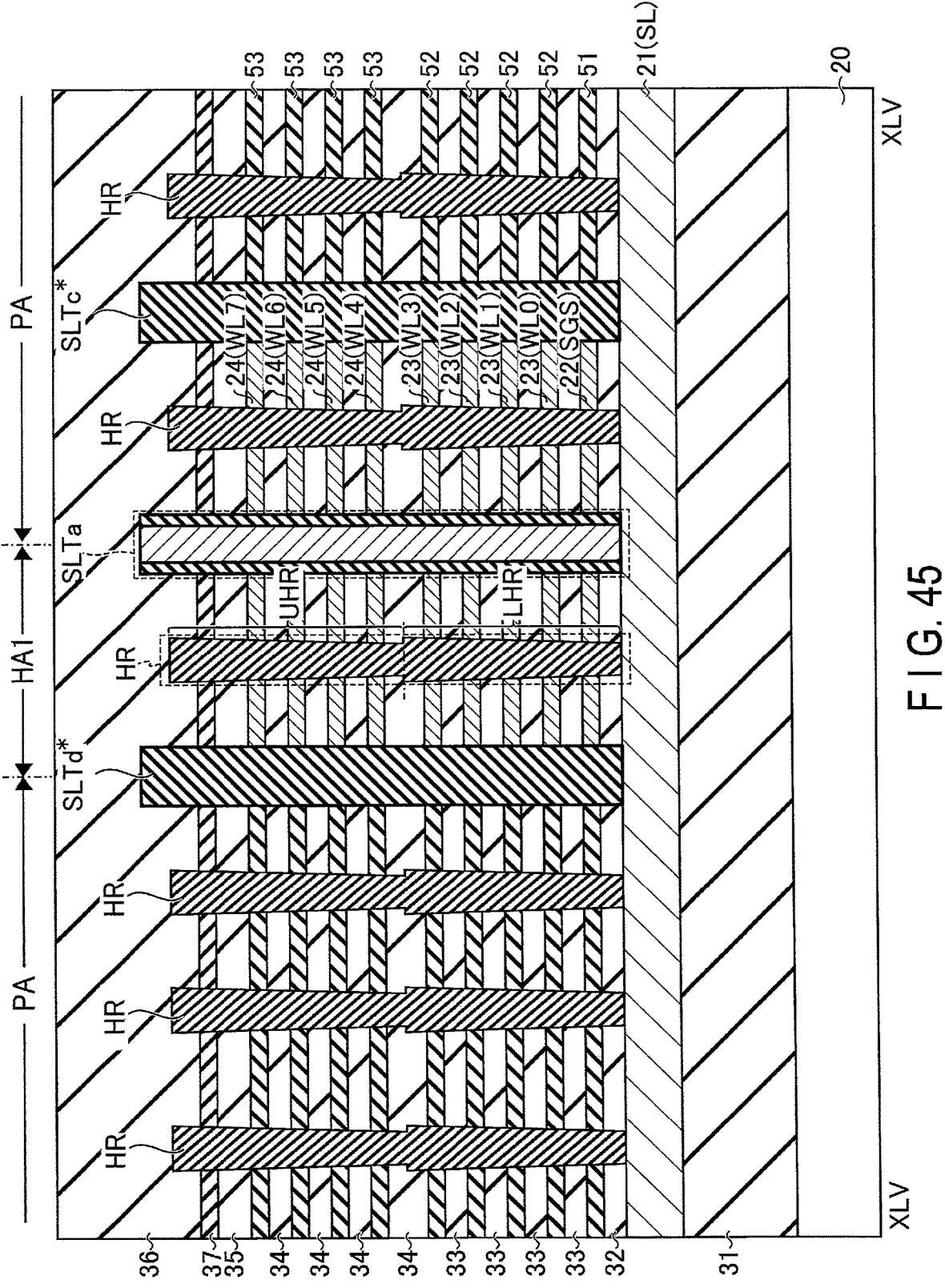
F I G. 45

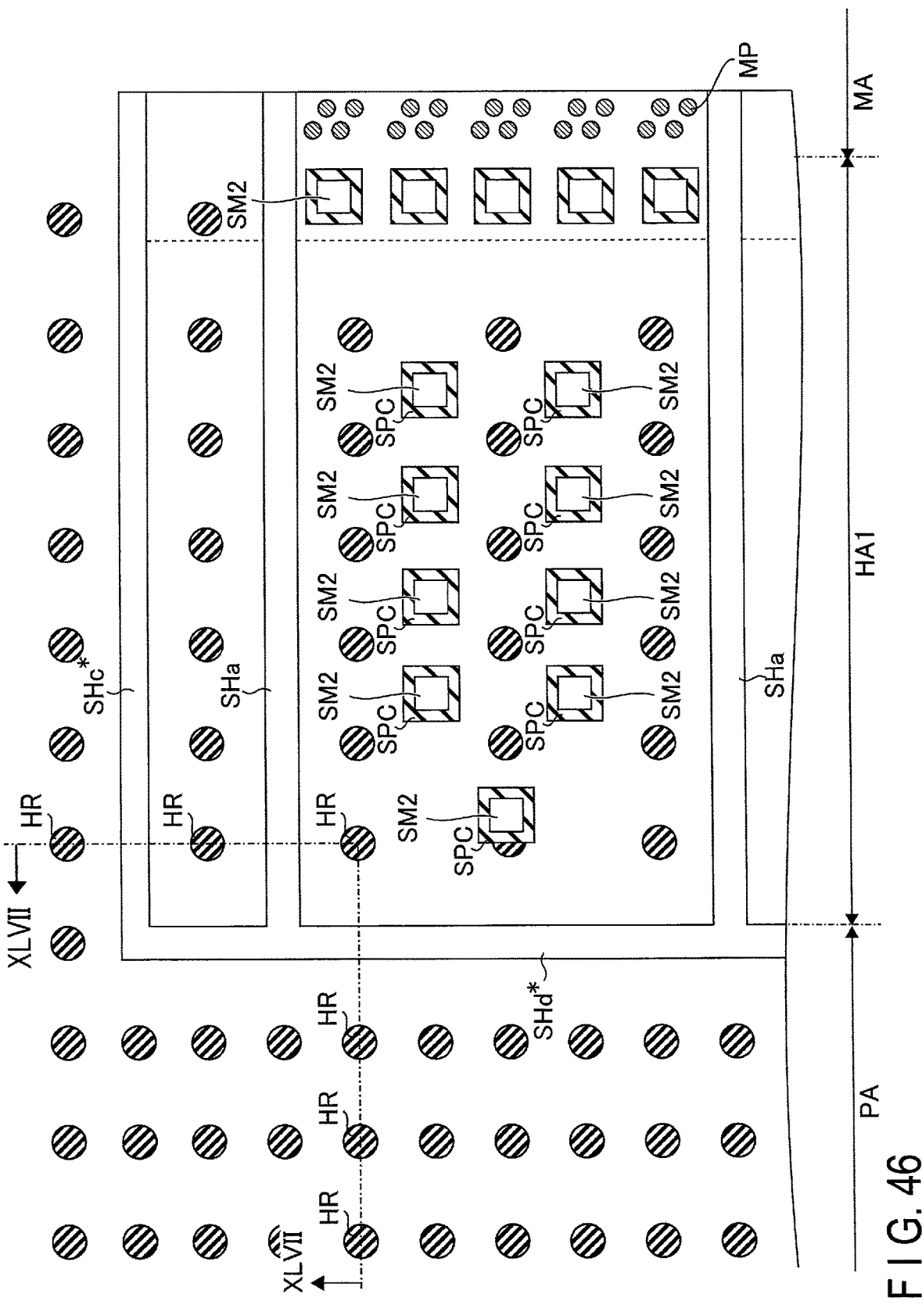
F I G. 46

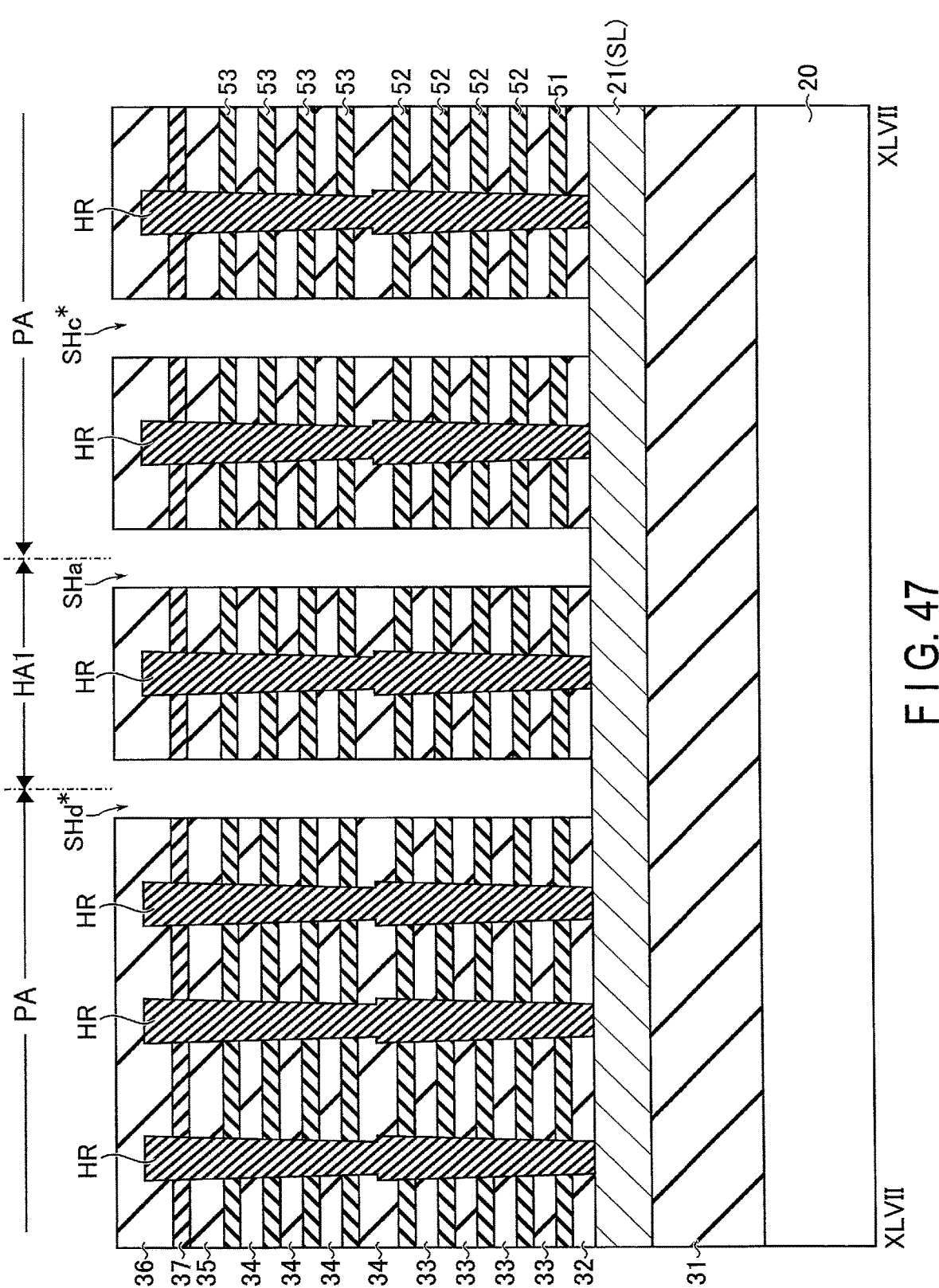
F I G. 47

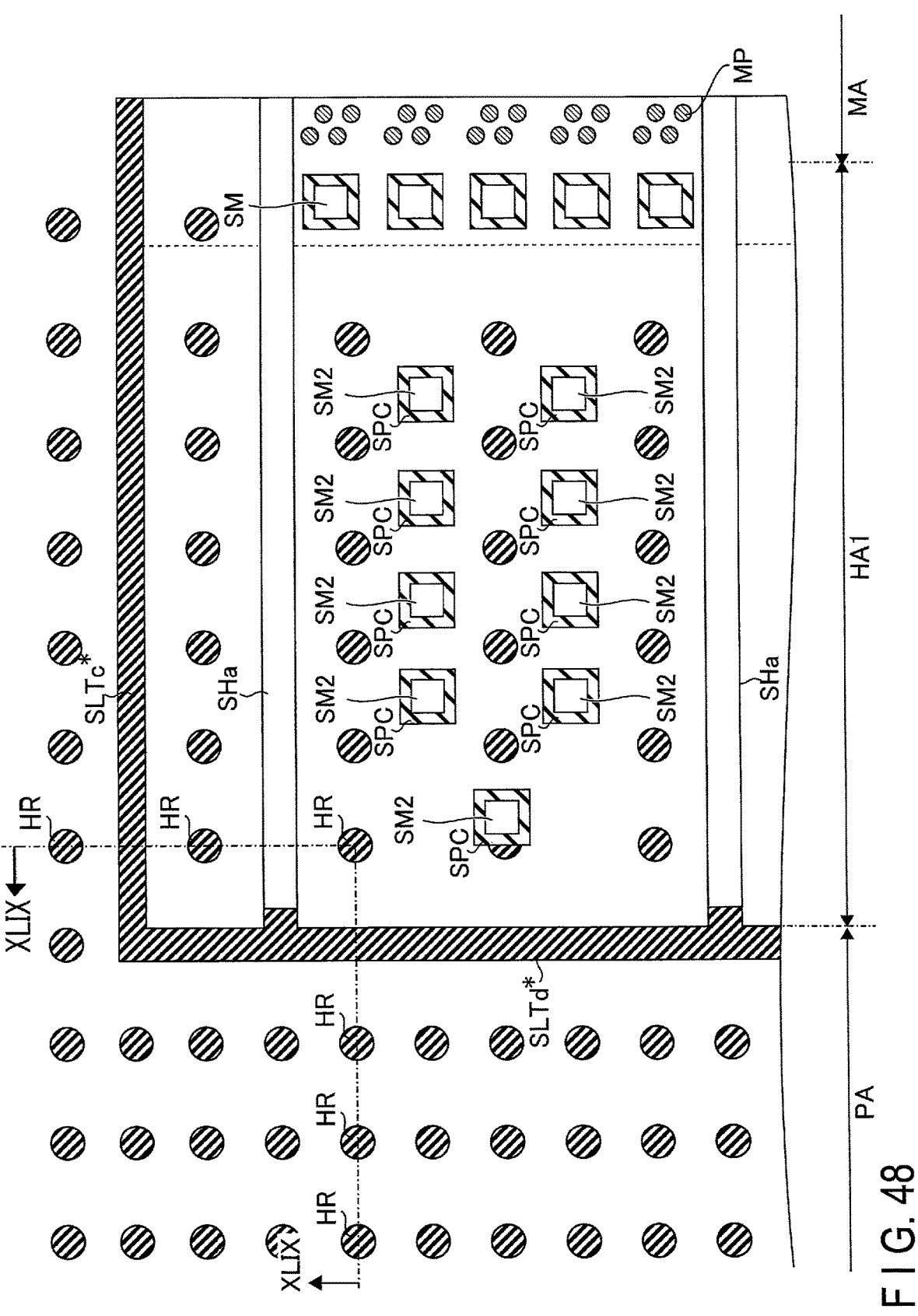
F I G. 48

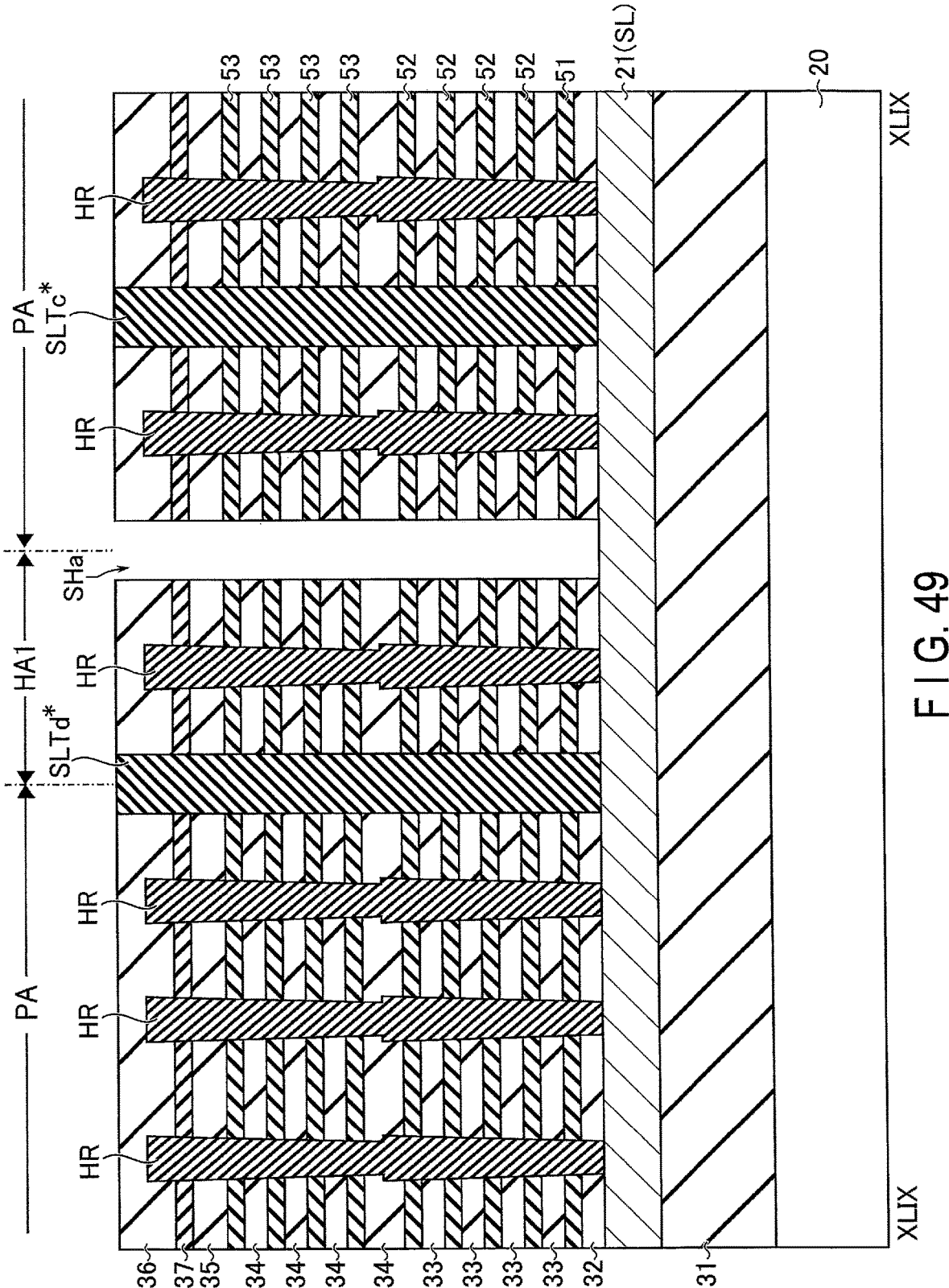
F I G. 49

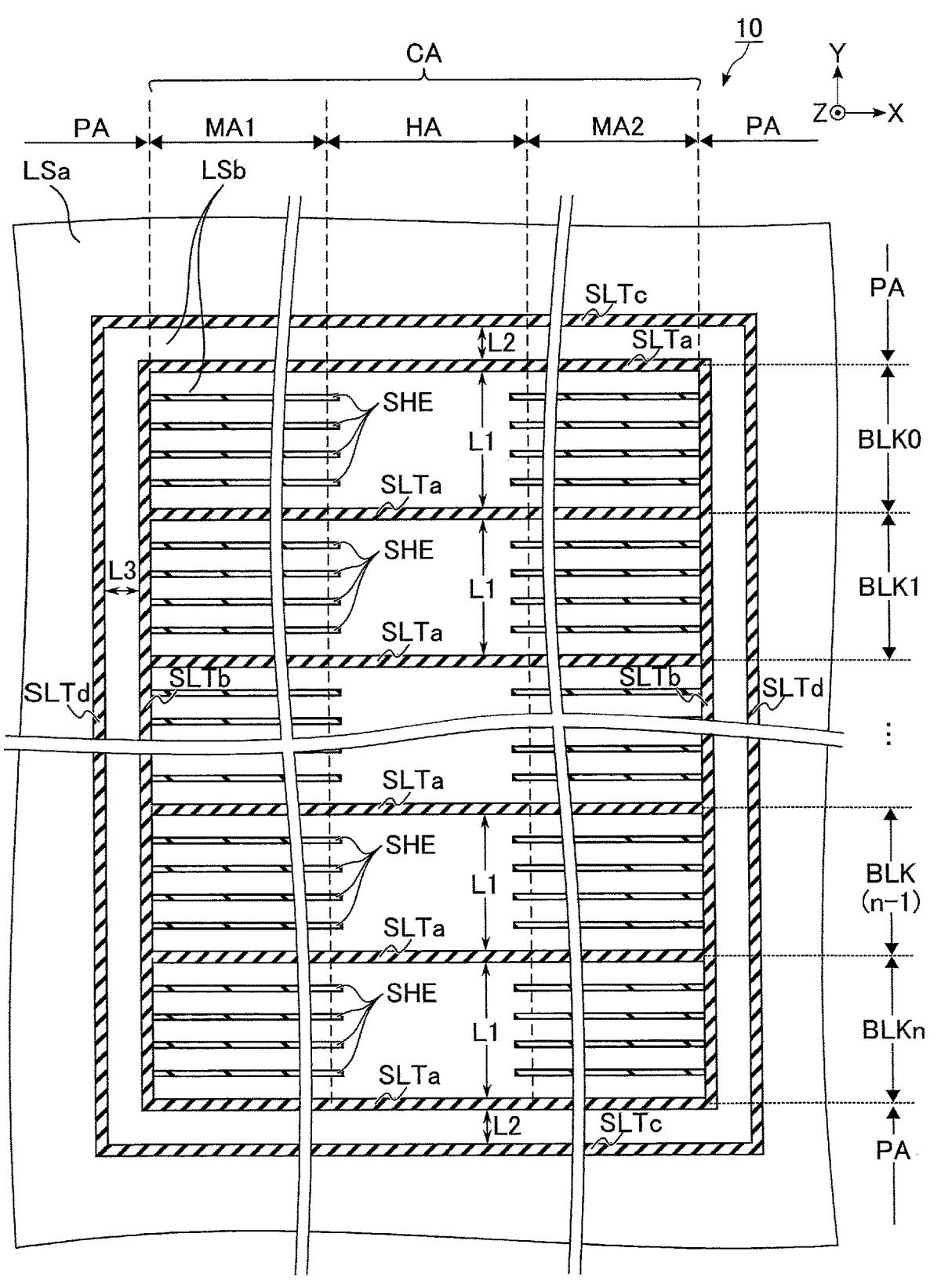
F I G. 50

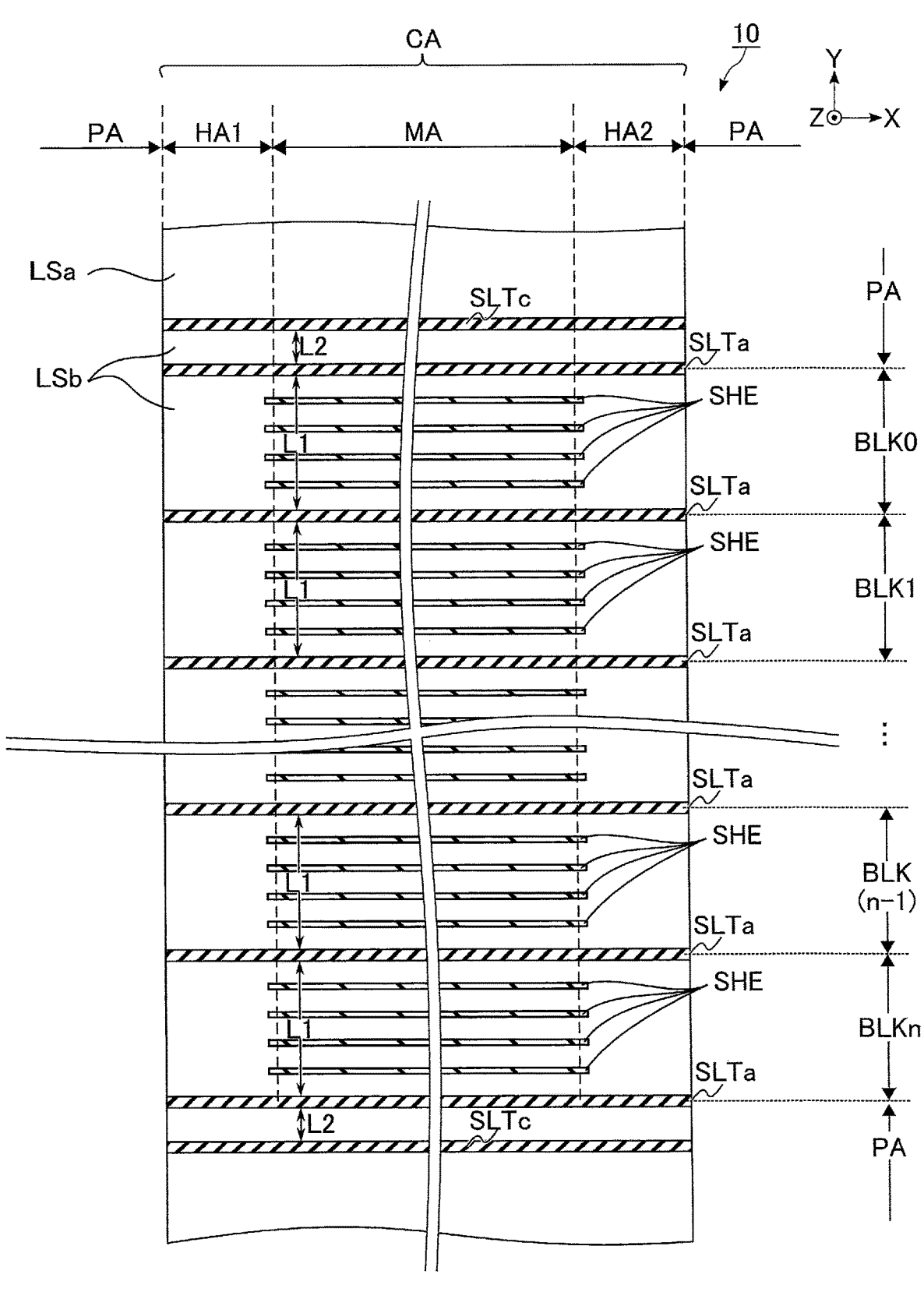
F I G. 51

MEMORY DEVICE INCLUDING A PLURALITY OF MEMBERS SEPARATING OR SURROUNDING A PLURALITY OF LAYER STACKS

CROSS-REFERENCE TO RELATED APPLICATIONS

This application is based upon and claims the benefit of priority from Japanese Patent Application No. 2022-128932, filed Aug. 12, 2022, the entire contents of which are incorporated herein by reference.

FIELD

Embodiments described herein relate generally to a memory device.

BACKGROUND

As a memory device capable of nonvolatilely storing data, a NAND flash memory is known. A memory device such as a NAND flash memory employs a three-dimensional memory structure to increase the capacity and the degree of integration.

BRIEF DESCRIPTION OF THE DRAWINGS

FIG. 1 is a block diagram showing a configuration of a memory system including a memory device according to a first embodiment.

FIG. 2 is a circuit diagram showing an example of a circuit configuration of a memory cell array included in the memory device according to the first embodiment.

FIG. 3 is a plan view showing an example of a planar layout of a region including the memory cell array provided in the memory device according to the first embodiment.

FIG. 4 is a plan view showing an example of a detailed planar layout in a memory region of the memory device according to the first embodiment.

FIG. 5 is a sectional view showing an example of a sectional structure in the memory region of the memory device according to the first embodiment, which is taken along a line V-V in FIG. 4.

FIG. 6 is an enlarged view of a region VI in FIG. 5, showing an example of a sectional structure in the memory region of the memory device according to the first embodiment.

FIG. 7 is a sectional view showing an example of a sectional structure of a memory pillar in the memory device according to the first embodiment, which is taken along a line VII-VII in FIG. 5.

FIG. 9 is a sectional view showing an example of a sectional structure in the hookup region and the memory region of the memory device according to the first embodiment, which is taken along a line IX-IX in FIG. 8.

FIG. 10 is a sectional view showing an example of a sectional structure in the hookup region and the peripheral region of the memory device according to the first embodiment, which is taken along a line X-X in FIG. 8.

FIG. 12 is a plan view showing an example of the planar layout halfway through the manufacturing of the memory device according to the first embodiment.

FIG. 13 is a sectional view showing an example of the sectional structure halfway through the manufacturing of the memory device according to the first embodiment, which is taken along a line XIII-XIII in FIG. 12.

FIG. 14 is a plan view showing an example of the planar layout halfway through the manufacturing of the memory device according to the first embodiment.

FIG. 15 is a sectional view showing an example of the sectional structure halfway through the manufacturing of the memory device according to the first embodiment, which is taken along a line XV-XV in FIG. 14.

FIG. 16 is a plan view showing an example of the planar layout halfway through the manufacturing of the memory device according to the first embodiment.

FIG. 18 is a plan view showing an example of the planar layout halfway through the manufacturing of the memory device according to the first embodiment.

FIG. 19 is a sectional view showing an example of the sectional structure halfway through the manufacturing of the memory device according to the first embodiment, which is taken along a line XIX-XIX in FIG. 18.

FIG. 20 is a plan view showing an example of the planar layout halfway through the manufacturing of the memory device according to the first embodiment.

FIG. 21 is a plan view showing an example of the planar layout halfway through the manufacturing of the memory device according to the first embodiment.

FIG. 22 is a sectional view showing an example of the sectional structure halfway through the manufacturing of the memory device according to the first embodiment, which is taken along a line XXII-XXII in FIG. 21.

FIG. 23 is a sectional view showing an example of the sectional structure halfway through the manufacturing of the memory device according to the first embodiment.

FIG. 24 is a plan view showing an example of the planar layout halfway through the manufacturing of the memory device according to the first embodiment.

FIG. 25 is a plan view showing an example of a detailed planar layout in a hookup region and a peripheral region of a memory device according to a second embodiment.

FIG. 26 is a plan view showing an example of the planar layout halfway through the manufacturing of the memory device according to the second embodiment.

FIG. 28 is a sectional view showing an example of the sectional structure halfway through the manufacturing of the memory device according to the second embodiment, which is taken along a line XXVIII-XXVIII in FIG. 27.

FIG. 29 is a plan view showing an example of the planar layout halfway through the manufacturing of the memory device according to the second embodiment.

FIG. 31 is a plan view showing an example of a detailed planar layout in a hookup region and a peripheral region of a memory device according to a third embodiment.

FIG. 32 is a sectional view showing an example of a sectional structure in the hookup region and the peripheral region of the memory device according to the third embodiment, which is taken along a line XXXII-XXXII in FIG. 31.

FIG. 33 is a plan view showing an example of the planar layout halfway through the manufacturing of the memory device according to the third embodiment.

FIG. 34 is a sectional view showing an example of the sectional structure halfway through the manufacturing of the memory device according to the third embodiment, which is taken along a line XXXIV-XXXIV in FIG. 33.

FIG. 35 is a plan view showing an example of the planar layout halfway through the manufacturing of the memory device according to the third embodiment.

FIG. 36 is a sectional view showing an example of the sectional structure halfway through the manufacturing of the memory device according to the third embodiment, which is taken along a line XXXVI-XXXVI in FIG. 35.

FIG. 37 is a plan view showing an example of the planar layout halfway through the manufacturing of the memory device according to the third embodiment.

FIG. 38 is a sectional view showing an example of the sectional structure halfway through the manufacturing of the memory device according to the third embodiment, which is taken along a line XXXVIII-XXXVIII in FIG. 37.

FIG. 39 is a plan view showing an example of the planar layout halfway through the manufacturing of the memory device according to the third embodiment.

FIG. 40 is a sectional view showing an example of the sectional structure halfway through the manufacturing of the memory device according to the third embodiment, which is taken along a line XL-XL in FIG. 39.

FIG. 41 is a plan view showing an example of the planar layout halfway through the manufacturing of the memory device according to the third embodiment.

FIG. 42 is a sectional view showing an example of the sectional structure halfway through the manufacturing of the memory device according to the third embodiment, which is taken along a line XLII-XLII in FIG. 41.

FIG. 43 is a plan view showing an example of a planar layout of a region including a memory cell array provided in a memory device according to a fourth embodiment.

FIG. 45 is a sectional view showing an example of a sectional structure in the hookup region and the peripheral region of the memory device according to the fourth embodiment, which is taken along a line XLV-XLV in FIG. 44.

FIG. 46 is a plan view showing an example of the planar layout halfway through the manufacturing of the memory device according to the fourth embodiment.

FIG. 47 is a sectional view showing an example of the sectional structure halfway through the manufacturing of the memory device according to the fourth embodiment, which is taken along a line XLVII-XLVII in FIG. 46.

FIG. 48 is a plan view showing an example of the planar layout halfway through the manufacturing of the memory device according to the fourth embodiment.

FIG. 49 is a sectional view showing an example of the sectional structure halfway through the manufacturing of the memory device according to the fourth embodiment, which is taken along a line XLIX-XLIX in FIG. 48.

FIG. 50 is a plan view showing an example of a planar layout of a region including a memory cell array provided in a memory device according to a first modification.

FIG. 51 is a plan view showing an example of a planar layout of a region including a memory cell array provided in a memory device according to a second modification.

DETAILED DESCRIPTION

Figure 8:
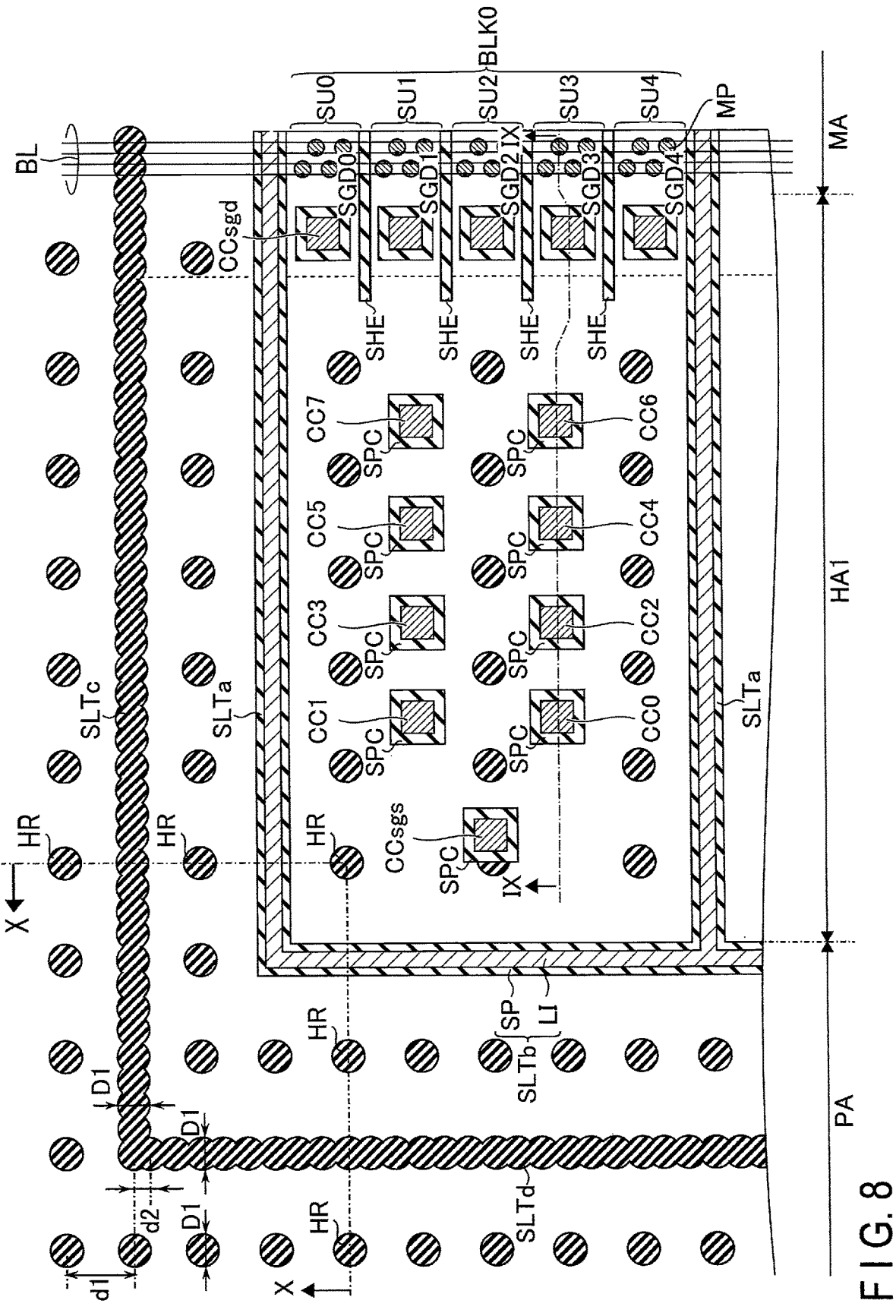
FIG. 8 is a plan view showing an example of a detailed planar layout in a hookup region and a peripheral region of the memory device according to the first embodiment.

In general, according to one embodiment, a memory device includes a first layer stack, a second layer stack, a third layer stack, a memory pillar, a first member, and a second member. The first layer stack includes a plurality of first insulating layers arranged in a first direction and spaced apart from one another. Each of the second layer stack and the third layer stack includes a plurality of conductive layers spaced apart from one another and provided at levels of layers identical to the first insulating layers, respectively, and the second layer stack and the third layer stack are spaced apart from each other. The memory pillar extends in the first direction in the third layer stack, and a portion of the memory pillar that intersects each of the conductive layers functions as a memory cell. The first member is in contact with the first layer stack and the second layer stack between the first layer stack and the second layer stack, and extends in a second direction intersecting the first direction. The second member is in contact with the second layer stack and the third layer stack between the second layer stack and the third layer stack, extends in the second direction, and is arranged beside the first member in a third direction intersecting the first direction and the second direction.

The embodiments will now be described with reference to the drawings. The dimensions, scales, etc., used in the drawings are not binding on actual products.

The description will use the same reference signs for the elements or components having the same or substantially the same functions and configurations. For the purpose of distinguishing between elements having the same or substantially the same configurations, the description may add different characters or numerals after their respective reference signs.

1. First Embodiment 1. 1 Configuration
1. 1. 1 Memory System

FIG. 1 is a block diagram for explaining a configuration of a memory system according to a first embodiment. The memory system 1 here is a storage device adapted for connection with an external host device (not shown). The memory system 1 is, for example, a memory card such as an SD™ card, a universal flash storage (UFS) device, and a solid state drive (SSD). The memory system 1 includes a memory controller 2 and a memory device 3.

The memory controller 2 is formed by, for example, an integrated circuit such as a system-on-a-chip (SoC). The memory controller 2 controls the memory device 3 based on a request from the host apparatus. More specifically, for example, the memory controller 2 writes data requested by the host apparatus to the memory device 3. Also, the memory controller 2 reads out data requested by the host apparatus from the memory device 3 and transmits it to the host apparatus.

The memory device 3 is a memory that stores data in a nonvolatile manner. The memory device 3 is, for example, a NAND-type flash memory.

Communication between the memory controller 2 and the memory device 3 is based on, for example, a single data rate (SDR) interface, a toggle double data rate (DDR) interface, or an open NAND flash interface (ONFI).

1. 1. 2 Memory Device

Hereinafter, an internal configuration of the memory device according to the first embodiment will be described with reference to the block diagram shown in FIG. 1. The memory device 3 includes, for example, a memory cell array 10, a command register 11, an address register 12, a sequencer 13, a driver module 14, a row decoder module 15, and a sense amplifier module 16.

The memory cell array 10 includes a plurality of blocks BLK0 through BLKn (n is an integer equal to or greater than 1). Each block BLK is a set of a plurality of memory cells capable of storing data in a non-volatile manner, and used as, for example, a unit of data erase operation. In addition, the memory cell array 10 is provided with a plurality of bit lines and a plurality of word lines. In one example, each memory cell is associated with one bit line and one word line. The detailed configuration of the memory cell array 10 will be described later.

The command register 11 stores a command CMD received by the memory device 3 from the memory controller 2. The command CMD includes, for example, an instruction for causing the sequencer 13 to execute a read operation, a write operation, an erase operation, or the like.

The address register 12 stores address information ADD received by the memory device 3 from the memory controller 2. The address information ADD includes, for example, a block address BAd, a page address PAd, and a column address CAd. For example, the block address BAd, the page address PAd, and the column address CAd are used to select the block BLK, a word line, and a bit line, respectively.

The sequencer 13 controls the operation of the entire memory device 3. For example, the sequencer 13 controls the driver module 14, the row decoder module 15, the sense amplifier module 16, and the like based on the command CMD stored in the command register 11, thereby executing a write operation, a read operation, an erase operation, and the like.

The driver module 14 generates a voltage to be used in the read operation, the write operation, the erase operation, or the like. Then, the driver module 14 applies the generated voltage to a signal line corresponding to a selected word line based on, for example, the page address PAd stored in the address register 12.

Based on the block address BAd stored in the address register 12, the row decoder module 15 selects one corresponding block BLK in the memory cell array 10. Then, for example, the row decoder module 15 transfers the voltage that has been applied to the signal line corresponding to the selected word line to this selected word line in the selected block BLK.

The sense amplifier module 16 in the write operation applies a desired voltage to each bit line according to write data DAT received from the memory controller 2. Also, the sense amplifier module 16 in the read operation determines data stored in a memory cell based on the voltage of the corresponding bit line and transfers the determination result to the memory controller 2 as read data DAT.

1. 1. 3 Circuit Configuration of Memory Cell Array

FIG. 2 is a circuit diagram showing an example of the circuit configuration of the memory cell array provided in the memory device according to the first embodiment. FIG. 2 shows one block BLK of the plurality of blocks BLK included in the memory cell array 10. As shown in FIG. 2, the block BLK includes, for example, five string units SU0 through SU4.

Each string unit SU includes a plurality of NAND strings NS associated with respective bit lines BL0 through BLm (m is an integer equal to or greater than 1). The NAND strings NS each includes, for example, memory cell transistors MT0 through MT7 and select transistors ST1 and ST2. Each memory cell transistor MT includes a control gate and a charge accumulating film, and stores data in a non-volatile manner. The select transistors ST1 and ST2 are each used for the selection of the applicable string unit SU in various operations.

In each NAND string NS, memory cell transistors MT0 through MT7 are coupled in series. The select transistor ST1 has its drain coupled to an associated bit line BL, and its source coupled to one end of the serially-coupled memory cell transistors MT0 through MT7. The drain of the select transistor ST2 is coupled to the other end of the memory cell transistors MT0 through MT7, which are coupled in series. The select transistor ST2 has its source coupled to a source line SL.

Control gates of the memory cell transistors MT0 through MT7 in the same block BLK are respectively coupled to the word lines WL0 through WL7. Gates of select transistors ST1 in the string units SU0 through SU4 are respectively coupled to the select gate lines SGD0 through SGD4. Gates of the select transistors ST2 are coupled to a select gate line SGS.

The bit lines BL0 through BLm are assigned respective column addresses differing from one another. Each bit line BL is shared by the NAND strings NS having the same column address, over the multiple blocks BLK. The word lines WL0 through WL7 are provided for each block BLK. The source line SL is shared by, for example, the multiple blocks BLK.

A set of the memory cell transistors MT coupled to the common word line WL in one string unit SU is called, for example, a cell unit CU. In one example, the storage capacity of the cell unit CU including the memory cell transistors MT each of which stores 1 bit data is defined as "1 page data". The cell unit CU can have a storage capacity of 2 page data or more in accordance with the number of bits of data to be stored in the memory cell transistors MT.

Note that the circuit configuration of the memory cell array 10 provided in the memory device 3 according to the first embodiment is not limited to the above described configuration. For example, the number of string units SU included in each block BLK can be designed to a desired number. The number of memory cell transistors MT and the number of select transistors ST1 and ST2 included in each NAND string NS may be designed to be a desired number.

1. 1. 4 Structure of Region Including Memory Cell Array

An example of a structure of a region including the memory cell array in the memory device according to the first embodiment will be described below. Note that in the drawings to be referred to below, an X direction corresponds to the extending direction of the word line WL. A Y direction corresponds to the extending direction of the bit line BL. An XY plane corresponds to a surface of a semiconductor substrate 20 used to form the memory device 3. A Z direction corresponds to a direction perpendicular to the XY plane. In the planar views, hatching is appropriately added to make the drawings easier to view. Such hatching is not necessarily related to materials or properties of the hatched objects or components. In the sectional views, components are appropriately omitted to make the drawings easier to view.

1. 1. 4. 1 Overview of Planar Layout

FIG. 3 is a plan view showing an example of a planar layout of the region including the memory cell array provided in the memory device according to the first embodiment. FIG. 3 shows a rectangular core region CA corresponding to the memory cell array 10, and a peripheral region PA surrounding the core region CA.

The core region CA is, for example, divided into a memory region MA and hookup regions HA1 and HA2 sandwiching the memory region MA in the X direction. The memory region MA includes the plurality of NAND strings NS. Each of the hookup regions HA1 and HA2 is a region used for connecting between a stacked interconnect (for example, the word lines WL0 through WL7 and the select gate lines SGD and SGS) and the row decoder module 15.

A stacked interconnect structure LSb is provided in the core region CA and a part of the peripheral region PA. A stacked structure LSa spreading to surround the stacked interconnect structure LSb on the XY plane is provided in the peripheral region PA. A plurality of members SLTa, two members SLTb, and a plurality of members SHE are provided in the core region CA. Two members SLTc and two members SLTd are provided in the peripheral region PA.

The stacked structure LSa has a structure in which a plurality of sacrificial layers (not shown) respectively corresponding to the word lines WL and the select gate lines SGD and SGS are stacked in the Z direction with an insulating layer interposed between neighboring sacrificial layers.

The stacked interconnect structure LSb has a structure in which the sacrificial layers in the stacked structure LSa have been replaced by a plurality of interconnect layers (not shown). Each of the interconnect layers corresponds to any one of the word lines WL and the select gate lines SGD and SGS.

The members SLTa are plate-shaped insulators spreading along, for example, an XZ plane. The members SLTa are arranged in the Y direction at a distance L1. Each of the members SLTa extends in the X direction in a boundary region between the neighboring blocks BLK so as to traverse the memory region MA and the hookup regions HA1 and HA2. Each of the members SLTa is in contact with the stacked interconnect structure LSb and penetrates the stacked interconnect structure LSb in the Z direction.

The two members SLTb are plate-shaped insulators spreading along, for example, a YZ plane. The two members SLTb are arranged in the X direction. Each of the two members SLTb extends in the Y direction so as to traverse the blocks BLK0 through BLKn. Each of the two members SLTb is in contact with the stacked interconnect structure LSb and penetrates the stacked interconnect structure LSb in the Z direction.

One of the two members SLTb is in contact with a first end of each of the plurality of members SLTa. The other of the two members SLTb is in contact with a second end of each of the plurality of members SLTa. The two members SLTb and the plurality of members SLTa can be regarded as a single continuous insulator. The two members SLTb and the plurality of members SLTa separate the stacked interconnect structure LSb into (n+1) portions corresponding to the (n+1) blocks BLK0 through BLKn and a portion surrounding the (n+1) portions.

The two members SLTa located at both ends of the plurality of members SLTa and the two members SLTb are located at a boundary region between the core region CA and the peripheral region PA. Thus, the two members SLTa located at both ends of the plurality of members SLTa and the two members SLTb surround the core region CA and separate the core region CA from the peripheral region PA.

The plurality of members SHE are plate-shaped insulators spreading along, for example, the XZ plane. The plurality of members SHE are arranged in the Y direction.

In the example of FIG. 3, four members SHE are arranged between neighboring members SLTa. Each of the members SHE extends in the X direction so as to traverse the memory region MA. Here, the ends of each of the members SHE are located in the hookup areas HA1 and HA2, respectively. Each of the members SHE separates an interconnect layer corresponding to the select gate line SGD out of the stacked interconnect structure LSb into two portions arranged in the Y direction.

The two members SLTc are plate-shaped insulators spreading along, for example, the XZ plane in the peripheral region PA. The two members SLTc are arranged in the Y direction so as to sandwich the members SLTa. The two members SLTc are arranged on both sides of the interconnect layers of the stacked interconnect structure LSb in the Y direction to sandwich the interconnect layers. The length of the two members SLTc in the X direction is longer than that of the members SLTa in the X direction. A distance L2 between neighboring members SLTc and SLTa is shorter than a distance L1 between neighboring members SLTa.

The two members SLTd are plate-shaped insulators spreading along, for example, the YZ plane in the peripheral region PA. The two members SLTd are arranged in the X direction so as to sandwich the two members SLTb. The length of the two members SLTd in the Y direction is longer than that of the two members SLTb in the Y direction. A distance L3 between neighboring members SLTd and SLTb is shorter than the distance L1 between neighboring members SLTa. One of the two members SLTd is in contact with a first end of each of the two members SLTc. The other of the two members SLTd is in contact with a second end of each of the two members SLTc. The two members SLTd and the two members SLTc can be regarded as a single continuous insulator surrounding the plurality of members SLTa and the two members SLTb.

Each of the two members SLTc is provided between the stacked interconnect structure LSb and the stacked structure LSa so as to be in contact with the stacked interconnect structure LSb and the stacked structure LSa. Each of the two members SLTd is provided between the stacked interconnect structure LSb and the stacked structure LSa so as to be in contact with the stacked interconnect structure LSb and the stacked structure LSa. Thus, the two members SLTc and the two members SLTd surround the stacked interconnect structure LSb and separate the stacked structure LSa from the stacked interconnect structure LSb.

According to the planar layout of a region including the memory cell array 10 described above, each of the portions surrounded by the plurality of members SLTa and the two members SLTb corresponds to one block BLK. In addition, each of the regions separated by the members SLTa and SHE corresponds to one string unit SU.

Note that the memory cell array 10 included in the memory device 3 according to the embodiment is not limited to the planar layout described above. For example, the number of members SHE provided between the neighboring members SLTa may be designed in line with a desired number. The number of string units SU formed between the neighboring members SLTa may be changed according to the number of members SHE provided between these members SLTa.

1. 1. 4. 2 Memory Region
(Planar Layout)

FIG. 4 is a plan view showing an example of a detailed planar layout in the memory region MA of the memory device according to the first embodiment. FIG. 4 shows a region including one block BLK (that is, the string units SU0 through SU4), and two members SLTa that sandwich the block BLK. As shown in FIG. 4, in the memory region MA, the memory cell array 10 includes a plurality of memory pillars MP, a plurality of contacts CV, and a plurality of bit lines BL. Each member SLTa includes a contact LI and spacers SP.

The memory pillars MP each function as, for example, an individual NAND string NS. The memory pillars MP are arranged in, for example, twenty-four staggered rows between two neighboring members SLTa. Here, in one example, the memory pillars MP in the fifth, tenth, fifteenth, and twentieth rows from the top (with reference to the figure) each overlap with one member SHE.

The plurality of bit lines BL each extend in the Y direction, and are arranged in the X direction. Each bit line BL is arranged to overlap at least one memory pillar MP in each string unit SU. In the example shown in FIG. 4, two bit lines BL overlap one memory pillar MP. One bit line BL of the plurality of bit lines BL overlapping the memory pillars MP and one corresponding memory pillar MP are electrically coupled via a contact CV.

In one example, there is no contact CV between each memory pillar MP in contact with the member SHE and the bit lines BL. In other words, the contacts CV between the bit lines BL and the memory pillars MP in contact with two different select gate lines SGD are omitted. The numbers and arrangements of memory pillars MP, members SHE, and the like between the neighboring members SLTa are not limited to the configuration described with reference to FIG. 4 and can appropriately be changed. The number of bit lines BL overlapping each memory pillar MP can be designed to a desired number.

The contact LI is a conductor extending along the XZ plane. The spacers SP are insulators provided on the respective side surfaces of the contact LI. In other words, the contact LI is surrounded by the spacers SP in a planar view.
(Sectional Structure)

FIG. 5 is a sectional view showing an example of a sectional structure in the memory region MA of the memory device according to the first embodiment, which is taken along a line V-V in FIG. 4. As shown in FIG. 5, the memory cell array 10 further includes a semiconductor substrate 20, conductive layers 21 through 26, and insulating layers 31 through 36. FIG. 6 is an enlarged view of a region VI in FIG. 5, showing an example of a sectional structure of a memory pillar in the memory device according to the first embodiment.

The semiconductor substrate 20 is, for example, a P-type semiconductor. The insulating layer 31 is provided on the upper surface of the semiconductor substrate 20. The semiconductor substrate 20 and the insulating layer 31 include circuits (not shown). The circuits included in the semiconductor substrate 20 and the insulating layer 31 correspond to the row decoder module 15, the sense amplifier module 16, and the like. The conductive layer 21 is provided on the upper surface of the insulating layer 31.

The conductive layer 21 is, for example, a plate-shaped conductor spreading along the XY plane. The conductive layer 21 is used as the source line SL. The conductive layer 21 contains, for example, silicon doped with phosphorus.

The insulating layer 32 and the conductive layer 22 are stacked in this order on the upper surface of the conductive layer 21. In one example, the conductive layer 22 is formed in a plate shape spreading along the XY plane. The conductive layer 22 serves as the select gate line SGS. The conductive layer 22 contains, for example, tungsten. The insulator layer 32 contains, for example, silicon oxide.

The insulating layers 33 and the conductive layers 23 are alternately stacked in this order on the upper surface of the conductive layer 22. In one example, each conductive layer 23 is formed in a plate shape spreading along the XY plane. The stacked conductive layers 23 serve as the word lines WL0 through WL3, respectively, in the order from the side of the semiconductor substrate 20. The conductive layers 23 contain, for example, tungsten. The insulating layers 33 contain, for example, silicon oxide.

The insulating layers 34 and the conductive layers 24 are alternately stacked in this order on the upper surface of the uppermost conductive layer 23. In one example, each conductive layer 24 is formed in a plate shape spreading along the XY plane. The stacked conductive layers 24 serve as the word lines WL4 through WL7, respectively, in the order from the side of the semiconductor substrate 20. The conductive layers 24 contain, for example, tungsten. The insulating layers 34 contain, for example, silicon oxide.

The conductive layer 25 is provided above the upper surface of the uppermost conductive layer 24 with the insulating layer 35 interposed therebetween. In one example, the conductive layer 25 is formed in a plate shape spreading along the XY plane. The conductive layer 25 serves as the select gate line SGD. The conductive layer 25 contains, for example, tungsten. The insulating layer 35 contains, for example, silicon oxide.

The conductive layer 26 is provided above the upper surface of the conductive layer 25 with the insulating layer 36 interposed therebetween. In one example, the conductive layer 26 is formed in a line shape extending in the Y direction and serves as the bit line BL. That is, a plurality of conductive layers 26 are arranged in the X direction in a region that is not shown in the drawings. The conductive layers 26 contain, for example, copper. The insulating layer 36 covers the portion above the conductive layers 26. The insulating layer 36 contains, for example, silicon oxide.

The memory pillars MP each extend in the Z direction and each include an upper pillar UMP and a lower pillar LMP. The lower pillar LMP penetrates through the conductive layers 22 and 23. The upper pillar UMP penetrates through the conductive layers 24 and 25. The lower pillar LMP has its lower end in contact with the conductive layer 21. The upper end of the lower pillar LMP and the lower end of the upper pillar UMP contact each other at a level between the uppermost conductive layer 23 and the lowermost conductive layer 24. Each of the lower pillar LMP and the upper pillar UMP increases the area of the cross-section taken along the XY plane (hereinafter, an "XY sectional area"), from the lower portion toward the upper portion. The XY sectional area of the lower pillar LMP at its upper end is larger than the XY sectional area of the upper pillar UMP at its lower end. The lower pillar LMP has a side surface LMP s and the upper pillar UMP has a side surface UMP s, the former and the extension of the latter (indicated by the dashed-dotted lines in FIG. 6) being displaced from each other and not in conformity to each other. Such a displacement between the side surface LMP s of the lower pillar LMP and the extension of the side surface UMP s of the upper pillar UMP is present not only in a YZ cross section shown in FIG. 6 but also in any cross section that includes the Z direction.

A portion where the memory pillar MP and the conductive layer 22 intersect each other functions as the select transistor ST2. A portion where the memory pillar MP and one conductive layer 23 or one conductive layer 24 intersect each other functions as one memory cell transistor MT. A portion where the memory pillar MP and the conductive layer 25 intersect each other functions as the select transistor ST1.

The memory pillars MP each include, for example, a core film 40, a semiconductor film 41, and a stacked film 42. The core film 40 extends in the Z direction. For example, an upper end of the core film 40 is included in a layer above the conductive layer 25, and a lower end of the core film 40 is included in a layer between the conductive layer 21 and the conductive layer 22. The semiconductor film 41 covers the circumference of the core film 40. A part of the semiconductor film 41 is in contact with the conductive layer 21 at a lower portion of the memory pillar MP. The stacked film 42 covers the side surface and the bottom surface of the semiconductor film 41 except a portion where the semiconductor film 41 and the conductive layer 21 are in contact. The core film 40 contains, for example, an insulator such as silicon oxide. The semiconductor film 41 contains, for example, silicon.

A columnar contact CV is provided on the upper surface of the semiconductor film 41 in the memory pillar MP. In the region shown in the figure, there are two memory pillars MP in each of the sectional regions separated by the members SLTa and SHE, with one contact CV corresponding to one of the two memory pillars MP. In the memory region MA, the memory pillar MP that does not overlap the member SHE and is not coupled to the contact CV in the figure is coupled to the corresponding contact CV in a certain region (not shown).

Each contact CV is in contact with, at its upper surface, one conductive layer 26, i.e., one bit line BL. One conductive layer 26 is in contact with one contact CV for each of the regions separated by the members SLTa and SHE. That is, the memory pillar MP provided between the neighboring members SLTa and SHE and the memory pillar MP provided between the two neighboring members SHE are electrically coupled to each conductive layer 26.

The member SLTa penetrates the conductive layers 22 through 25. The contact LI in the member SLTa is provided along the spacers SP. The contact LI has its upper end located in the layer between the conductive layers 25 and 26. The contact LI has its lower end in contact with the conductive layer 21. The spacers SP are each disposed between the contact LI and the conductive layers 22 through 25. By the presence of the spacers SP, the contact LI is separated and insulated from the conductive layers 22 through 25.

The member SHE separates the conductive layer 25. The member SHE has its upper end located in the layer between the conductive layers 25 and 26. The member SHE has its lower end located in the layer between the uppermost conductive layer 24 and the conductive layer 25. The member SHE contains, for example, an insulator such as silicon oxide. The upper end of the member SHE and the upper end of the member SLT may be either aligned or not aligned with each other. Also, the upper end of the member SHE and the upper end of the memory pillar MP may be either aligned or not aligned each other. The number of the conductive layers 22 to 25 may be discretionarily set. For example, if a plurality of conductive layers 25 are provided, the lower end of the member SHE is located between the uppermost conductive layer 24 and the lowermost conductive layer 25. Thus, the location of the lower end of the member SHE deepens according to the increase in number of the conductive layers 25.

FIG. 7 is a sectional view showing an example of the sectional structure of the memory pillar in the memory device according to the first embodiment, which is taken along a line VII-VII in FIG. 5. More specifically, FIG. 7 shows the sectional structure of the memory pillar MP in a layer that is parallel to the XY plane and includes the conductive layer 23. As shown in FIG. 7, the stacked film 42 includes, for example, a tunnel insulating film 43, a charge accumulating film 44, and a block insulating film 45.

In the cross section including the conductive layer 23, the core film 40 is provided, for example, at the center of the memory pillar MP. The semiconductor film 41 surrounds the side surface of the core film 40. The tunnel insulating film 43 surrounds the side surface of the semiconductor film 41. The charge accumulating film 44 surrounds the side surface of the tunnel insulating film 43. The block insulating film 45 surrounds the side surface of the charge accumulating film 44. The conductive layer 23 surrounds the side surface of the block insulating film 45.

The semiconductor film 41 is used as the channels (current paths) of the memory cell transistors MT0 through MT7 and the select transistors ST1 and ST2. Each of the tunnel insulating film 43 and the block insulating film 45 contains, for example, silicon oxide. The charge accumulating film 44 has a function of accumulating electric charges and contains, for example, silicon nitride. With these components, the memory pillars MP are each capable of functioning as one NAND string NS.

1. 1. 4. 3 Hookup Region and Peripheral Region (Planar Layout)

In the memory device 3 according to the first embodiment, an even-numbered block BLK in the hookup region HA1 and an odd-numbered block BLK in the hookup region HA2 are similar in structure. Also, an even-numbered block BLK in the hookup region HA2 and an odd-numbered block BLK in the hookup region HA1 are similar in structure.

In more concrete terms, for example, the block BLK0 in the hookup region HA2 has a planar layout similar to a reverse layout of the block BLK1 in the hookup region HA1 in which the structures of the block BLK1 are turned over in each of the X and Y directions. The block BLK1 in the hookup region HA2 has a planar layout similar to a reverse layout of the block BLK0 in the hookup region HA1 in which the structures of the block BLK0 are turned over in each of the X and Y directions.

FIG. 8 is a plan view showing an example of a detailed planar layout in a hookup region and a peripheral region of the memory device according to the first embodiment. What is shown in FIG. 8 covers a portion corresponding to the block BLK0 in the hookup region HA1, and also a part of the neighboring peripheral region PA and memory region MA. As shown in FIG. 8, the hookup region HA1 includes a plurality of contacts CCsgs, CC0 through CC7, and CCsgd. The hookup region HA1 and the peripheral region PA include a plurality of support pillars HR.

In the hookup region HA1, the stacked interconnect structure LSb includes a portion where the select gate line SGS and the word lines WL0 through WL7 do not overlap the select gate line SGD in the Z direction. The select gate line SGS and the word lines WL0 through WL7 overlap each other as viewed from the Z direction, even in the portion where they do not overlap the select gate line SGD. Thus, there is a step between the word line WL7 and the select gate line SGD. There is no step between the select gate line SGS and the word line WL0, between the word lines WL0 and WL1, between the word lines WL1 and WL2, between the word lines WL2 and WL3, between the word lines WL3 and WL4, between the word lines WL4 and WL5, between the word lines WL5 and WL6, and between the word lines WL6 and WL7.

In a portion where the hookup region HA1 and the block BLK0 overlap, the contacts CCsgd are respectively provided on the select gate lines SGD0 through SGD4. In a portion where the hookup region HA1 and the block BLK0 overlap, the contacts CCsgs and CC0 through CC7 are provided on a portion of the stacked interconnect structure LSb that does not overlap the select gate lines SGD0 to SGD4. A spacer SPC is provided between the stacked interconnect structure LSb and each of the contacts CCsgs, CC0 through CC7, and CCsgd.

The select gate line SGS, the word lines WL0 through WL7, and the select gate lines SGD0 through SGD4 are electrically coupled to the row decoder module 15 via the corresponding contacts CCsgs, CC0 through CC7, and CCsgd, respectively. In other words, a voltage is applied to each of the select gate line SGS, the word lines WL0 through WL7, and the select gate lines SGD0 through SGD4 via, for example, the contact CC provided in either of the hookup region HA1 or the hookup region HA2. Note that the contact CC may be coupled to each interconnect layer in each of the hookup region HA1 and the hookup region HA2. In such a structure, voltages are applied to, for example, a word line WL from both of the contact CC in the hookup region HA1 and the contact CC in the hookup region HA2.

The member SLTb is the same in structure as the member SLTa. On the other hand, the members SLTc and SLTd are different in structure from the members SLTa and SLTb. The member SLTb includes the contact LI and the spacers SP. The members SLTc and SLTd do not include a contact LI and embedded with insulating film.

The width of the members SLTa and SLTb is substantially uniform, whereas the width of the members SLTc and SLTd is varied. More specifically, as viewed from the Z direction, the members SLTc and SLTd have a shape formed of a plurality of circles that overlap each other and are arranged in the X and Y directions, respectively.

The support pillars HR are arranged suitably in the hookup region HA1 and the peripheral region PA in a region excluding the portions where the members SLTa, SLTb, SLTc, and SLTd, the contacts CCsgs, CC0 through CC7, and CCsgd are formed.

A diameter D1 of the support pillars HR that are located at the same level as the conductive layers 22 through 24 is, for example, substantially equal to a diameter D1 of the circles that constitute each of the members SLTc and SLTd at the same level as the conductive layers 22 through 24. A distance d1 between the neighboring support pillars HR is longer than the diameter D1. A distance d2 between the adjacent two of the circles constituting each of the members SLTc and SLTd is shorter than the diameter D1.

(Sectional Structure)

FIG. 9 is a sectional view showing an example of a sectional structure in the hookup region and the memory region of the memory device according to the first embodiment, which is taken along a line IX-IX in FIG. 8.

As shown in FIG. 9, the hookup region HA1 includes a plurality of conductive layers 27. The conductive layer 25 corresponding to the select gate line SGD is provided to form a step with respect to the conductive layer 22 corresponding to the select gate line SGS and the plurality of conductive layers 23 and 24 corresponding to the word lines WL. An insulating layer 37 is provided at the same level as the conductive layer 25 and in a region where the conductive layer 25 is not provided. The insulating layer 37 contains, for example, silicon oxide.

The contacts CCsgs, CC0 through CC7, and CCsgd are provided to be in contact with the upper surfaces of the select gate line SGS, the word lines WL0 through WL7, and the select gate line SGD, respectively. The spacer SPC is provided between each of the contacts CCsgs, CC0 through CC7, and CCsgd and an interconnect layer intersecting therewith. The spacer SPC separates and insulates each of the contacts CCsgs, and CC0 through CC7 from the intersecting interconnect layer.

A conductive layer 27 is provided on an upper surface of each of the contacts CCsgs, CC0 through CC7, and CCsgd. Each conductive layer 27 is electrically coupled to the row decoder module 15 and located, for example, at the level of a layer identical to the conductive layer 26. Accordingly, each of the conductive layers 22 through 25 is electrically coupled to the row decoder module 15 via the corresponding contact CC and conductive layer 27. Here, each of the conductive layers 22 through 25 may be electrically coupled to the row decoder module 15 using a further intervening connection by one or more conductive layers (not shown) provided at the level higher than the conductive layers 27.

FIG. 10 is a sectional view showing an example of a sectional structure in the hookup region and the peripheral region of the memory device according to the first embodiment, which is taken along a line X-X in FIG. 8.

As shown in FIG. 10, a range inside the two members SLTc and the two members SLTd in the peripheral region PA includes the stacked interconnect structure LSb, in the same manner as in the hookup region HA1. Specifically, within a range inside the two members SLTc and the two members SLTd in the peripheral region PA, the conductive layers 22 through 24 are stacked with the insulating layers 33 and 34 interposed, in the same manner as in the hookup region HA1. On the other hand, a region outside the two members SLTc and the two members SLTd in the peripheral region PA includes the stacked structure LSa. Specifically, in the region outside the two members SLTc and the two members SLTd in the peripheral region PA, sacrificial layers 51 through 53 are stacked with the insulating layers 33 and 34 interposed. The sacrificial layers 51 through 53 contain, for example, silicon nitride (SiN).

As described above, the support pillars HR extending in the Z direction are provided in both the hookup region HA1 and the peripheral region PA. Each support pillar HR has a structure in which an insulator is embedded. The support pillar HR penetrates the stacked interconnect structure LSb or the stacked structure LSa.

Each support pillar HR includes an upper pillar UHR and a lower pillar LHR. The lower end of the lower pillar LHR is in contact with the conductive layer 21. The upper end of the lower pillar LHR and the lower end of the upper pillar UHR penetrating the stacked interconnect structure LSb are in contact with each other at a level between the uppermost conductive layer 23 and the lowermost conductive layer 24. The upper end of the support pillar HR is, for example, aligned with the upper end of the memory pillar MP. The upper end of the lower pillar LHR and the lower end of the upper pillar UHR penetrating the stacked structure LSa are in contact with each other at a level between the uppermost sacrificial layer 52 and the lowermost sacrificial layer 53.

The lower pillar LHR and the upper pillar UHR increase their respective XY sectional areas from the lower portion toward the upper portion. Also, the XY sectional area of the lower pillar LHR at its upper end is larger than the XY sectional area of upper pillar UHR at its lower end. The side surface of the lower pillar LHR and the extension of the side surface of the upper pillar UHR are displaced from, and not in conformity to, each other in a cross section including the Z direction.

Each of the members SLTc and SLTd has a structure in which an insulator is embedded. The members SLTc and SLTd are provided between the stacked interconnect structure LSb and the stacked structure LSa.

The member SLTc includes an upper member USTc and a lower member LSTc. The member SLTd includes an upper member USTd and a lower member LSTd. The lower end of each of the lower members LSTc and LSTd is in contact with the conductive layer 21. The upper end of the lower member LSTc and the lower end of the upper member USTc are in contact with each other, and the upper end of the lower member LSTd and the lower end of the upper member USTd are in contact with each other at a level between the uppermost conductive layer 23 (or sacrificial layer 52) and the lowermost conductive layer 24 (or sacrificial layer 53). The upper ends of the upper members USTc and USTds are, for example, aligned with the upper end of the support pillar HR.

The YZ cross-sectional shape of the member SLTc and the XZ cross-sectional shape of the member SLTd are substantially equal to the cross-sectional shape of the support pillar HR including the Z direction. The side surface of the lower member LSTc and the extension of the side surface of the upper member USTc are displaced from, and not in conformity to, each other in the YZ cross section. The side surface of the lower member LSTd and the extension of the side surface of the upper member USTd are displaced from, and not in conformity to, each other in the XZ cross section.

1. 2 Manufacturing Method of Memory Device

Figure 17:
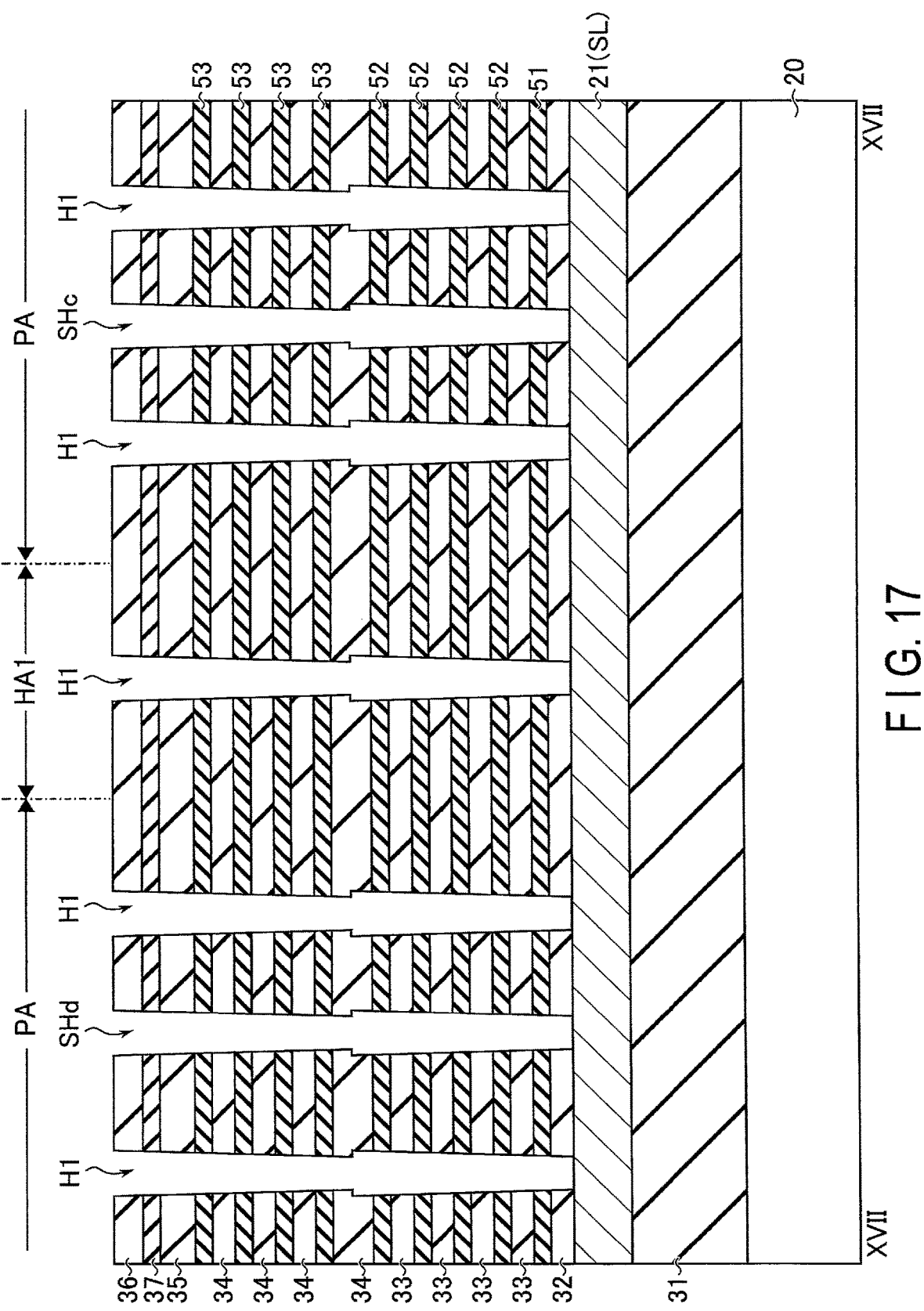
FIG. 17 is a sectional view showing an example of the sectional structure halfway through the manufacturing of the memory device according to the first embodiment, which is taken along a line XVII-XVII in FIG. 16.

Each of FIGS. 11 to 24 shows an example of the planar layout or the sectional structure halfway through the manufacturing of the memory device according to the first embodiment. The planar layout shown in the drawings represents the region corresponding to FIG. 8. The sectional structures shown in the drawings represent the region corresponding to FIG. 10. Of the sectional structures shown, FIG. 13 is a sectional view taken along line XIII-XIII in FIG. 12. FIG. 15 is a sectional view taken along the line XIX-XIX indicated in FIG. 14. FIG. 17 is a sectional view taken along the line XVII-XVII indicated in FIG. 16. FIG. 19 is a sectional view taken along the line XIX-XIX indicated in FIG. 18. FIG. 22 is a sectional view taken along the line XXII-XXII indicated in FIG. 21. An example of a process of manufacturing the stacked structure LSa and the stacked interconnect structure LSb in the memory device 3 will now be explained.

Figure 11:
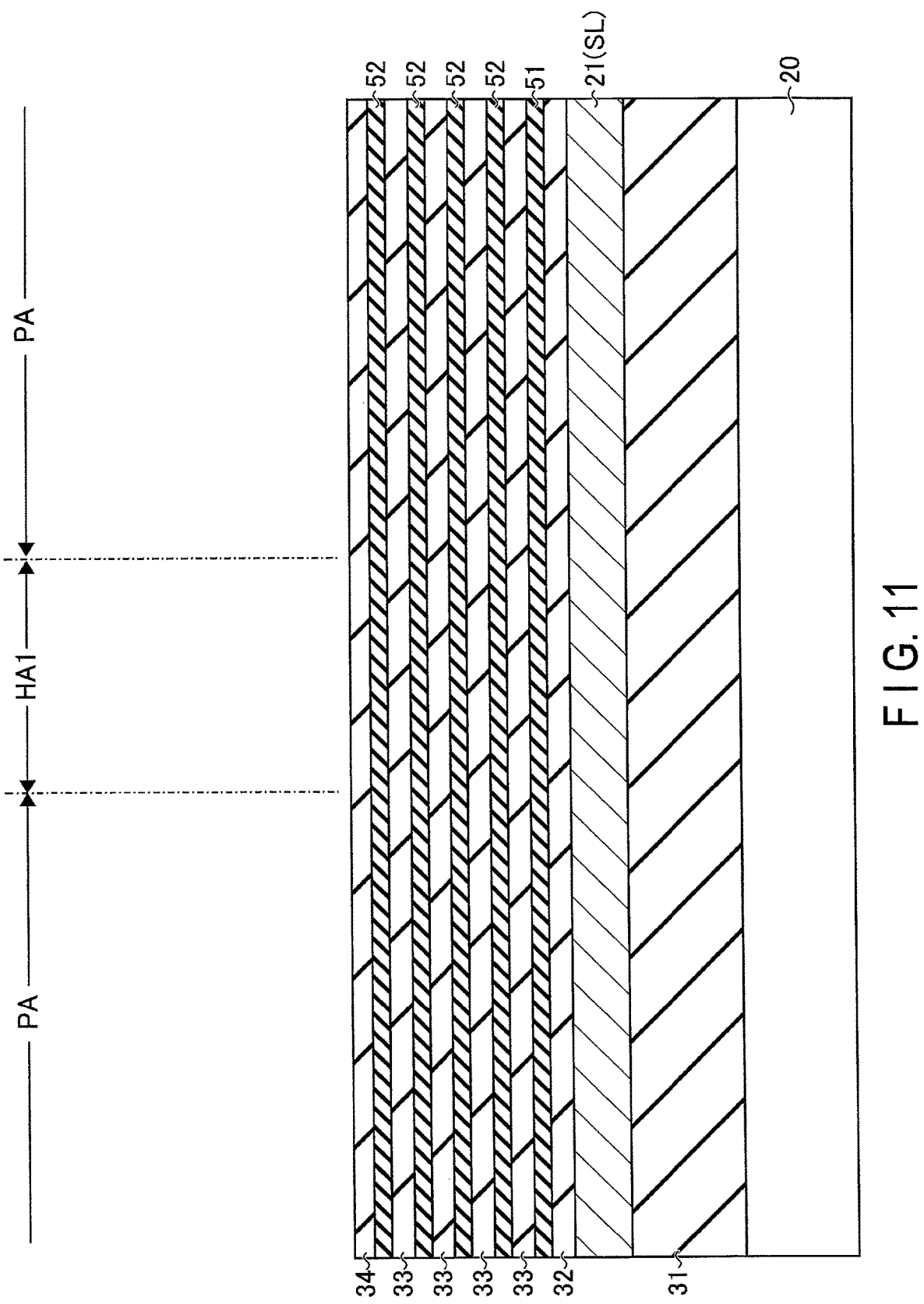
FIG. 11 is a sectional view showing an example of the sectional structure halfway through the manufacturing of the memory device according to the first embodiment.

First, as shown in FIG. 11, the insulating layer 31 is formed on the upper surface of the semiconductor substrate 20. The conductive layer 21 is formed on the upper surface of the insulating layer 31. The insulating layer 32 and the sacrificial layer 51 are stacked in this order on the upper surface of the conductive layer 21. The insulating layers 33 and the sacrificial layers 52 are alternately stacked on the upper surface of the sacrificial layer 51. The insulator layer 34 is formed on the upper surface of the uppermost sacrificial layer 52.

Next, as shown in FIGS. 12 and 13, a mask that opens in portions corresponding to the lower pillars LMP and LHR, and the lower members LSTc and LSTd is formed by photolithography or the like. Then, anisotropic etching is performed with the mask, so that a plurality of holes LH0 and LH1, two slits LSHc, and two slits LSHd, each penetrating, for example, the insulating layers 32, 33, and 34 and sacrificial layers 51 and 52, are formed. Parts of the conductive layer 21 are exposed at the respective bottoms of the plurality of holes LH0 and LH1, the two slits LSHc, and the two slits LSHd. The plurality of holes LH0 and LH1, the two slits LSHc, and the two slits LSHd respectively correspond to the plurality of lower pillars LMP and LHR, the two lower members LSTc, and the two lower members LSTd. The two slits LSHc and the two slits LSHd are formed as to have a continuous slit shape.

As viewed from the Z direction, the slits LSHc and LSHd have a shape formed of a plurality of circles that overlap each other and are arranged in the X and Y directions, respectively. A diameter D0 of the holes LH1, that are at the same level as the sacrificial layers 51 and 52, is substantially equal to a diameter D0 of the circles that constitute each of the slits LSHc and LSHd at the same level as the sacrificial layers 51 and 52, and shorter than the diameter D1 of the support pillars HR at the same level. A distance between the two adjacent holes LH1 is substantially equal to a distance d1 between the two adjacent support pillars HR. A distance between the two adjacent circles constituting each of the slits LSHc and LSHd is substantially equal to a distance d2 between the two adjacent circles constituting each of the members SLTc and SLTd, and shorter than the diameter D0.

Next, as shown in FIGS. 14 and 15, the plurality of holes LH0 and LH1, the two slits LSHc, and the two slits LSHd are embedded with a sacrificial member SM1. Then, the insulating layers 34 and the sacrificial layers 53 are alternately stacked on the upper surface of the stacked structure. An insulating layer 35 and a sacrificial layer are stacked in this order on the upper surface of the uppermost sacrificial layer 53. The sacrificial layer is removed except for the memory region MA, and a portion of the hookup regions HA1 and HA2 where the contact CCsgd is to be formed. An insulating layer 37 is formed on the upper surface of the insulating layer 35 that is exposed in the portion where the sacrificial layer has been removed. Then, the insulating layer 36 is formed on the upper surface of the sacrificial layer and the insulating layer 37.

Next, as shown in FIGS. 16 and 17, a mask that opens in portions corresponding to the plurality of upper pillars UMP and UHR, and the two upper members USTc and the two upper members USTd is formed by photolithography or the like. Then, anisotropic etching of the stacked structure is performed with the mask, so that the sacrificial member SM1 embedded in each of the plurality of holes LH0 and LH1, the two slits LSHc, and the two slits LSHd is exposed. The sacrificial member SM1 is removed by, for example, wet etching or the like. As a result, the plurality of holes H0 and H1, two slits SHc, and two slits SHd respectively corresponding to the plurality of memory pillars MP, the plurality of support pillars HR, the two members SLTc, and the two members SLTd are formed. The two slits SHc and the two slits SHd are formed as to have a continuous slit shape.

When the sacrificial member SM1 is removed, the diameter of the holes H1 that are at the same level as the sacrificial layers 51, 52, and 53 is increased from D0 to D1. Similarly, the diameter of the circles constituting the slits SHc and SHd that are at the same level as the sacrificial layers 51, 52, and 53 is increased from D0 to D1. Since the increase in diameter from D0 to D1 is minimal relative to the distance d1, the adjacent holes H1 do not overlap as viewed from the Z direction.

Next, as shown in FIGS. 18 and 19, the plurality of memory pillars MP, the plurality of support pillars HR, the two members SLTc, and the two members SLTd are formed. Specifically, first, resist is formed to cover the plurality of holes H1, the two slits SHc, and the two slits SHd. Then, a block insulating film 45, a charge accumulating film 44, and a tunnel insulating film 43 are formed in this order on the side and bottom surfaces within each hole H0. A part of the block insulating film 45, the charge accumulating film 44, and the tunnel insulating film 43 located at the bottom of the hole H0 is then removed, and the semiconductor film 41 and the core film 40 are formed in the hole H0. A part of the core film 40 at the upper end of each hole H0 is removed, and the semiconductor film 41 is formed in the space created by the removal. Accordingly, a structure corresponding to the memory pillar MP is formed in each hole H0. Thereafter, the resist covering the plurality of holes H1, the two slits SHc, and the two slits SHd is removed. The plurality of holes H1, the two slits SHc, and the two slits SHd are simultaneously embedded with an insulator. As a result, the plurality of support pillars HR, the two members SLTc, and the two members SLTd are formed.

Next, as shown in FIG. 20, a structure corresponding to the contacts CCsgs, CC0 through CC7, and CCsgd is formed. More specifically, a mask that opens in portions corresponding to the contacts CCsgs, CC0 through CC7, and CCsgd is formed by photolithography or the like. Then, anisotropic etching of the stacked structure is performed with the mask, so that a hole (not shown) penetrating a sacrificial layer above the corresponding sacrificial layer is formed. At the bottom of each hole, the insulating layer on the upper surface of the corresponding sacrificial layer is exposed. Then, the spacer SPC and a sacrificial member SM2 are sequentially embedded in each hole.

Next, as shown in FIGS. 21 and 22, a plurality of slits SHa and two slits SHb are formed. More specifically, first, a mask that opens in portions corresponding to the plurality of members SLTa and the two slits SLTb is formed by photolithography or the like. Then, anisotropic etching is performed with the mask, so that the plurality of slits SHa and the two slits SHb, each penetrating, for example, the insulating layers 32, 33, 34, 35, and 36 and the sacrificial layers 51, 52, and 53, and the insulating layer 37 or the sacrificial layer in the same level, are formed. The plurality of slits SHa and the two slits SHb are formed as to have a continuous slit shape.

Next, a replacement process is performed on the sacrificial layers 51, 52, 53, and the like in a portion surrounded by the two members SLTc and the two members SLTd as shown in FIG. 23, thereby forming the stacked interconnect structure LSb. Specifically, first, the sacrificial layers 51, 52, 53, and the like in the portion surrounded by the two members SLTc and the two members SLTd are selectively removed by wet etching using heated phosphoric acid via the plurality of slits SHa and two slits SHb. Then, a conductor is placed to fill each space created by the removal of the sacrificial layers 51, 52, 53, and the like via the plurality of slits SHa and the two slits SHb. For example, chemical vapor deposition (CVD) is used for the formation of the conductor in this step.

Thereafter, the conductor formed inside each of the plurality of slits SHa and the two slits SHb is removed by etch-back processing so that the conductors formed in the adjacent interconnect layers are separated from each other.

This forms the conductive layer 22 functioning as the select gate line SGS, the plurality of conductive layers 23 respectively functioning as the word lines WL0 through WL3, the plurality of conductive layers 24 respectively functioning as the word lines WL4 through WL7, and the plurality of conductive layers 25 respectively functioning as the select gate lines SGD. Note that the conductive layers 22 to 25 formed in this step may include barrier metal. In this case, the formation of the conductors after the removal of the sacrificial layers 51, 52, 53, and the like may involve formation of films using titanium nitride as the barrier metal, followed by the formation of tungsten.

On the other hand, the sacrificial layers 51, 52, and 53 outside the portion surrounded by the two members SLTc and the two members SLTd are not replaced by the conductor through the replacement process described above. Accordingly, the stacked structure LSa different from the stacked interconnect structure LSb is provided outside the portion surrounded by the two members SLTc and the two members SLTd.

After the removal of the sacrificial layers 51, 52, 53, and the like, a layer containing a metal oxide, such as an aluminum oxide, may be formed prior to the formation of a conductor such as tungsten or titanium nitride. In this case, a layer containing the metal oxide is formed on peripheral surfaces of the conductive layers 22 through 25 in the stacked interconnect structure Lsb. The layer containing the metal oxide is also formed on the side surfaces of the conductive layers 22 through 25 adjacent to the two members SLTc and the two members SLTd. In other words, in the stacked interconnect structure LSb having a structure in which the sacrificial layers 51 through 53 and the like in the stacked structure LSa are replaced by a plurality of interconnect layers, a plurality of interconnect layers may be formed so that the layer containing the metal oxide is in contact with the two members SLTc and the two members SLTd.

Next, as shown in FIG. 24, the plurality of members SLTa and the two members SLTb are formed within the plurality of slits SHa and the two slits SHb, respectively. Specifically, first, insulating portions (spacers SP) are formed so as to cover side surfaces and bottom surfaces of the plurality of slits SHa and the two slits SHb. The spacers SP provided on the bottom portions of the plurality of slits SHa and the two slits SHb are partially removed, and a part of the conductive layer 21 at the bottom portion of each of the plurality of slits SHa and the two slits SHb is exposed. Then, conductors (contacts LI) are formed within the plurality of slits SHa and the two slits SHb. The members SHE that divide the conductive layers 25 into a plurality of portions are formed.

Finally, the plurality of contacts CCsgs, CC0 through CC7, and CCsgd are formed. Specifically, first, a mask that opens in portions corresponding to the contacts CCsgs, CC0 through CC7, and CCsgd are formed by photolithography or the like. Then, the sacrificial member SM2 is removed. Thereafter, anisotropic etching is performed with the mask, so that interconnect layers are exposed at the bottom portions of the respective holes from which the sacrificial member SM2 has been removed. The holes are then each filled with a conductor.

Through the manufacturing process described above, the stacked structure LSa and the stacked interconnect structure LSb are formed. The manufacturing process described above is a mere example, and the embodiment is not limited to this. For example, other processing steps may be inserted in the course of the manufacturing process, or some of the processing steps may be omitted or integrated together. Also, the order of the processing steps may be interchanged wherever possible. As one example, the step of forming the plurality of memory pillars MP and the step of forming the plurality of support pillars HR, the two members SLTc, and the two members SLTd may be interchangeable.

1. 3 Advantageous Effects of First Embodiment

According to the first embodiment, the two members SLTc and the two members SLTd surrounding the stacked interconnect structure LSb as viewed from the Z direction are formed before the stacked interconnect structure LSb is formed by the replacement process. Therefore, in the replacement process, the sacrificial layers 51 through 53 and the like are removed only from portions within a range inside the two members SLTc and the two members SLTd, while removal of the sacrificial layers 51 through 53 and the like in a portion outside the two members SLTc and the two members SLTd is suppressed.

If a space created by the removal of the sacrificial layers 51 through 53 and the like is located at longer distances from openings of the plurality of slits SHa and the two slits SHb, it is highly possible that the openings may be closed before the space is embedded with the conductor, and voids may be formed in the space. Fluorine gas contained in the voids is expanded by heat in a subsequent step, and may break the neighboring stacked structure. If voids are formed as described above, the yield of the memory device may be decreased by the break of the stacked structure, which is not desirable.

According to the first embodiment, a distance L2 from the member SLTc to the slit SHa is shorter than a distance L1 between neighboring slits SHa. A distance L3 from the member SLTd to the slit SHb is shorter than the distance L1 between the neighboring slits SHa. Thus, the distance of the space created by the removal of the sacrificial layers 51 through 53 and the like from the plurality of slits SHa and the two slits SHb can be limited to be not longer than the distance L1. The distance L1 is designed to be such a value that enables the created space to be embedded with the conductor hardly forming voids, while the sacrificial layers 51 through 53 and the like are reliably removed. Therefore, the distance of the space created by the removal of the sacrificial layers 51 through 53 and the like from the plurality of slits SHa and the two slits SHb can be restricted to such an extent that voids will be hardly formed. It is therefore possible to improve the yield of the memory device 3.

Furthermore, the two members SLTc and the two members SLTd are formed simultaneously with the formation of the support pillars HR. Accordingly, the two members SLTc and the two members SLTd can be formed without an additional step. Therefore, an increase in the manufacturing load of the memory device 3 can be suppressed.

2. Second Embodiment

Next, a memory device according to the second embodiment will be described. In the memory device of the second embodiment, the mask used to form the members SLTc and SLTd differs in shape from that used in the first embodiment. In the following explanation, a description of the configuration and the manufacturing method similar to those in the first embodiment will be omitted, and a configuration and a manufacturing method different from those in the first embodiment will mainly be described.

2. 1 Structures of Hookup Regions and Peripheral Region

FIG. 25 is a plan view showing an example of a detailed planar layout in a hookup region and a peripheral region of the memory device according to the second embodiment. FIG. 25 corresponds to FIG. 8 in the first embodiment.

As shown in FIG. 25, in the second embodiment, two members SLTc' and two members SLTd' are provided in place of the two members SLTc and the two members SLTd in the first embodiment.

The width of the members SLTc' and SLTd' is varied. More specifically, as viewed from the Z direction, the members SLTc' and SLTd' have a shape formed of a plurality of circles that overlap each other and are arranged in the X and Y directions, respectively.

A diameter D1 of the support pillars HR that are at the same level as conductive layers 22 through 24 is, for example, substantially equal to a diameter D1 of the circles that constitute each of the members SLTc' and SLTd' at the same level as the conductive layers 22 through 24. A distance d3 between the adjacent two of the circles constituting each of the members SLTc' and SLTd' is shorter than the diameter D1, and longer than a diameter D0 of a hole LH1 for forming a support pillar HR.

2. 2 Manufacturing Method of Memory Device

Figure 27:
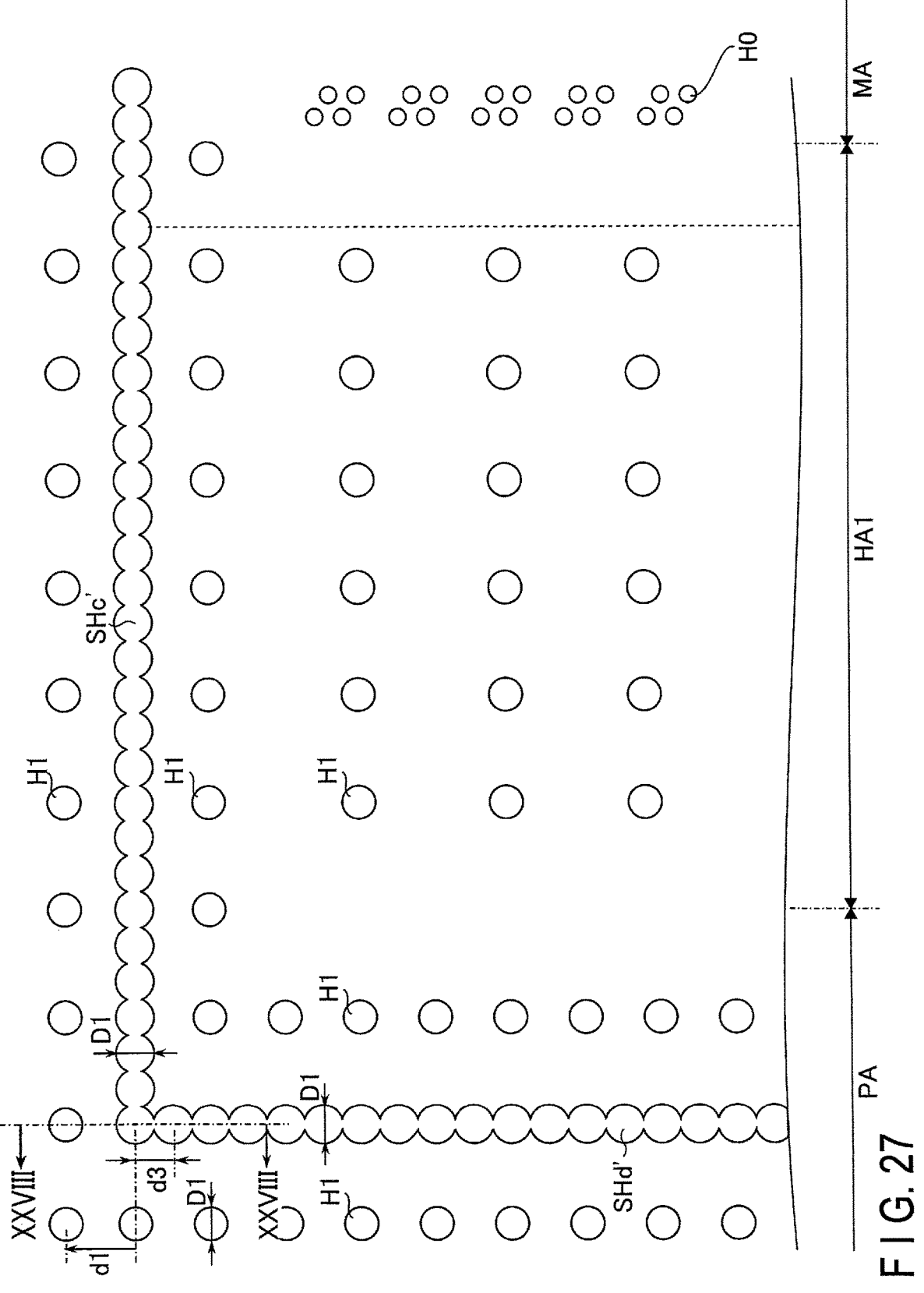
FIG. 27 is a plan view showing an example of the planar layout halfway through the manufacturing of the memory device according to the second embodiment.
Figure 30:
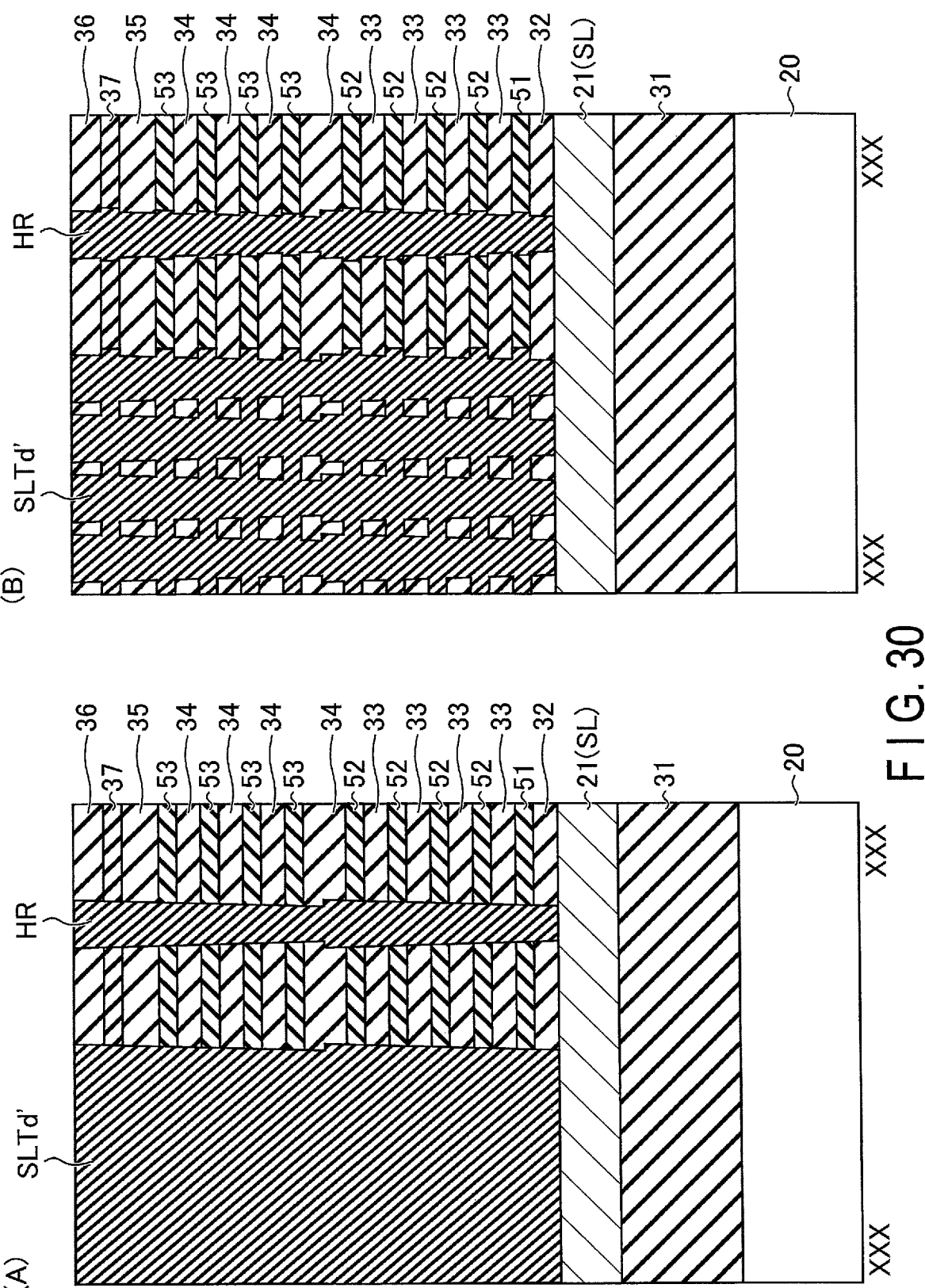
FIG. 30 is a sectional view showing an example of the sectional structure halfway through the manufacturing of the memory device according to the second embodiment, which is taken along a line XXX-XXX in FIG. 29.

Each of FIGS. 26 to 30 shows an example of the planar layout or the sectional structure halfway through the manufacturing of the memory device according to the second embodiment. The planar layout shown in the drawings represents the region corresponding to FIG. 25. FIGS. 26, 27, and 29 respectively correspond to FIGS. 12, 16, and 18 in the first embodiment. FIG. 28 is a sectional view taken along the line XXVIII-XXVIII indicated in FIG. 27. FIG. 30 is a sectional view taken along the line XXX-XXX indicated in FIG. 29. In FIGS. 28 and 30, a first example and a second example of the manufacturing method are respectively indicated as a left figure (A) and a right figure (B).

As shown in FIG. 26, a mask that opens in portions corresponding to the lower pillars LMP and LHR, and the lower members LSTc and LSTd is formed by photolithography or the like. Then, anisotropic etching is performed with the mask, so that a plurality of holes LH0, LH1, LHc', and LHd', each penetrating, for example, the insulating layers 32, 33, and 34 and sacrificial layers 51 and 52, are formed. Parts of the conductive layer 21 are exposed at the respective bottoms of the plurality of holes LH0, LH1, LHc', and LHd'. The plurality of holes LH0, LH1, LHc', and LHd' respectively correspond to the plurality of lower pillars LMP and LHR, the two lower members LSTc, and the two lower members LSTd.

The plurality of holes LHc' are shaped as a plurality of circles arranged apart from one another in the X direction. The plurality of holes LHd' are shaped as a plurality of circles arranged apart from one another in the Y direction. The diameter D0 of the holes LH1 that are at the same level as the sacrificial layers 51 and 52 is substantially equal to the diameter D0 of the holes LHc' and LHd' that are at the same level as the sacrificial layers 51 and 52. A distance between the two neighboring holes LH1 is substantially equal to a distance d1 between the two neighboring support pillars HR. The distances between the two neighboring holes LHc' and between the two neighboring holes LHd' are substantially equal to a distance d3 between the two neighboring circles constituting each of the members SLTc' and SLTd'. The distance d3 is longer than the diameter D0, therefore, the plurality of holes LHc' and LHd' do not overlap as viewed from the Z direction.

The plurality of holes LH0, LH1, LHc', and LHd' are embedded with the sacrificial member SM1. Then, the insulating layers 34 and the sacrificial layers 53 are alternately stacked on the upper surface of the stacked structure.

The insulating layer 35 and the sacrificial layer are stacked in this order on the upper surface of the sacrificial layer 53. The sacrificial layer is removed except for the memory region MA, and a portion of the hookup regions HA1 and HA2 where the contact CCsgd is to be formed. The insulating layer 37 is formed on the upper surface of the insulating layer 35 that is exposed in the portion where the sacrificial layer has been removed. Then, the insulating layer 36 is formed on the upper surface of the sacrificial layer and the insulating layer 37.

Next, as shown in FIGS. 27 and 28, a mask that opens in portions corresponding to the plurality of upper pillars UMP and UHR, and the two upper members USTc and the two upper members USTd is formed by photolithography or the like. Then, anisotropic etching of the stacked structure is performed with the mask, so that the sacrificial member SM1 embedded in each of the plurality of holes LH0, LH1, LHc', and LHd' is exposed. The sacrificial member SM1 is removed by, for example, wet etching or the like.

When the sacrificial member SM1 is removed, the diameter of the holes H1 corresponding to the holes LH1 that are at the same level as the sacrificial layers 51, 52, and 53 is increased from D0 to D1. Similarly, the diameter of the circles constituting the holes respectively corresponding to the holes LHc' and LHd' that are at the same level as the sacrificial layers 51, 52, and 53 is increased from D0 to D1. As described above, since the diameter D1 is longer than the distance d3, due to an increase in diameter from D0 to D1, the holes corresponding to the two neighboring holes LHc' and the holes corresponding to the two neighboring holes LHd' overlap as viewed from the Z direction. As a result, the plurality of holes H0 and H1, two slits SHc', and two slits SHd' respectively corresponding to the plurality of memory pillars MP, the plurality of support pillars HR, the two members SLTc', and the two members SLTd' are all formed. The two slits SHc' and the two slits SHd' are formed as to have a continuous slit shape.

FIG. 28 shows an example of a difference in shape of the slit SHd' that arises from a difference between a side etching rate of the sacrificial layers 51, 52, and 53 and a side etching rate of the insulating layers 32, 33, 34, 35, 36, and 37 within the process of removing the sacrificial member SM1. Specifically, in the example shown in the left figure (A) of FIG. 28, the side etching rate of the sacrificial layers 51, 52, and 53 and the side etching rate of the insulating layers 32, 33, 34, 35, 36, and 37 are substantially equal. In the example shown in the right figure (B) of FIG. 28, the side etching rate of the sacrificial layers 51, 52, and 53 is significantly higher than that of the insulating layers 32, 33, 34, 35, 36, and 37.

In a case where the side etching rate of the sacrificial layers 51, 52, and 53 and the side etching rate of the insulating layers 32, 33, 34, 35, 36, and 37 are substantially equal as shown in the left figure (A) of FIG. 28, the insulating layers 32, 33, 34, 35, 36, and 37 do not remain in the slit SHd'. On the other hand, in a case where the side etching rate of the sacrificial layers 51, 52, and 53 is significantly higher than that of the insulating layers 32, 33, 34, 35, 36, and 37 as shown in the right figure (B) of FIG. 28, the insulating layers 32, 33, 34, 35, 36, and 37 may remain in the slit SHd'.

Next, as shown in FIGS. 29 and 30, the plurality of memory pillars MP, the plurality of support pillars HR, the two members SLTc', and the two members SLTd' are formed. The process of forming the plurality of memory pillars MP, the plurality of support pillars HR, the two members SLTc', and the two members SLTd' is the same as that of forming the plurality of memory pillars MP, the plurality of support pillars HR, the two members SLTc, and the two members SLTd in the first embodiment, and the explanation thereof is omitted.

The left figure (A) of FIG. 30 and the right figure (B) of FIG. 30 respectively correspond to the left figure (A) of FIG. 28 and the right figure (B) of FIG. 28. In the case where the side etching rate of the sacrificial layers 51, 52, and 53 and the side etching rate of the insulating layers 32, 33, 34, 35, 36, and 37 are substantially equal as shown in the left figure of FIG. 30, the insulating layers 32, 33, 34, 35, 36, and 37 do not remain in the member SLTd'. On the other hand, in the case where the side etching rate of the sacrificial layers 51, 52, and 53 is significantly higher than that of the insulating layers 32, 33, 34, 35, 36, and 37 as shown in the right figure of FIG. 30, the insulating layers 32, 33, 34, 35, 36, and 37 may remain in the member SLTd'.

FIG. 28 and FIG. 30 respectively show the slit SHd' and the member SLTd'. The same applies to the slit SHc' and the member SLTc'.

2. 3 Advantageous Effect of Second Embodiment

According to the second embodiment, the two members SLTc' and the two members SLTd' are formed simultaneously with the formation of the support pillars HR. Thus, as in the first embodiment, the two members SLTc' and the two members SLTd' can be formed without an additional step. Therefore, an increase in the manufacturing load of the memory device 3 can be suppressed.

The plurality of holes LHc' and LHd' are arranged apart from one another in the X direction and the Y direction, respectively. When the sacrificial member SM1 embedded in the plurality of holes LHc' and LHd' is removed, the holes LHc' and LHd' form a continuous single hole since their side surfaces have been removed. As a result, the two slits SHc' and the two slits SHd' can be formed as to have a continuous slit shape. Furthermore, since the plurality of holes LHc' and LHd' are formed so as not to overlap, an increase in the manufacturing load of the memory device 3 can be further suppressed.

The distance between the holes LHc' and the distance between the holes LHd' can be further increased by setting the side etching rate of the sacrificial layers 51 through 53 and the like, at the time of removing the sacrificial member SM1, to be higher than that of the insulating layers 32 through 37. In this case, the insulating layers 32 through 37 may remain in the members SLTc' and SLTd'.

3. Third Embodiment

Next, a memory device according to the third embodiment will be described. The memory device of the third embodiment differs from the first embodiment and the second embodiment in that members SLTc and SLTd are not formed simultaneously with the formation of the support pillars HR. In the following explanation, a description of the configuration and the manufacturing method similar to those in the first and second embodiments will be omitted, and a configuration and a manufacturing method different from those in the first and second embodiments will mainly be described.

3. 1 Structures of Hookup Regions and Peripheral Region

FIG. 31 is a plan view showing an example of a detailed planar layout in a hookup region and a peripheral region of the memory device according to the third embodiment. FIG. 31 corresponds to FIG. 8 in the first embodiment. As shown in FIG. 31, in the third embodiment, two members SLTc'' and two members SLTd" are used in place of the two members SLTc and the two members SLTd in the first embodiment.

The width of the members SLTc" and SLTd" is substantially uniform as the members SLTa and SLTb. In other words, the width of the members SLTc" and SLTd" is not significantly varied, unlike the members SLTc and SLTd in the first embodiment.

FIG. 32 is a sectional view showing an example of a sectional structure in the hookup region and the peripheral region of the memory device according to the third embodiment, which is taken along a line XXXII-XXXII in FIG. 31.

As shown in FIG. 32, each of the members SLTc" and SLTd" has a structure in which an insulator is embedded. The members SLTc" and SLTd" are provided between the stacked interconnect structure LSb and the stacked structure LSa.

The lower end of each of the members SLTc" and SLTd" is in contact with the conductive layer 21. The upper ends of the members SLTc" and SLTd" are aligned with the upper ends of the members SLTa and SLTb, respectively. The YZ cross-sectional shape of the member SLTc" and the XZ cross-sectional shape of the member SLTd" are substantially equal to the YZ cross-sectional shape of the member SLTa and the XZ cross-sectional shape of the member SLTb, respectively.

3. 2 Manufacturing Method of Memory Device

Each of FIGS. 33 to 42 shows an example of the planar layout or the sectional structure halfway through the manufacturing of the memory device according to the third embodiment. The planar layout shown in the drawings represents the region corresponding to FIG. 31. Of the planar layout shown, FIGS. 33, 35, 37, and 39 respectively correspond to FIGS. 12, 14, 16, and 21 in the first embodiment. The sectional structures shown in the drawings represent the region corresponding to FIG. 32. Of the sectional structures shown, FIG. 34 is a sectional view taken along line XXXIV-XXXIV in FIG. 33. FIG. 36 is a sectional view taken along the line XXXVI-XXXVI indicated in FIG. 35. FIG. 38 is a sectional view taken along the line XXXVIII-XXXVIII indicated in FIG. 37. FIG. 40 is a sectional view taken along the line XL-XL indicated in FIG. 39. FIG. 42 is a sectional view taken along the line XLII-XLII indicated in FIG. 41.

As shown in FIGS. 33 and 34, a mask that opens in portions corresponding to the lower pillars LMP and LHR is formed by photolithography or the like. Then, anisotropic etching is performed with the mask, so that a plurality of holes LH0 and LH1, each penetrating, for example, the insulating layers 32, 33, and 34 and sacrificial layers 51 and 52, are formed. Parts of the conductive layer 21 are exposed at the respective bottoms of the plurality of holes LH0 and LH1. The plurality of holes LH0 and LH1 respectively correspond to a plurality of lower pillars LMP and LHR. Thus, the openings corresponding to the members SLTc" and SLTd" are not formed simultaneously with the formation of the holes LH0 and LH1.

Next, as shown in FIGS. 35 and 36, the plurality of holes LH0 and LH1 are embedded with a sacrificial member SM1. Then, the insulating layers 34 and the sacrificial layers 53 are alternately stacked on the upper surface of the stacked structure. The insulating layer 35 and the sacrificial layer are stacked in this order on the upper surface of the uppermost sacrificial layer 53. The sacrificial layer is removed except for the memory region MA, and a portion of the hookup regions HA1 and HA2 where the contact CCsgd is to be formed. The insulating layer 37 is formed on the upper surface of the insulating layer 35 that is exposed in the portion where the sacrificial layer has been removed. Then, the insulating layer 36 is formed on the upper surface of the sacrificial layer and the insulating layer 37.

Next, as shown in FIGS. 37 and 38, a mask that opens in portions corresponding to the plurality of upper pillars UMP and UHR is formed by photolithography or the like. Then, anisotropic etching of the stacked structure is performed with the mask, so that the sacrificial member SM1 embedded in each of the plurality of holes LH0 and LH1 is exposed. The sacrificial member SM1 is removed by, for example, wet etching or the like. As a result, the plurality of holes H0 and H1 respectively corresponding to the plurality of memory pillars MP and the plurality of support pillars HR are formed.

Thereafter, the plurality of memory pillars MP and the plurality of support pillars HR are formed. Subsequently, a structure corresponding to the contacts CCsgs, CC0 through CC7, and CCsgd is formed. This process advances in a manner similar to the first embodiment, and its description will thus be omitted.

Next, as shown in FIG. 39 and FIG. 40, a plurality of slits SHa, two slits SHb, two slits SHc", and two slits SHd" are formed. More specifically, first, a mask that opens in portions corresponding to the plurality of members SLTa, the two members SLTb, the two members SLTc", and the two members SLTd" are formed by photolithography or the like. Then, anisotropic etching is performed with the mask, so that the plurality of slits SHa, the two slits SHb, the two slits SHc", and the two slits SHd", each penetrating, for example, the insulating layers 32, 33, 34, 35, and 36 and the sacrificial layers 51, 52, and 53, and the insulating layer 37 or the sacrificial layer in the same level, are formed. The plurality of slits SHa and the two slits SHb are formed as to have a continuous slit shape. The two slits SHc" and the two slits SHd" are formed as to have a continuous slit shape.

Next, as shown in FIGS. 41 and 42, the two members SLTc" and the two members SLTd" are formed. Specifically, resist is formed to cover the plurality of slits SHa and the two slits SHb. Then, an insulator is embedded in the two slits SHc" and the two slits SHd".

The resist covering the plurality of slits SHa and the two slits SHb is removed. Thereafter, the sacrificial layers 51 through 53 and the like are replaced by the conductive layers 22 through 25 via the plurality of slits SHa and the two slits SHb. Then, the plurality of members SLTa and the two members SLTb are formed.

3. 3 Advantageous Effect of Third Embodiment

According to the third embodiment, the two slits SHc" and the two slits SHd" are formed simultaneously with the formation of the plurality of slits SHa and the two slits SHb. Thus, the two slits SHc" and the two slits SHd" can be formed in a linear shape as well as the plurality of slits SHa and the two slits SHb. Therefore, an increase in the difficulty in processing the two slits SHc" and the two slits SHd" can be suppressed.

In addition, the two members SLTc" and the two members SLTd" are formed before the replacement process. Therefore, in the replacement process, the sacrificial layers 51 through 53 and the like are removed only from portions within a range inside the two members SLTc" and the two members SLTd", while removal of the sacrificial layers 51 through 53 and the like in portions outside the two members SLTc" and the two members SLTd" is suppressed.

4. Fourth Embodiment

Next, a memory device according to the fourth embodiment will be described. The memory device of the fourth embodiment differs from that of the first, second, and third embodiments in that members SLTb are not formed. In the following explanation, a description of the configuration and the manufacturing method similar to those in the first, second, and third embodiments will be omitted, and a configuration and a manufacturing method different from those in the first, second, and third embodiments will mainly be described.

4. 1 Structure of Region Including Memory Cell Array

FIG. 43 is a plan view showing an example of a planar layout of a region including a memory cell array provided in the memory device according to the fourth embodiment. FIG. 43 corresponds to FIG. 3 in the first embodiment. As shown in FIG. 43, a plurality of members SLTa and a plurality of members SHE are provided in a core region CA, but members SLTb are not provided. Two members SLTc* are provided in a peripheral region PA, and two members SLTd* are provided in a boundary region between the core region CA and the peripheral region PA in place of the two members SLTb.

The two members SLTc* are plate-shaped insulators spreading along, for example, the XZ plane in the peripheral region PA. The two members SLTc* are arranged in the Y direction so as to sandwich the plurality of members SLTa. The length of the two members SLTc* in the X direction is substantially equal to that of the members SLTa in the X direction. A distance L2 between neighboring members SLTc* and SLTa is shorter than a distance L1 between neighboring members SLTa.

The two members SLTd* are plate-shaped insulators spreading along, for example, the YZ plane in the boundary region between the core region CA and the peripheral region PA. The two members SLTd* are arranged in the X direction. One of the two members SLTd* is in contact with a first end of each of the plurality of members SLTa and the two members SLTc*. The other of the two members SLTd* is in contact with a second end of each of the plurality of members SLTa and the two members SLTc*. The two members SLTd* and the two members SLTc* can be regarded as a single continuous insulator surrounding the plurality of members SLTa.

Each of the two members SLTc* is provided between the stacked interconnect structure LSb and the stacked structure LSa. Each of the two members SLTd* is provided between the stacked interconnect structure LSb and the stacked structure LSa. Thus, the two members SLTc* and the two members SLTd* surround the stacked interconnect structure LSb and separate the stacked structure LSa from the stacked interconnect structure LSb.

The two members SLTd*, the two members SLTc*, and the plurality of members SLTa separate the stacked interconnect structure LSb into (n+1) portions corresponding to the (n+1) blocks BLK0 through BLKn and two portions sandwiching the (n+1) portions in the Y direction.

The two members SLTa located at both ends of the plurality of members SLTa and the two members SLTd* are located at the boundary region between the core region CA and the peripheral region PA. Thus, the two members SLTa located at both ends of the plurality of members SLTa and the two members SLTd* surround the core region CA and separate the core region CA from the peripheral region PA.

4. 2 Structures of Hookup Region and Peripheral Region

Figure 44:
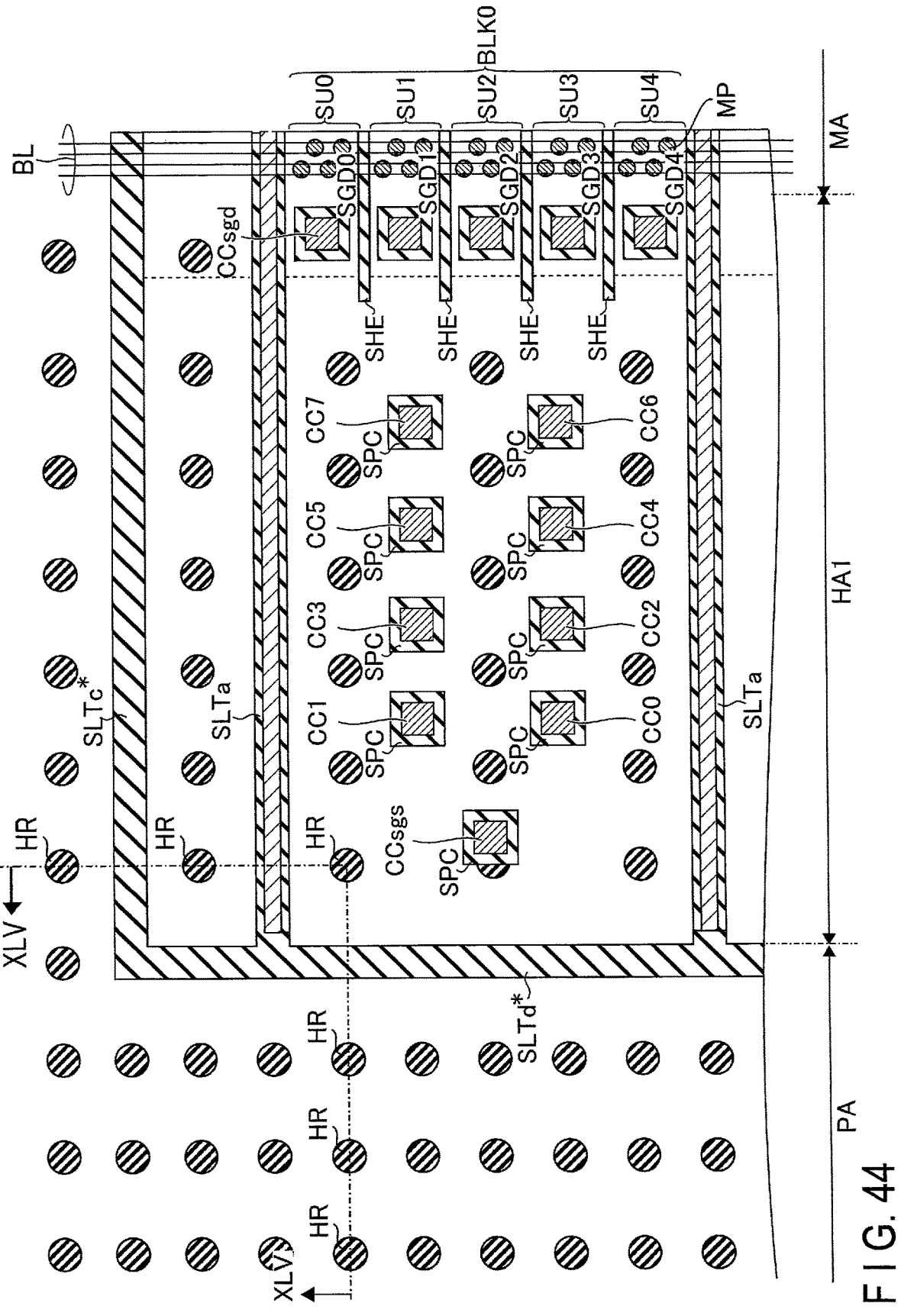
FIG. 44 is a plan view showing an example of a detailed planar layout in a hookup region and a peripheral region of the memory device according to the fourth embodiment.

FIG. 44 is a plan view showing an example of a detailed planar layout in a hookup region and a peripheral region of the memory device according to the fourth embodiment. FIG. 45 is a sectional view showing an example of a sectional structure in the hookup region and the peripheral region of the memory device according to the fourth embodiment, which is taken along a line XLV-XLV in FIG. 44. FIGS. 44 and 45 correspond to FIGS. 8 and 10 in the first embodiment.

The width of the members SLTc* and SLTd* is substantially uniform as the members SLTa. In other words, the width of the members SLTc* and SLTd* is not significantly varied, unlike the members SLTc and SLTd in the first embodiment.

Each of the members SLTa is embedded with a spacer SP and a contact LI, whereas each of the members SLTc* and SLTd* has a structure in which an insulator is embedded. Therefore, the stacked interconnect structure LSb is surrounded by the insulator that constitutes the members SLTc* and SLTd*.

The lower end of each of the members SLTc* and SLTd* is in contact with the conductive layer 21. The upper ends of the members SLTc* and SLTd* are aligned with the upper ends of the members SLTa, respectively. The YZ cross-sectional shape of the member SLTc* and the XZ cross-sectional shape of the member SLTd* are substantially equal to the YZ cross-sectional shape of the member SLTa.

4. 3 Manufacturing Method of Memory Device

Each of FIGS. 46 to 49 shows an example of the planar layout or the sectional structure halfway through the manufacturing of the memory device according to the fourth embodiment. The planar layout shown in the drawings represents the region corresponding to FIG. 44. Of the planar layout shown, FIGS. 46 and 48 respectively correspond to FIGS. 39 and 41 in the third embodiment. The sectional structures shown in the drawings represent the region corresponding to FIG. 45. Of the sectional structures shown, FIG. 47 is a sectional view taken along line XLVII-XLVII in FIG. 46. FIG. 49 is a sectional view taken along the line XLIX-XLIX indicated in FIG. 48.

As shown in FIGS. 46 and 47, a plurality of slits SHa, two slits SHc*, and two slits SHd* are formed. More specifically, first, a mask that opens in portions corresponding to the plurality of members SLTa, the two members SLTc*, and the two members SLTd* is formed by photolithography or the like. Then, anisotropic etching is performed with the mask, so that the plurality of slits SHa, the two slits SHc*, and the two slits SHd*, each penetrating, for example, the insulating layers 32, 33, 34, 35, and 36 and the sacrificial layers 51, 52, and 53, and the insulating layer 37 or the sacrificial layer in the same level, are formed. The plurality of slits SHa, the two slits SHc*, and the two slits SHd* are formed as to have a continuous slit shape.

Next, as shown in FIGS. 48 and 49, the two members SLTc* and the two members SLTd* are formed. Specifically, resist is formed to cover the plurality of slits SHa. Then, an insulator is embedded in the two slits SHc* and the two slits SHd*.

The resist covering the plurality of slits SHa is removed. Thereafter, the sacrificial layers 51 through 53 and the like are replaced by the conductive layers 22 through 25 via the plurality of slits SHa. Then, the plurality of members SLTa are formed.

4. 4 Advantageous Effect of Fourth Embodiment

According to the fourth embodiment, both ends of each of the plurality of members SLTa are respectively in contact with the two members SLTd*. Therefore, although the two members SLTb are omitted, in the replacement process, the sacrificial layers 51 through 53 and the like are removed only from portions within a range inside the two members SLTc* and the two members SLTd*, while removal of the sacrificial layers 51 through 53 and the like in portions outside the two members SLTc* and the two members SLTd* is suppressed.

Specifically, the two slits SHc* and the two slits SHd* are formed simultaneously with the formation of the plurality of slits SHa. Thus, the two slits SHc* and the two slits SHd* can be formed in a linear shape as well as the plurality of slits SHa. Therefore, an increase in the difficulty of processing the two slits SHc* and the two slits SHd* can be suppressed, in the same manner as in the third embodiment.

5. Modifications, Etc

The first, second, third, and fourth embodiments described above can be variously modified.

5. 1 First Modification

In the first, second, third, and fourth embodiments, the case in which the hookup regions HA1 and HA2 are arranged to sandwich the memory region MA is described, but the embodiments are not limited to this arrangement. For example, a hookup region may be arranged to be sandwiched between memory regions.

FIG. 50 is a plan view showing an example of a planar layout of a region including a memory cell array provided in a memory device according to a first modification. FIG. 50 corresponds to FIG. 3 in the first embodiment.

A core region CA is divided into a hookup region HA, and memory regions MA1 and MA2 sandwiching the hookup region HA in the X direction. Each of the memory regions MA1 and MA2 includes a plurality of NAND strings NS. The hookup region HA is a region used for connecting between a stacked interconnect and a row decoder module 15. Each of the contacts CC arranged in the hookup region HA has a structure in which a hole provided in the stacked interconnect structure LSb is embedded with a conductor via a spacer SPC, in the same manner as in the first embodiment shown in, for example, FIG. 9. The stacked interconnect structure LSb in the hookup region HA may have a step structure in which a step is provided between the select gate line SGS and the word line WL0, between the word lines WL0 and WL1, between the word lines WL1 and WL2, between the word lines WL2 and WL3, between the word lines WL3 and WL4, between the word lines WL4 and WL5, between the word lines WL5 and WL6, between the word lines WL6 and WL7, and between the word line WL7 and the select gate line SGD. In this case, the contact CC can be arranged on each of terraces of the plurality of interconnect layers having a step structure so as to be spaced apart and insulated from the upper interconnect layers.

One of two members SLTb is in contact with a first end of each of a plurality of members SLTa and a plurality of members SHE. The other of the two members SLTb is in contact with a second end of each of the plurality of members SLTa and the plurality of members SHE.

In the configuration described above, the two members SLTc and the two members SLTd are also formed before the stacked interconnect structure LSb is formed by the replacement process, in the same manner as in the first embodiment. Therefore, in the replacement process, the sacrificial layers 51 through 53 and the like are removed only from portions within a range inside the two members SLTc and the two members SLTd, while removal of the sacrificial layers 51 through 53 and the like in a portion outside the two members SLTc and the two members SLTd is suppressed. Therefore, the same effects as in the first embodiment can be attained.

5. 2 Second Modification

In the first, second, third, and fourth embodiments, the case in which the stacked structure LSa has portions sandwiching the core region CA in the X direction is described, but the embodiments are not limited to this case. For example, the stacked structure LSa need not have portions sandwiching the core region CA in the X direction.

FIG. 51 is a plan view showing an example of a planar layout of a region including a memory cell array provided in a memory device according to a second modification. FIG. 51 corresponds to FIG. 3 in the first embodiment.

A stacked interconnect structure LSb is provided in a portion of a core region CA and a peripheral region PA. In the peripheral region PA, stacked structures LSa are provided to sandwich the stacked interconnect structure LSb in the Y direction. The stacked structures LSa extend in the X direction. The length of the stacked structure LSa is substantially equal to that of the stacked interconnect structure LSb in the X direction. The sides of the stacked structure LSa and the stacked interconnect structure LSb arranged in the X direction are aligned with each other.

On the other hand, in the peripheral regions PA located on both sides of the core region CA in the X direction, neither a stacked structure LSa nor a stacked interconnect structure LSb is provided. An insulator containing, for example, a silicon oxide, is formed in the overall portions of the peripheral regions PA. In the core region CA, the hookup regions HA1 and HA2 arranged so as to sandwich the memory region MA may be provided with contacts CC each having a structure in which a hole provided in the stacked interconnect structure LSb is embedded with a conductor via a spacer SPC. Alternatively, end portions of a plurality of interconnect layers in the stacked interconnect structure LSb may be formed as a step shape, and a contact CC may be provided on a terrace of each step. If the stacked interconnect structure LSb in the hookup regions HA1 and HA2 has a step structure, the insulator in the peripheral regions PA adjacent to the hookup regions HA1 and HA2 can be formed to cover the step structure of the stacked interconnect structure LSb over the hookup regions HA1 and HA2 and the peripheral region PA.

A plurality of members SLTa and a plurality of members SHE are provided in the core region CA. In the peripheral regions PA provided with the stacked structure LSa and the stacked interconnect structure LSb, two members SLTc are provided so as to sandwich the plurality of members SLTa and the plurality of members SHE. Each of the plurality of members SLTa and the two members SLTc extends in the X direction so as to traverse the core region CA. Each of the plurality of members SLTa penetrates the stacked interconnect structure LSb in the Z direction, thereby separating the stacked interconnect structure LSb. Each of the two members SLTc is provided between the stacked interconnect structure LSb and the stacked structure LSa. Thus, the two members SLTc sandwich the stacked interconnect structure LSb in the Y direction, and separate the stacked structure LSa from the stacked interconnect structure LSb.

In the configuration described above, the two members SLTc are also formed prior to the formation of the stacked interconnect structure LSb by the replacement process. Therefore, in the replacement process, the sacrificial layers 51 through 53 and the like are removed only from portions within a range inside the two members SLTc, while removal of the sacrificial layers 51 through 53 and the like in a portion outside the two members SLTc is suppressed. Therefore, the same effects as in the first embodiment can be attained.

5. 3 Others

In the first, second, third, and fourth embodiments, the case in which the members SLTa and SLTb have a structure including contacts LI is described, but the embodiments are not limited to this structure. For example, the members SLTa and SLTb may have a structure which does not include contacts LI and may be embedded with an insulator.

Furthermore, in the first, third, and fourth embodiments, the case in which the stacked structure LSa is formed in a plurality of processes is described, but the embodiments are not limited to this case. For example, the stacked structure LSa may be formed in one process. If the aforementioned manufacturing process is applied to the first embodiment, the cross-sectional shapes of the memory pillars MP, the support pillars HR, and the members SLTc and SLTd are equal to those of the members SLTa and SLTb. If the manufacturing process is applied to the third embodiment, the cross-sectional shapes of the memory pillars MP and the support pillars HR are equal to those of the members SLTa and SLTb. If the manufacturing process is applied to the fourth embodiment, the cross-sectional shapes of the memory pillars MP and the support pillars HR are equal to those of the members SLTa.

Also, in the above-described embodiments, a structure in which the memory device 3 is formed on one chip has been described as an example. However, the embodiment is not limited to this. For example, the memory device 3 may have a structure in which a chip on which the sense amplifier module 16 and the like are provided and a chip on which the memory cell array 10 is provided may be bonded.

While certain embodiments have been described, these embodiments have been presented by way of example only, and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The embodiments and modifications are included in the scope and spirit of the invention and are included in the scope of the claimed inventions and their equivalents.

What is claimed is:

1. A memory device comprising:
a first layer stack including a plurality of first insulating layers arranged in a first direction and spaced apart from one another;
a second layer stack and a third layer stack, each including a plurality of conductive layers spaced apart from one another and provided at levels of layers identical to the first insulating layers, respectively, the second layer stack and the third layer stack being spaced apart from each other;
a memory pillar extending in the first direction in the third layer stack, a portion of the memory pillar that intersects each of the conductive layers functioning as a memory cell;
a first member that is in contact with the first layer stack and the second layer stack between the first layer stack and the second layer stack, and that extends in a second direction intersecting the first direction;
a second member that is in contact with the second layer stack and the third layer stack between the second layer stack and the third layer stack, that extends in the second direction, and that is arranged with the first member in a third direction intersecting the first direction and the second direction;

a third member that is in contact with the first layer stack, the second layer stack and the first member between the first layer stack and the second layer stack, the third member extending in the third direction; and
a fourth member that is in contact with the second layer stack, the third layer stack and the second member between the second layer stack and the third layer stack, the fourth member extending in the third direction and being arranged with the third member in the second direction, wherein
the second member is provided between the first member and the memory pillar as viewed from the first direction, and
the fourth member is provided between the third member and the memory pillar as viewed from the first direction.

2. The memory device according to claim 1, wherein
a portion of the second layer stack that is between the first member and the second member is shorter in length than the third layer stack in the third direction.

3. The memory device according to claim 1, wherein
the first layer stack surrounds the second layer stack and the third layer stack as viewed from the first direction.

4. The memory device according to claim 1, wherein
the second layer stack surrounds the third layer stack as viewed from the first direction.

5. The memory device according to claim 4, wherein
a portion of the second layer stack that is between the third member and the fourth member is shorter in length than the third layer stack in the third direction.

6. The memory device according to claim 3, wherein
the third member is further in contact with the second member between the first layer stack and the second layer stack.

7. The memory device according to claim 6, wherein
the second layer stack and the third layer stack are arranged in the third direction.

8. The memory device according to claim 1, wherein
the first layer stack, the second layer stack, and the third layer stack are arranged in the third direction in this order.

9. The memory device according to claim 1, wherein
the first member has a width that is substantially uniform as viewed from the first direction.

10. The memory device according to claim 1, wherein
the first member has a shape formed of a plurality of circles that overlap one another as viewed from the first direction.

11. The memory device according to claim 10, wherein
the first layer stack further includes a plurality of second insulating layers, each provided between the plurality of first insulating layers and containing a material different from that of the plurality of first insulating layers;
the second layer stack further includes a plurality of third insulating layers, each provided between the plurality of conductive layers; and
the plurality of second insulating layers are separated from the plurality of third insulating layers by the first member.

12. The memory device according to claim 10, wherein
the first layer stack further includes a plurality of second insulating layers, each provided between the plurality of first insulating layers and containing a material different from that of the plurality of first insulating layers;

the second layer stack further includes a plurality of third insulating layers, each provided between the plurality of conductive layers; and the plurality of second insulating layers are connected to the plurality of third insulating layers via portions of the first member.

13. The memory device according to claim 1, wherein each of the plurality of first insulating layers contains silicon nitride.

14. A memory device comprising:

a layer stack including a plurality of conductive layers and a source line arranged in a first direction, the plurality of conductive layers being spaced apart from one another;

a memory pillar extending in the first direction in the layer stack, a portion of the memory pillar that intersects each of the conductive layers functioning as a memory cell; and a plurality of members that extend in the first direction and a second direction intersecting the first direction to contact the source line, and that separate the layer stack into a plurality of portions in a third direction intersecting the first direction and the second direction, wherein:

the members include a pair of first members arranged on both sides of the plurality of conductive layers in the third direction to sandwich the plurality of conductive layers, and a plurality of second members sandwiched between the pair of first members and arranged in the third direction inside the plurality of conductive layers as viewed from the first direction; and a distance between one of the pair of first members and one among the plurality of second members that neighbors the one of the pair of the first members and a distance between the other of the pair of first members and another one among the plurality of second members that neighbors the other of the pair of the first members is shorter than a distance between two of the plurality of second members that neighbor each other.

15. The memory device according to claim 14, wherein the memory pillar is provided between two of the plurality of second members that neighbor each other in the layer stack.

16. The memory device according to claim 1, further comprising a source line arranged with the third layer stack in the first direction, wherein:

the memory pillar includes a semiconductor film extending in the first direction; and an end portion of the semiconductor film is in contact with the source line.

17. The memory device according to claim 1, further comprising:

a first conductive layer arranged with the plurality of conductive layers included in the third layer stack in the first direction, the first conductive layer intersecting the memory pillar; and a fifth member provided spaced apart from the plurality of conductive layers included in the third layer stack and separating the first conductive layer into two portions.

18. The memory device according to claim 1, wherein each of the first member, the second member, the third member, and the fourth member includes an insulator.

19. The memory device according to claim 14, wherein:

the memory pillar includes a semiconductor film extending in the first direction; and an end portion of the semiconductor film is in contact with the source line.

20. The memory device according to claim 14, further comprising:

a first conductive layer arranged with the plurality of conductive layers included in the layer stack in the first direction, the first conductive layer intersecting the memory pillar; and a third member provided spaced apart from the plurality of conductive layers included in the layer stack and separating the first conductive layer into two portions.

21. The memory device according to claim 14, wherein each of the members includes an insulator.

* * * * *